United States Patent
Park et al.

(10) Patent No.: US 12,279,527 B2
(45) Date of Patent: Apr. 15, 2025

(54) ORGANIC ELECTROLUMINESCENCE DEVICE AND FUSED POLYCYCLIC COMPOUND FOR ORGANIC ELECTROLUMINESCENCE DEVICE

(71) Applicant: Samsung Display Co., Ltd., Yongin-si (KR)

(72) Inventors: Junha Park, Gwacheon-si (KR); Jang Yeol Baek, Yongin-si (KR); Mun-Ki Sim, Seoul (KR); Hyoyoung Lee, Suwon-si (KR); Soo-Byung Ko, Yongin-si (KR); Young Kook Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 983 days.

(21) Appl. No.: 17/271,361

(22) PCT Filed: Dec. 10, 2018

(86) PCT No.: PCT/KR2018/015635
§ 371 (c)(1),
(2) Date: Feb. 25, 2021

(87) PCT Pub. No.: WO2020/050458
PCT Pub. Date: Mar. 12, 2020

(65) Prior Publication Data
US 2022/0123227 A1    Apr. 21, 2022

(30) Foreign Application Priority Data
Sep. 7, 2018  (KR) .................... 10-2018-0106853

(51) Int. Cl.
*H10K 85/60*   (2023.01)
*H10K 50/11*   (2023.01)
(Continued)

(52) U.S. Cl.
CPC ......... *H10K 85/6572* (2023.02); *H10K 85/40* (2023.02); *H10K 85/622* (2023.02);
(Continued)

(58) Field of Classification Search
None
See application file for complete search history.

(56) References Cited

U.S. PATENT DOCUMENTS

| | | |
|---|---|---|
| 5,645,948 A | 7/1997 | Shi et al. |
| 9,978,956 B2 | 5/2018 | Tsang et al. |

(Continued)

FOREIGN PATENT DOCUMENTS

| | | |
|---|---|---|
| JP | 4060669 B2 | 3/2008 |
| JP | 2013-116975 A | 6/2013 |

(Continued)

OTHER PUBLICATIONS

International Search Report for corresponding Application No. PCT/KR2018/015635 dated Jun. 3, 2019, 4pp.

(Continued)

*Primary Examiner* — Jeffrey D Washville
(74) *Attorney, Agent, or Firm* — Womble Bond Dickinson (US) LLP

(57) ABSTRACT

An organic electroluminescence device of an embodiment includes a first electrode, a second electrode and a plurality of organic layers disposed between the first electrode and the second electrode, wherein at least one organic layer among the organic layers includes a fused polycyclic compound in which a dibenzoheterocyclic derivative and a monoheterocyclic derivative containing at least one nitrogen atom as a ring-forming atom are connected via a linker to form a ring, thereby showing improved emission efficiency and improved device reliability.

16 Claims, 2 Drawing Sheets

(51) Int. Cl.
*H10K 85/40* (2023.01)
*H10K 101/10* (2023.01)

(52) U.S. Cl.
CPC ....... *H10K 85/654* (2023.02); *H10K 85/6574* (2023.02); *H10K 85/6576* (2023.02); *H10K 50/11* (2023.02); *H10K 2101/10* (2023.02)

(56) References Cited

U.S. PATENT DOCUMENTS

| | | |
|---|---|---|
| 10,505,132 B2 | 12/2019 | Seo et al. |
| 10,930,858 B2 | 2/2021 | Miyazaki |
| 2004/0137270 A1 | 7/2004 | Seo et al. |
| 2015/0340621 A1 | 11/2015 | Parham et al. |
| 2017/0018721 A1* | 1/2017 | Tsang .................. C07D 225/04 |
| 2017/0092889 A1 | 3/2017 | Seo et al. |
| 2018/0337348 A1 | 11/2018 | Jung et al. |
| 2020/0216391 A1 | 7/2020 | Parham et al. |

FOREIGN PATENT DOCUMENTS

| | | |
|---|---|---|
| JP | 2014-045179 A | 3/2014 |
| JP | 2016-507890 A | 3/2016 |
| JP | 2019-81749 A | 5/2019 |
| JP | 2020-526026 A | 8/2020 |
| KR | 10-0525408 B1 | 11/2005 |
| KR | 10-1525408 B1 | 6/2015 |
| KR | 10-2017-0038681 A | 4/2017 |
| KR | 10-2017-0040012 A | 4/2017 |
| KR | 10-2017-0058874 A | 5/2017 |
| KR | 10-2018-0010130 A | 1/2018 |
| KR | 10-2018-0040100 A | 4/2018 |
| WO | WO 2014/157268 A1 | 10/2014 |

OTHER PUBLICATIONS

C.W. Tang, et al., "Organic electroluminescent diodes," Appl. Phys. Lett., 51, (12), Sep. 21, 1987, pp. 913-915.

Chihaya Adachi, et al., "Confinement of charge carriers and molecular excitons within 5nm thick emitter layer in organic electroluminescent devices with a double heterostructure," Appl. Phys. Lett., 57, (6), Aug. 6, 1990, pp. 531-533.

Shigehiro Yamaguchi, et al., "Diphenylamino-Substituted 2,5-Diarylsiloles for Single-Layer Organic Electroluminescent Devices", Chemistry Letters 2001, pp. 98-99.

Youichi Sakamoto, et al., "Synthesis, Characterization, and Electron-Transport Property of Perfluorinated Phenylene Dendrimers," J. Am. Chem. Soc. 2000, vol. 122, No. 8. pp. 1832-1833.

* cited by examiner

ORGANIC ELECTROLUMINESCENCE DEVICE AND FUSED POLYCYCLIC COMPOUND FOR ORGANIC ELECTROLUMINESCENCE DEVICE

CROSS-REFERENCE TO RELATED APPLICATION

This application is a National Phase Patent Application and claims priority to and the benefit International Application No. PCT/KR2018/015635, filed Dec. 10, 2018, which claims priority to Korean Patent Application No. 10-2018-0106853, filed on Sep. 7, 2018, the entire content of each of which is hereby incorporated by reference.

DESCRIPTION

Technical Field

The present invention disclosed herein relates to an organic electroluminescence device and a fused polycyclic compound used therein.

Background Art

Recently, the development of an organic electroluminescence display as an image display is being actively conducted. Different from a liquid crystal display, the organic electroluminescence display is so-called a self-luminescent display in which holes and electrons injected from a first electrode and a second electrode recombine in an emission layer so that a light-emitting material including an organic compound in the emission layer emits light to attain display.

In the application of an organic electroluminescence device to a display, the decrease of the driving voltage, and the increase of the emission efficiency and the life of the organic electroluminescence device are required, and development of materials for an organic electroluminescence device to stably attain the requirements is being continuously required.

Particularly, recently, in order to accomplish an organic electroluminescence device with high efficiency, technique on phosphorescence emission, which uses energy in a triplet state, or delayed fluorescence emission, which uses the generating phenomenon of singlet excitons by the collision of triplet excitons (triplet-triplet annihilation, TTA), is being developed, and development of a material for thermally activated delayed fluorescence (TADF) using delayed fluorescence phenomenon is being conducted.

DISCLOSURE OF THE INVENTION

Technical Problem

An object of the present invention is to provide an organic electroluminescence device having improved emission efficiency and device life.

Another object of the present invention is to provide a fused polycyclic compound capable of improving the emission efficiency and device life of an organic electroluminescence device.

Technical Solution

An embodiment provides an organic electroluminescence device including a first electrode; a second electrode disposed on the first electrode; and a plurality of organic layers disposed between the first electrode and the second electrode, wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, Zn, a compound of two or more selected from them, a mixture of two or more selected from them, and an oxide thereof, and wherein at least one organic layer among the plurality of organic layers includes a fused polycyclic compound in which a dibenzoheterocyclic derivative and a monoheterocyclic derivative containing at least one nitrogen atom as a ring-forming atom are connected via a linker to form a ring.

The dibenzoheterocyclic derivative may be an electron donor, and the monoheterocyclic derivative may be an electron acceptor.

The fused polycyclic compound may be one in which one dibenzoheterocyclic derivative and one monoheterocyclic derivative are fixed by two linkers.

The fused polycyclic compound may include one dibenzoheterocyclic derivative and two monoheterocyclic derivatives.

The organic layers may include a hole transport region; an emission layer disposed on the hole transport region; and an electron transport region disposed on the emission layer.

The emission layer may emit delayed fluorescence.

The emission layer may be a delayed fluorescence emission layer including a host and a dopant, and the dopant may include the fused polycyclic compound.

The dibenzoheterocyclic derivative may be substituted or unsubstituted carbazole, substituted or unsubstituted dibenzofuran, or substituted or unsubstituted dibenzothiophene.

The monoheterocyclic derivative may be substituted or unsubstituted triazine, substituted or unsubstituted pyridine, or substituted or unsubstituted pyrimidine.

The linker may be a substituted or unsubstituted phenylene group, a substituted or unsubstituted divalent biphenyl group, or a substituted or unsubstituted naphthylene group.

The fused polycyclic compound may be represented by Formula 1 below.

Formula 1

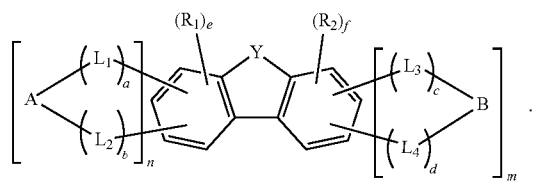

In Formula 1 above, Y is $NR_3$, O, or S, $R_1$ to $R_3$ are each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, n and m are each independently 0 or 1, where at least one among n and m is 1, $L_1$ to $L_4$ are each independently a substituted or unsubstituted arylene group of 6 to 30 ring-forming carbon atoms. In Formula 1, a to d are each independently an integer of 1 to 3, e and f are each independently an integer of 0 to 4, and A and B are each independently represented by Formula 2 below.

Formula 2

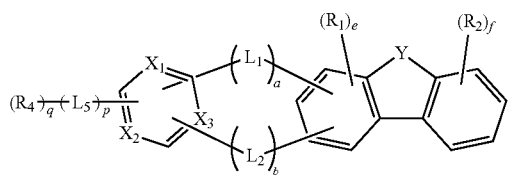

In Formula 2 above, $X_1$ to $X_3$ are each independently N or $CR_5$, where at least one among $X_1$ to $X_3$ is N, p is 0 or 1, q is an integer of 0 to 5, and a case where p and q are 0 at the same time is excluded. In Formula 2, $L_5$ is a substituted or unsubstituted arylene group of 6 to 30 carbon atoms, or a substituted or unsubstituted heteroarylene group of 2 to 30 carbon atoms, and $R_4$ and $R_5$ are each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms.

Formula 1 may be represented by Formula 1-1 or Formula 1-2 below.

Formula 1-1

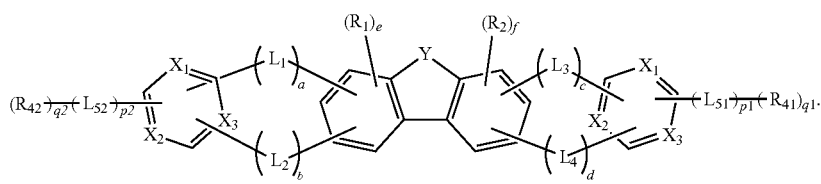

Formula 1-2

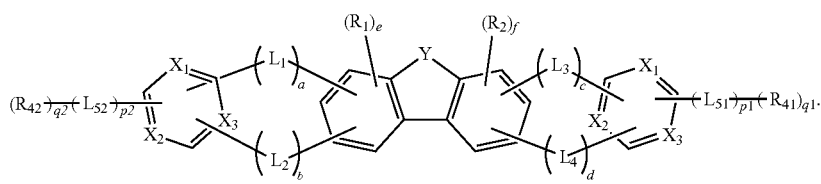

In Formula 1-2 above, p1 and p2 are each independently 0 or 1, q1 and q2 are each independently an integer of 0 to 5, a case where p1 and q1 are 0 at the same time and a case where p2 and q2 are 0 at the same time are excluded, $L_{51}$ and $L_{52}$ are each independently a substituted or unsubstituted arylene group of 6 to 30 carbon atoms, or a substituted or unsubstituted heteroarylene group of 2 to 30 carbon atoms, and $R_{41}$ and $R_{42}$ are each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms. In Formula 1-1 and Formula 1-2 above, Y, $R_1$, $R_2$, $R_4$, $L_1$ to $L_5$, $X_1$ to $X_3$, and a to f are the same as defined in Formula 1 and Formula 2.

Formula 2 may be represented by any one among Formula 2-1 to Formula 2-3 below.

Formula 2-1

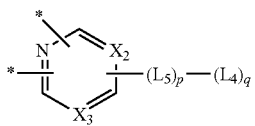

Formula 2-2

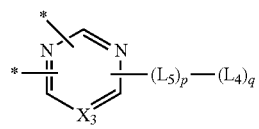

Formula 2-3

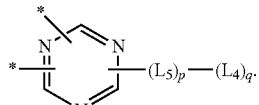

In Formula 2-1 to Formula 2-3 above, $X_2$, $X_3$, $L_5$, $R_4$, p and q are the same as defined in Formula 2.

Formula 1 may be represented by any one among Formula 1-3 to Formula 1-5 below.

Formula 1-3

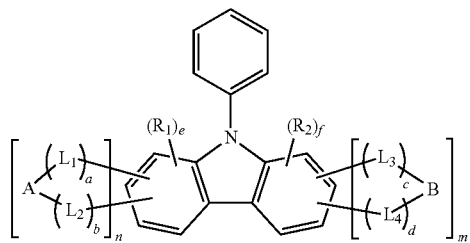

Formula 1-4

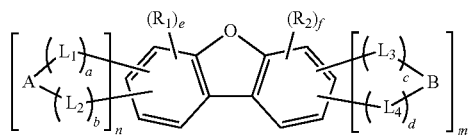

Formula 1-5
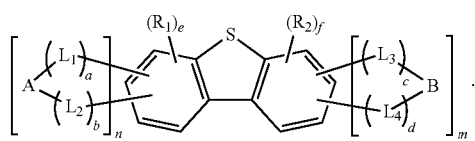
In Formula 1-3 to Formula 1-5, A, B, $L_1$ to $L_4$, a to f, n, m, $R_1$ and $R_2$ are the same as defined in Formula 1.
$L_1$ to $L_4$ may be each independently represented by any one among AL-1 to AL-3 below.
AL-1
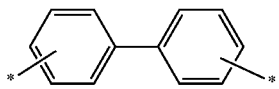
AL-2
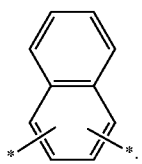
AL-3
The fused polycyclic compound may be at least one among compounds represented in Compound Group 1 below.
Compound Group 1
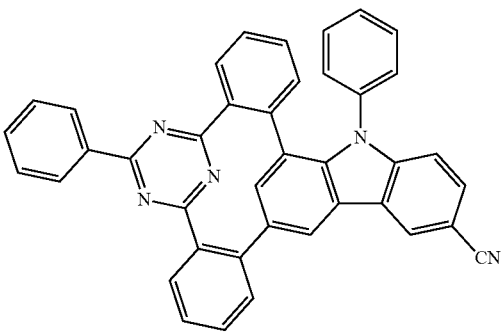
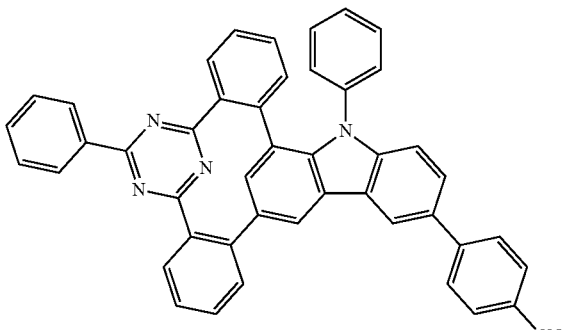
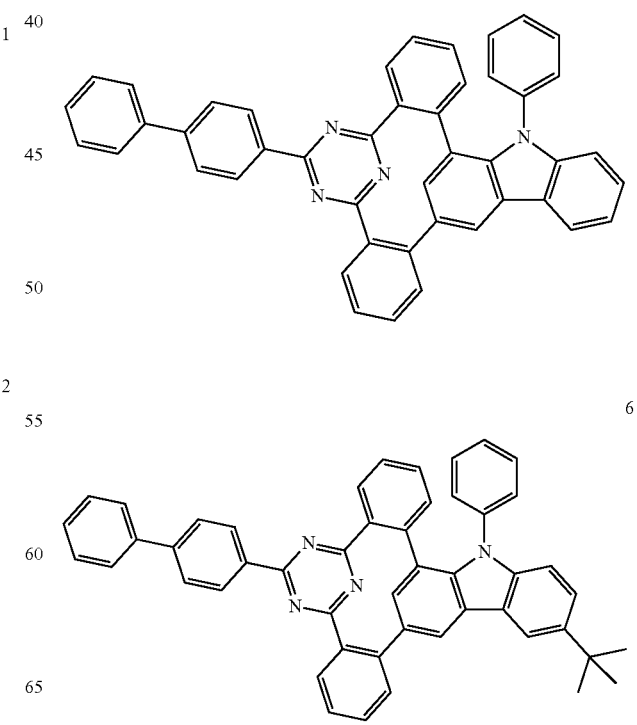

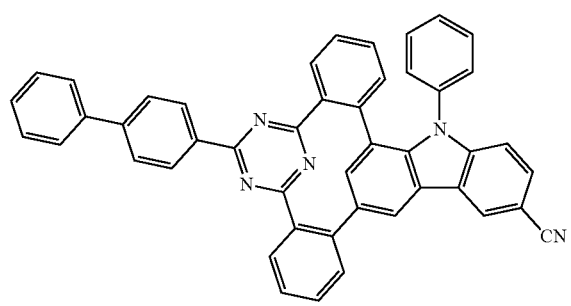
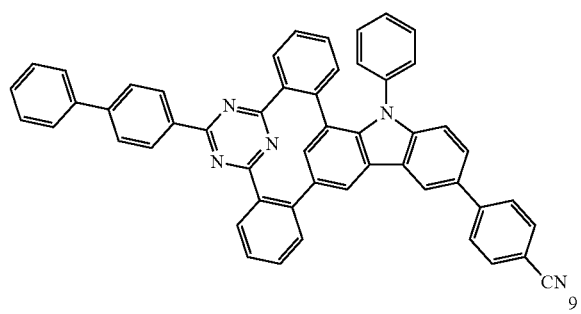
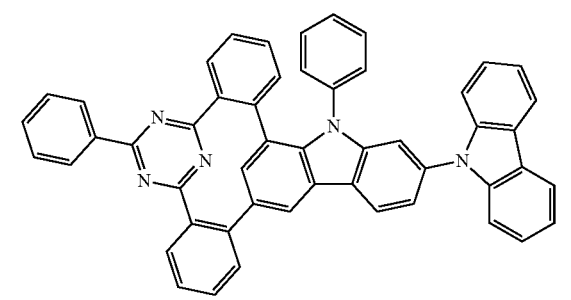
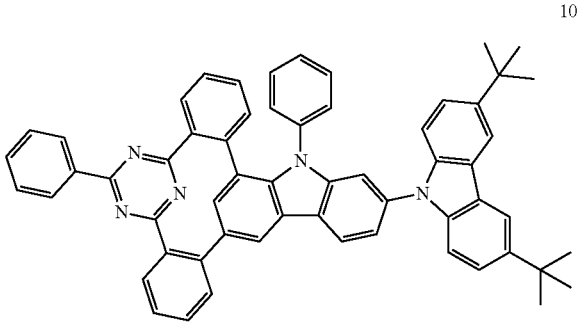
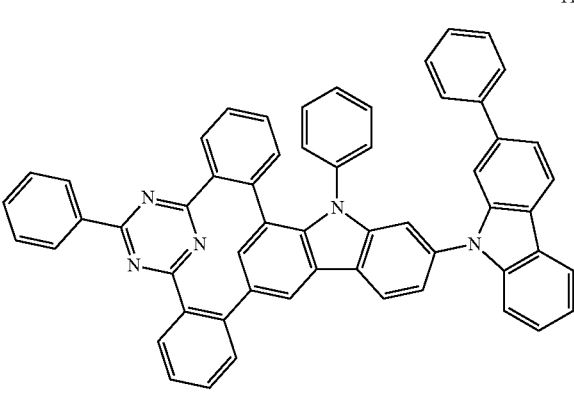

16
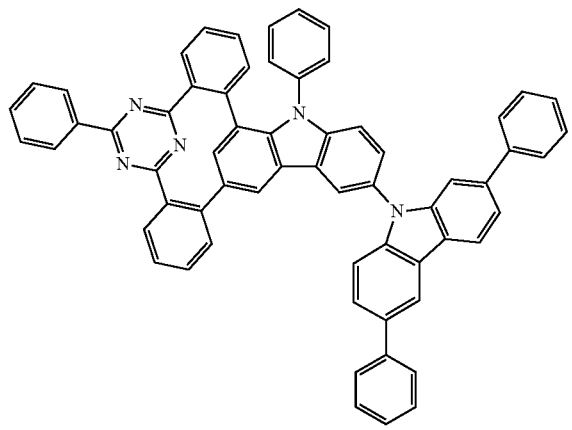
17
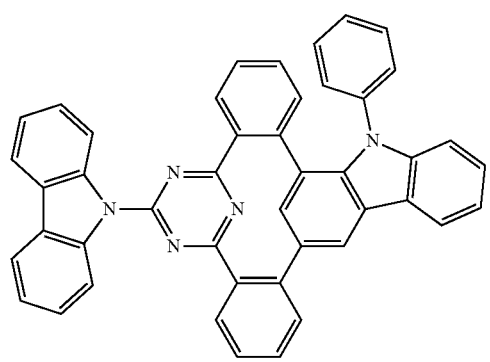
18
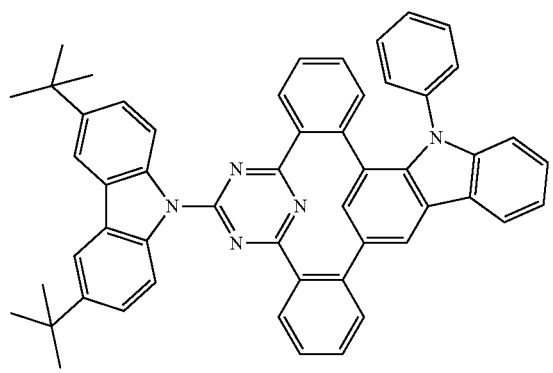
19
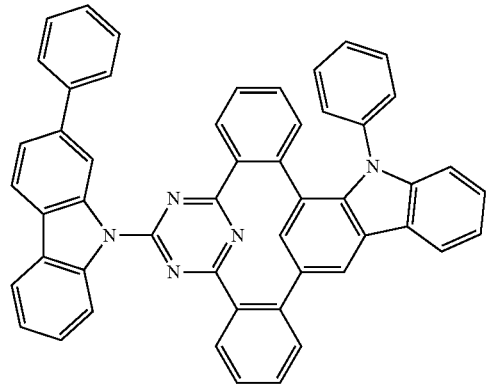
20
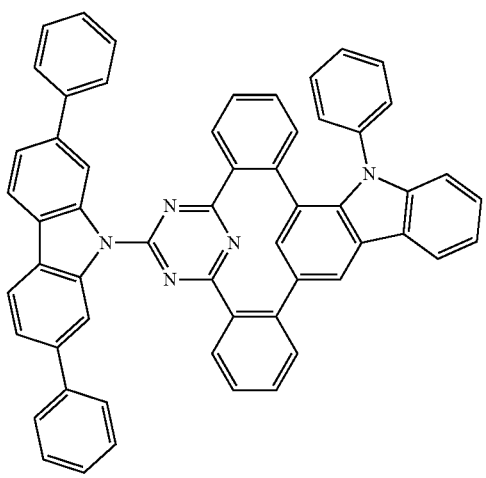
21
21
22
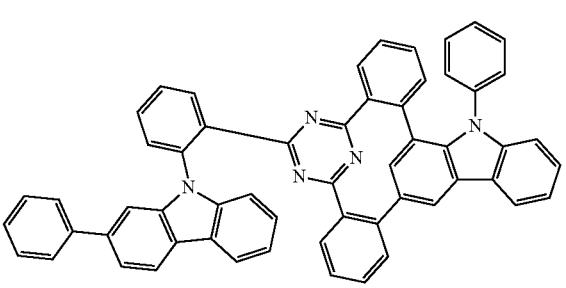
23

24
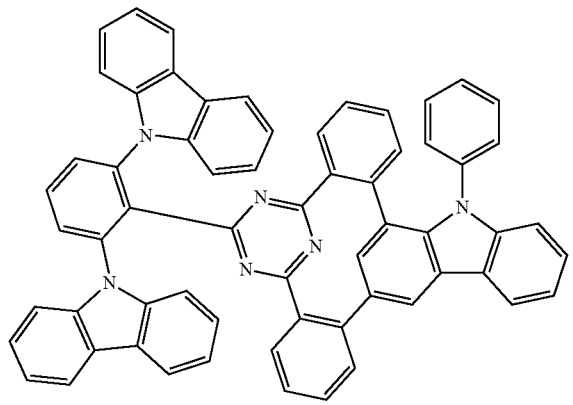
25
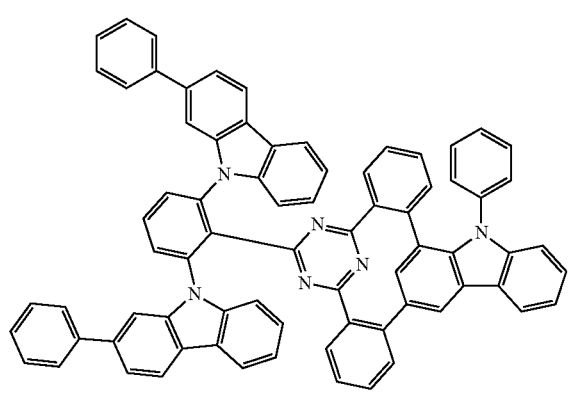
26
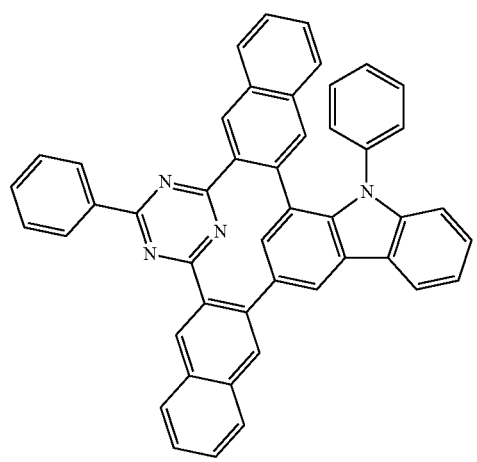
27
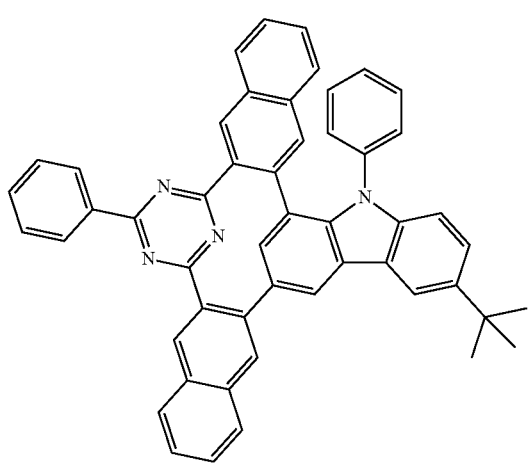
28
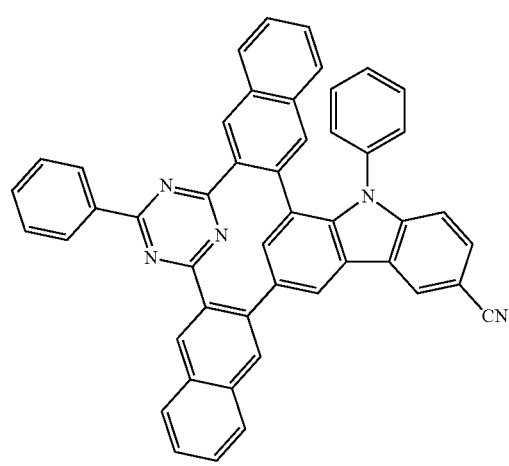
29
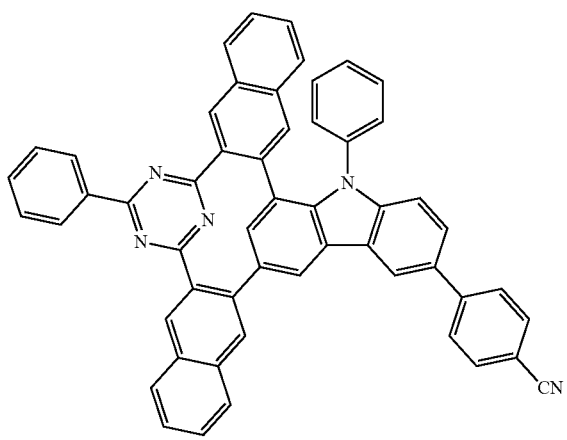

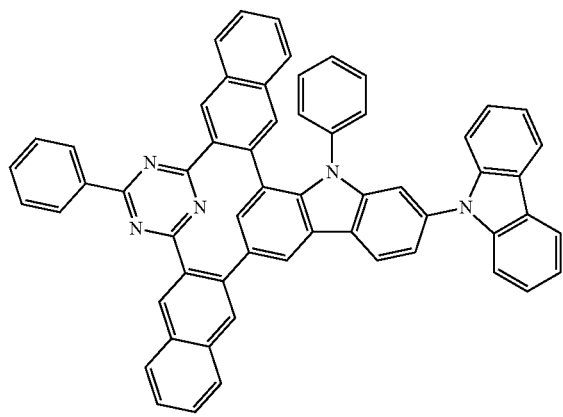
30
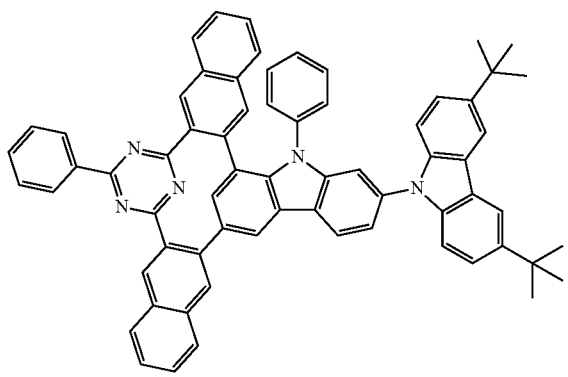
31
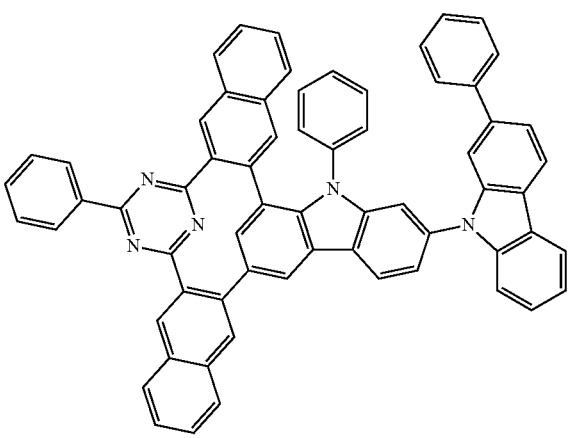
32
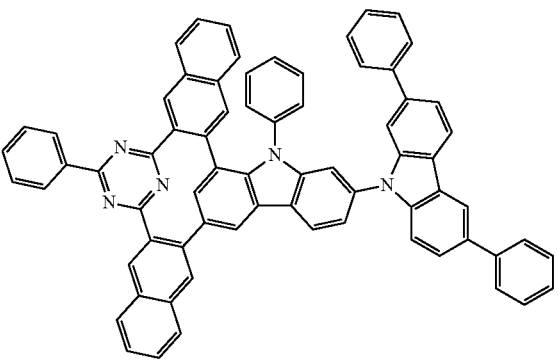
33
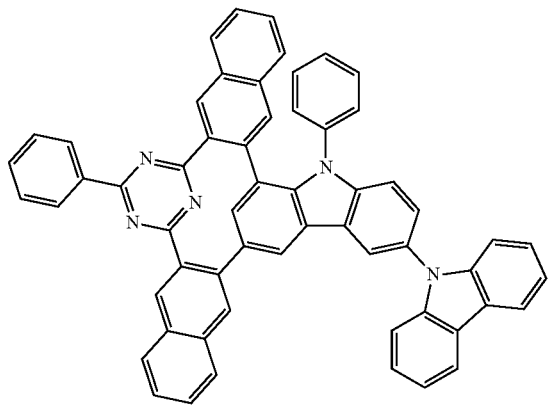
34
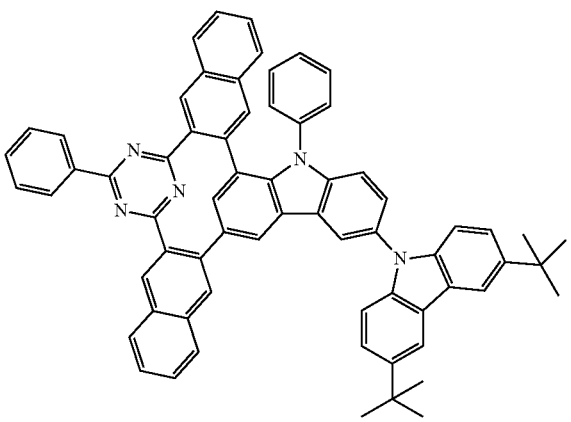
35
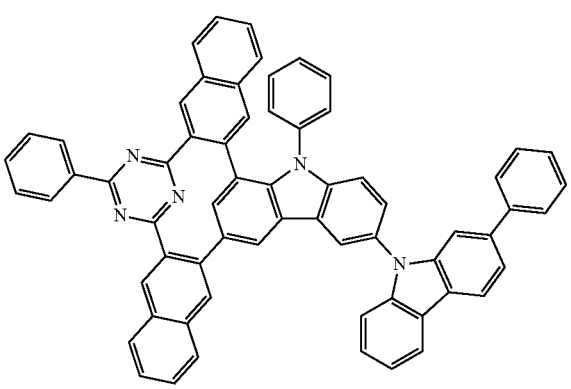
36

37
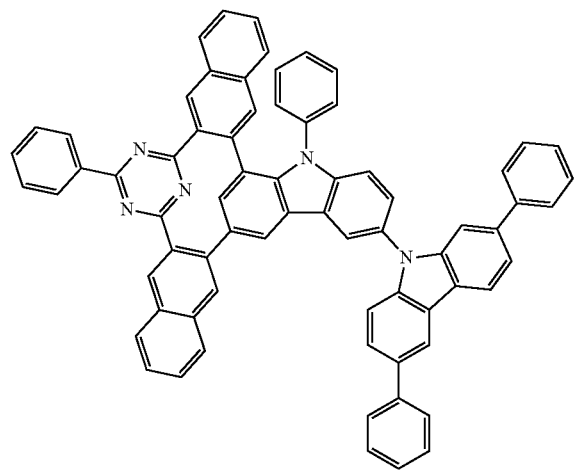
38
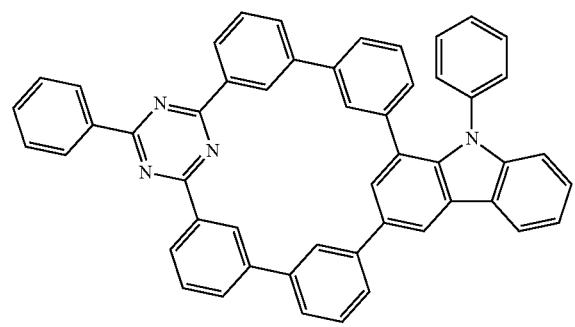
39
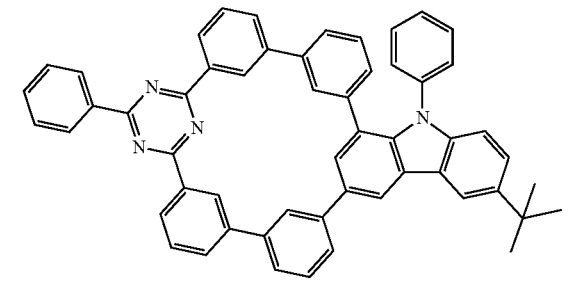
40
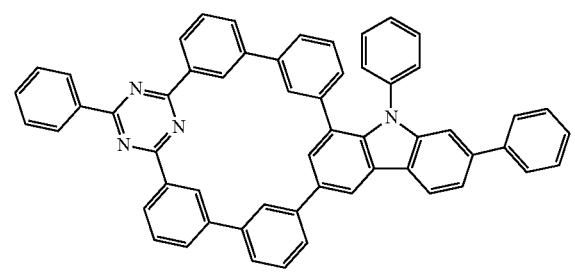
41
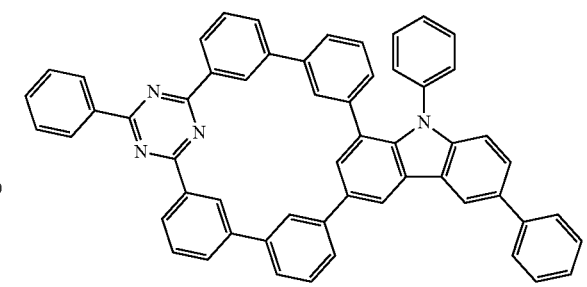
42
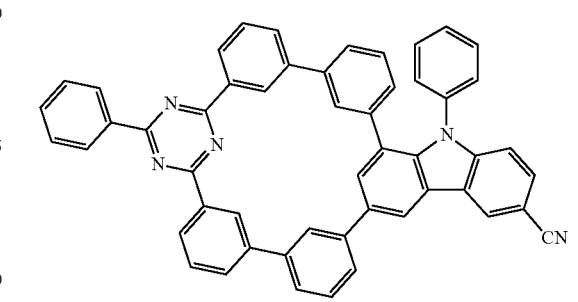
43
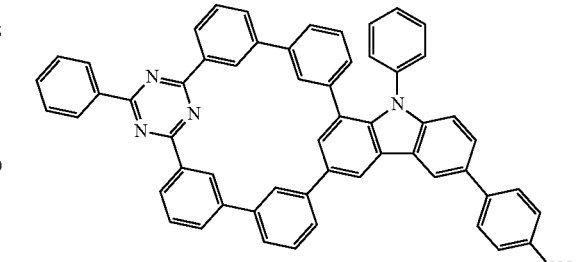
44
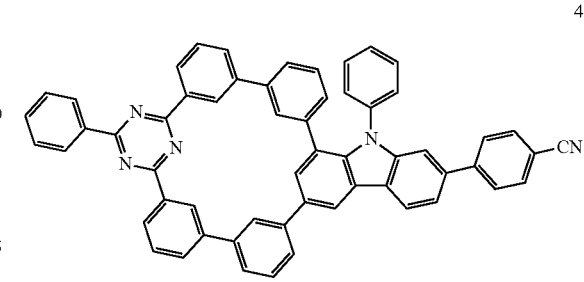

46
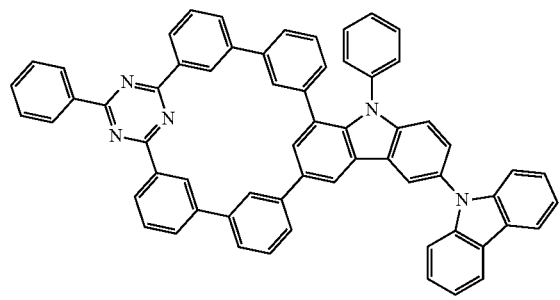
47
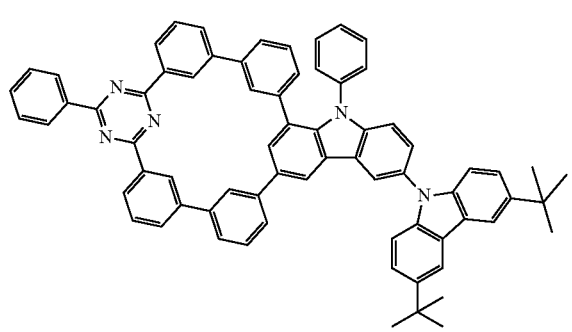
48
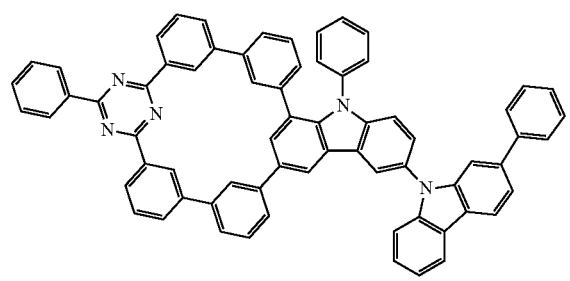
49
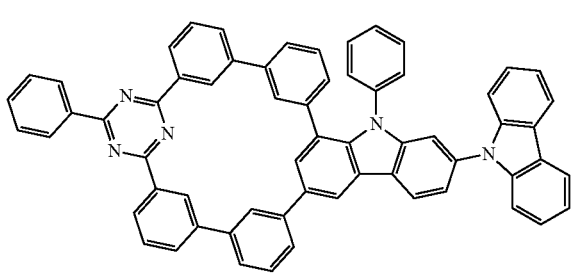
50
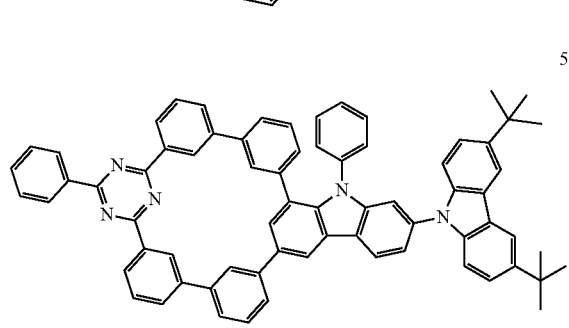
51
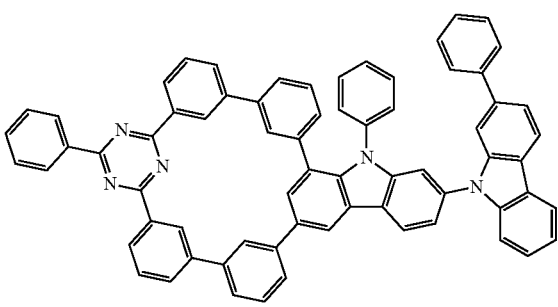
52
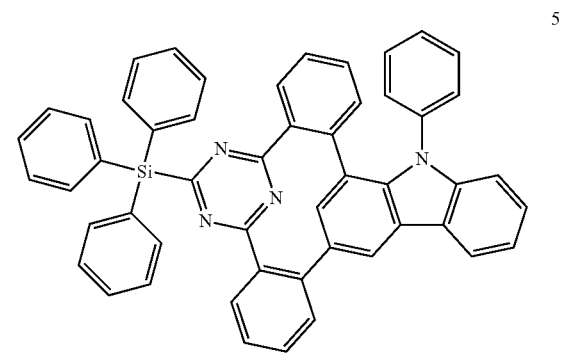
53
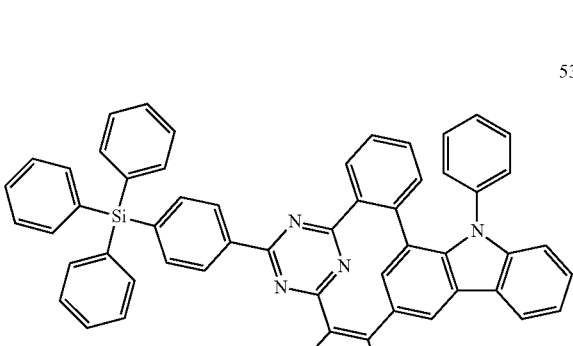
54
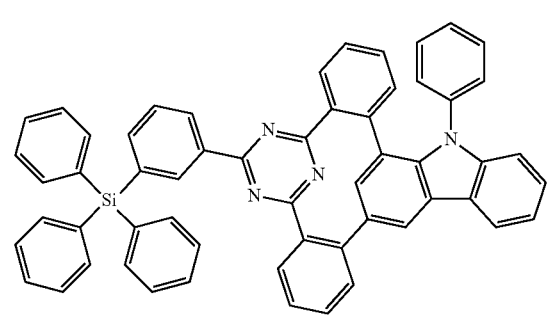

55
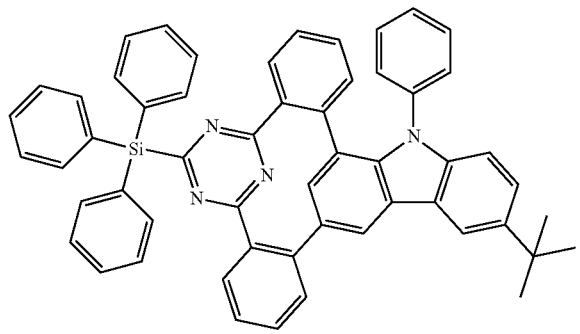
56
60
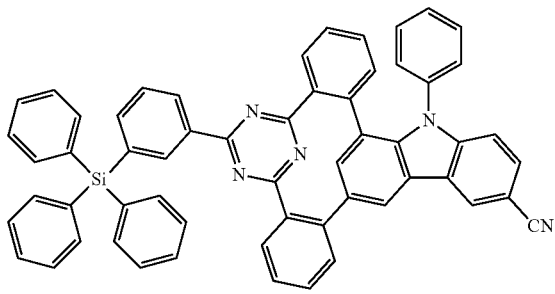
61
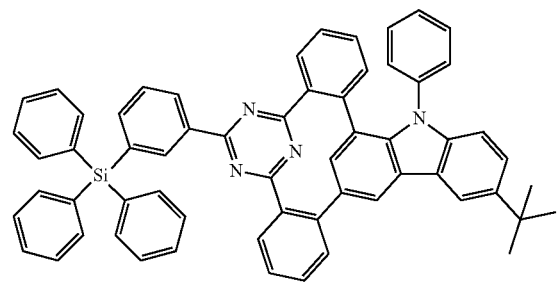
57
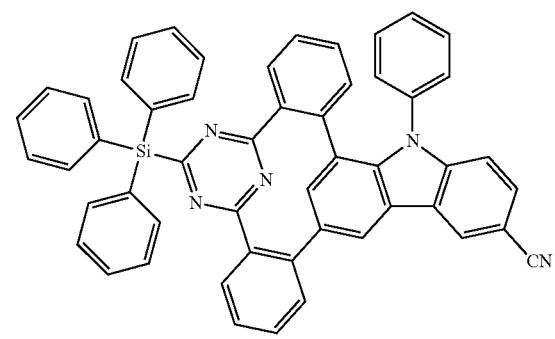
58
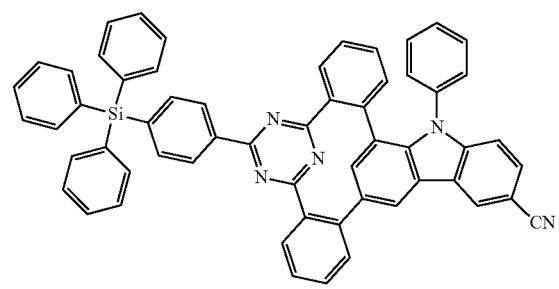
59
62
63
64
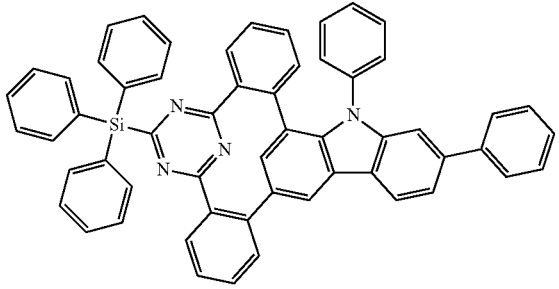

65
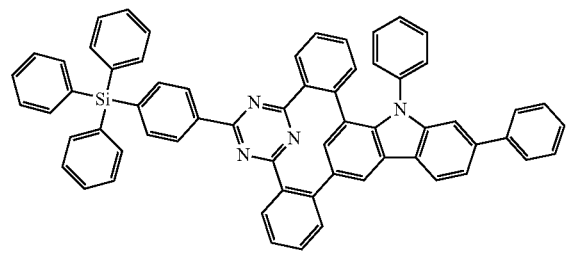
66
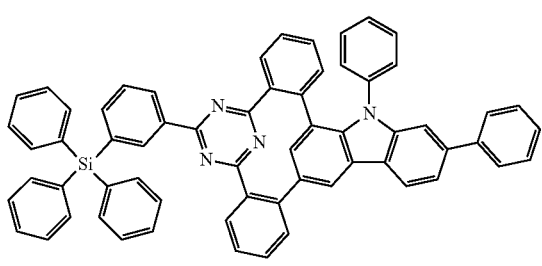
67
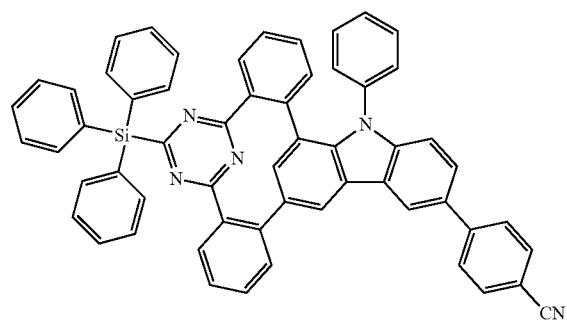
68
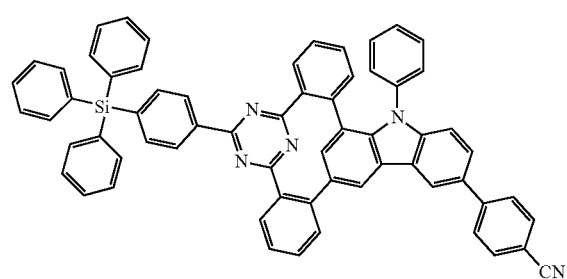
69
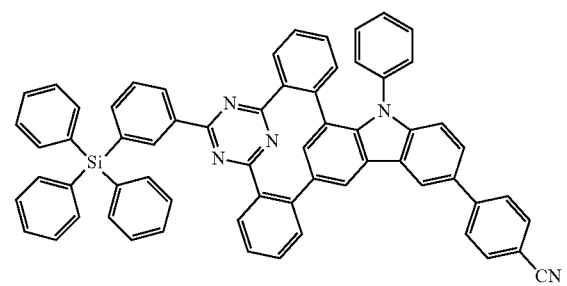
70
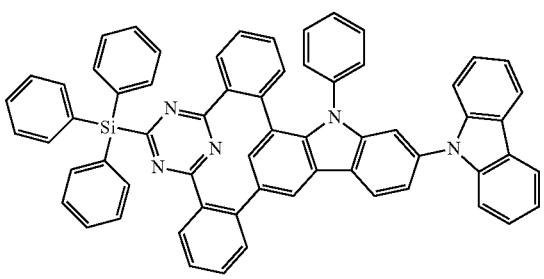
71
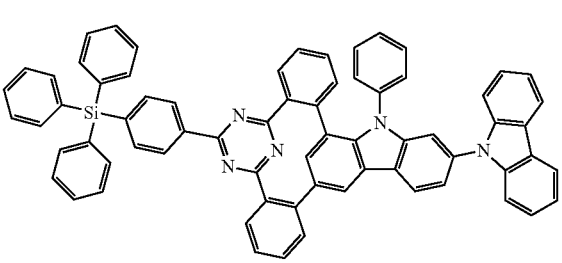
72
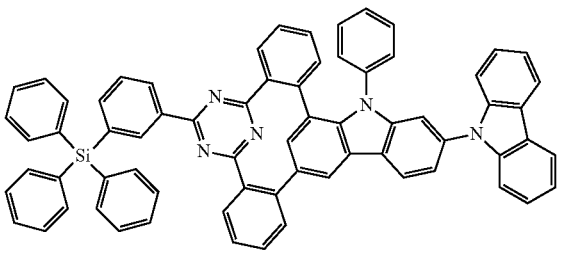
73
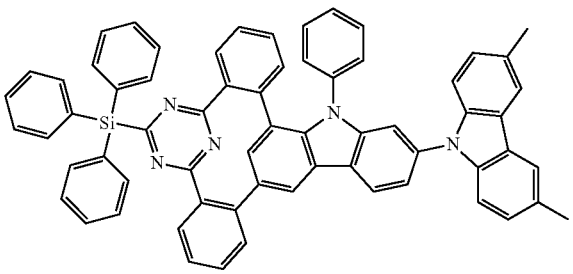
74
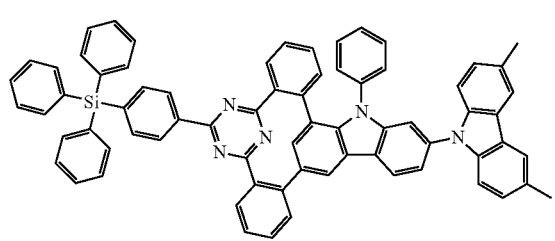

75
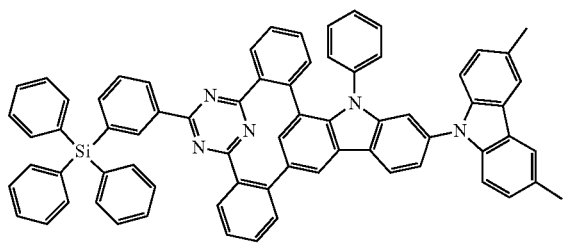
76
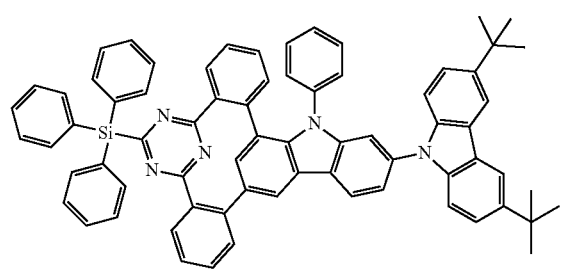
77
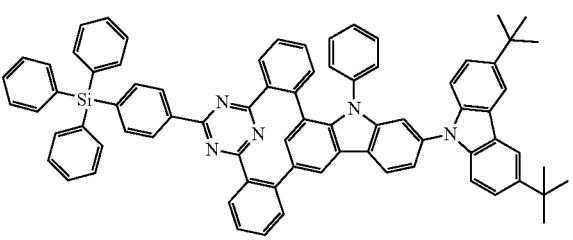
78
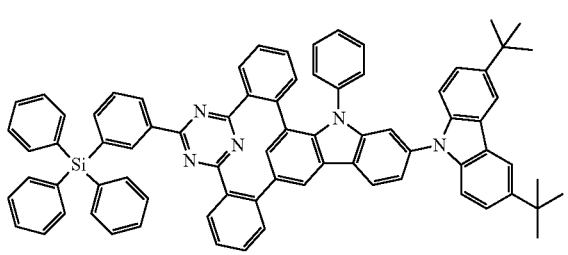
79
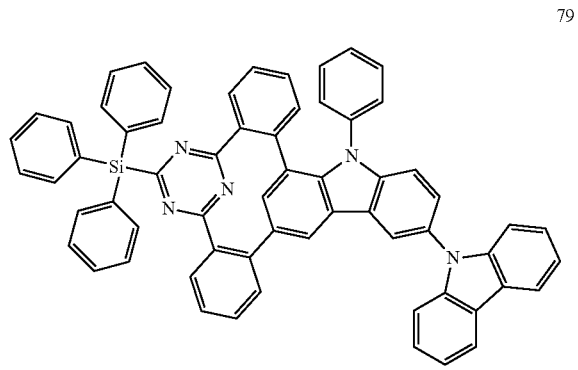
80
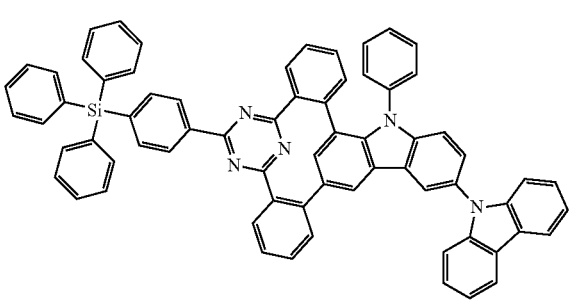
81
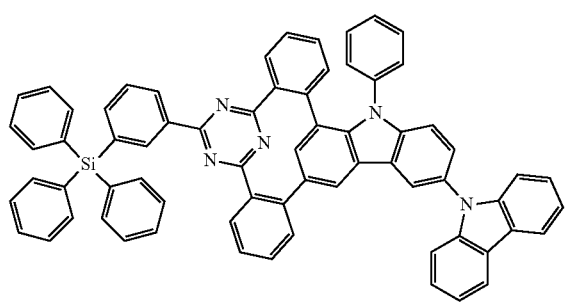
82
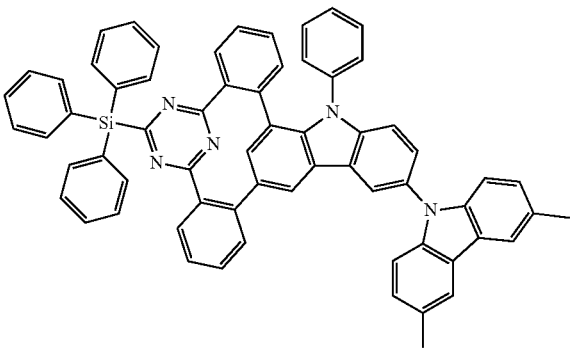
83
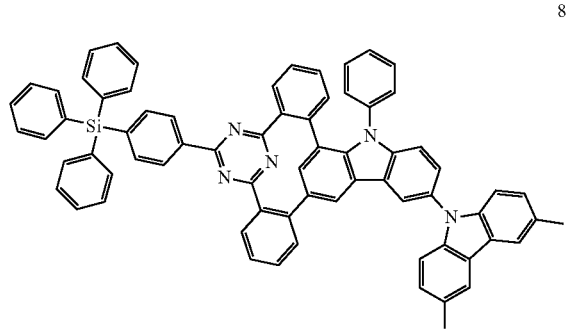

84
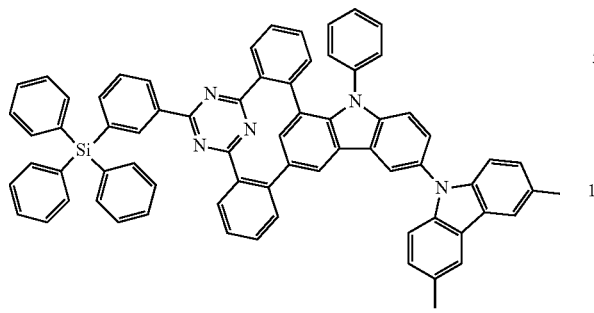
85
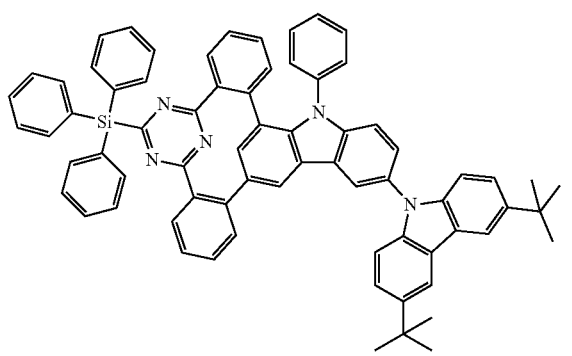
86
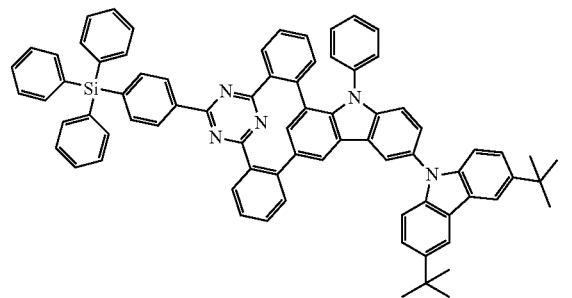
87
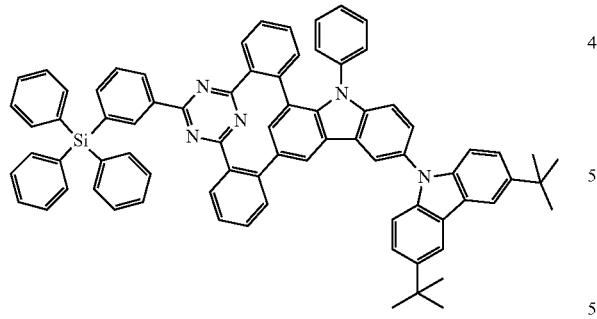
88
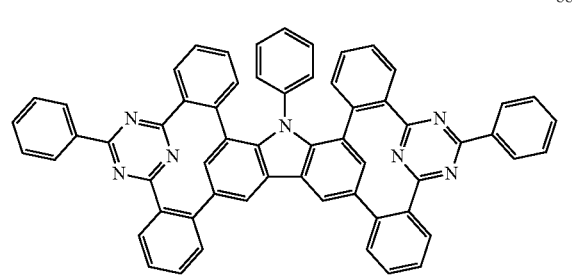
89
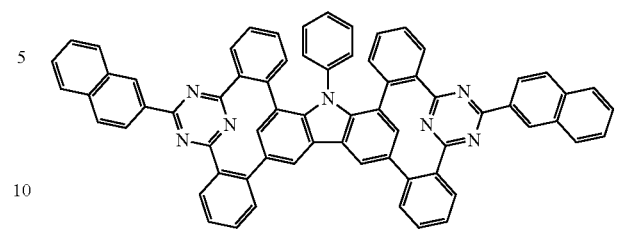
90
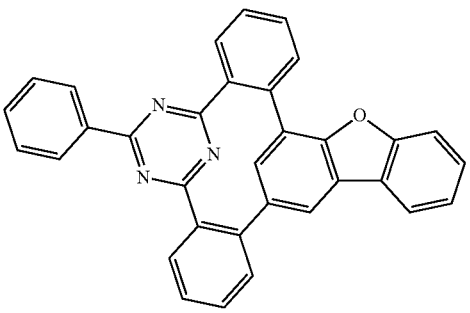
91
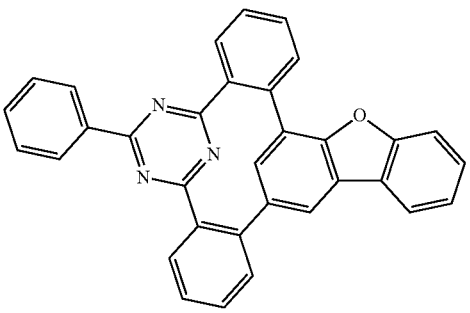
92
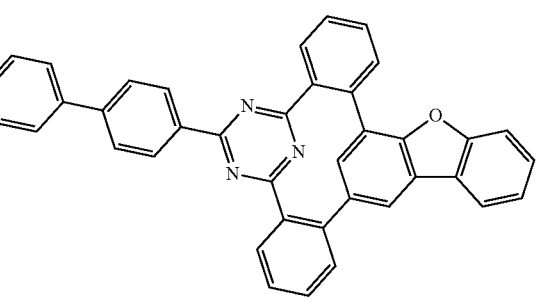
93
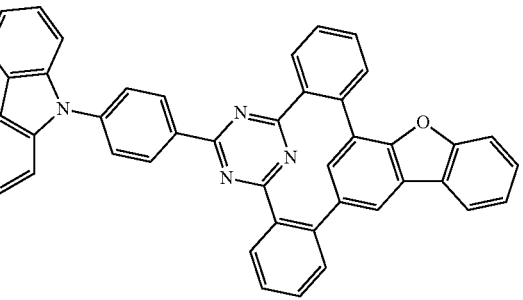

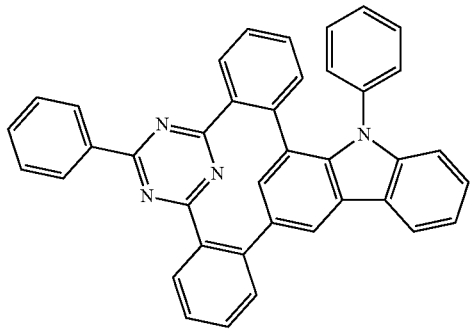

94

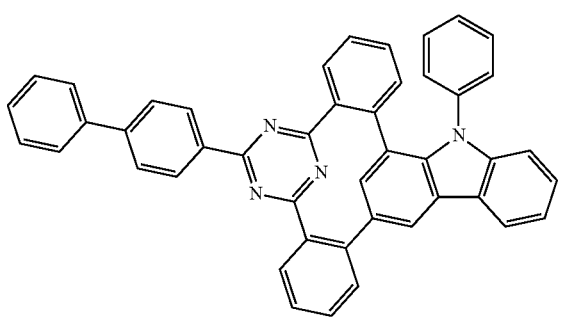

95

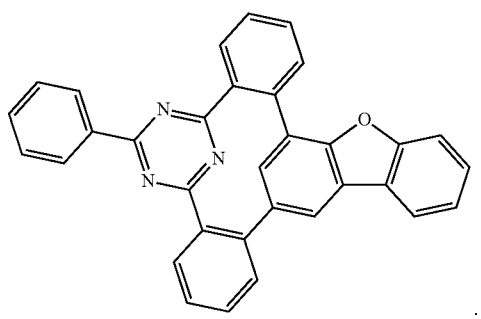

96

An embodiment provides an organic electroluminescence device including a first electrode; a hole transport region disposed on the first electrode; an emission layer disposed on the hole transport region; an electron transport region disposed on the emission layer; and a second electrode disposed on the electron transport region, wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more selected from them, a mixture of two or more selected from them, and an oxide thereof, and wherein at least one among the hole transport region, the emission layer and the electron transport region includes a fused polycyclic compound represented by Formula 1 below.

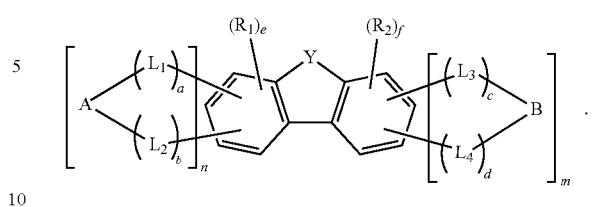

Formula 1

In Formula 1 above, Y is $NR_3$, O, or S, $R_1$ to $R_3$ are each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, n and m are each independently 0 or 1, where at least one among n and m is 1, $L_1$ to $L_4$ are each independently a substituted or unsubstituted arylene group of 6 to 30 ring-forming carbon atoms. In Formula 1, a to d are each independently an integer of 1 to 3, e and f are each independently an integer of 0 to 4, and A and B are each independently represented by Formula 2 below.

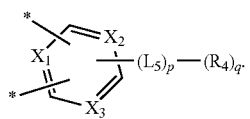

Formula 2

In Formula 2 above, $X_1$ to $X_3$ are each independently N or $CR_5$, where at least one among $X_1$ to $X_3$ is N, p is 0 or 1, q is an integer of 0 to 5, a case where p and q are 0 at the same time is excluded, $L_5$ is a substituted or unsubstituted arylene group of 6 to 30 carbon atoms, or a substituted or unsubstituted heteroarylene group of 2 to 30 carbon atoms, and $R_4$ and $R_5$ are each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms.

The emission layer may be a delayed fluorescence emission layer including a host and a dopant, and the dopant may include the fused polycyclic compound represented by Formula 1 above.

The fused polycyclic compound may be at least one among compounds represented in Compound Group 1 above.

Another embodiment provides a fused polycyclic compound represented by Formula 1 below.

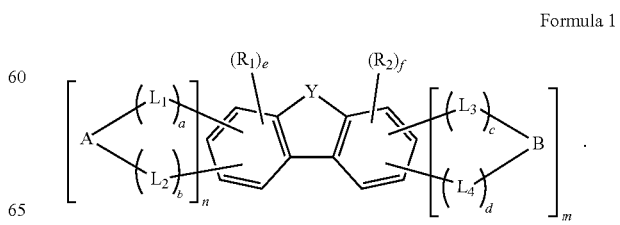

Formula 1

In Formula 1 above, Y is $NR_3$, O, or S, $R_1$ to $R_3$ are each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, n and m are each independently 0 or 1, where at least one among n and m is 1, $L_1$ to $L_4$ are each independently a substituted or unsubstituted arylene group of 6 to 30 ring-forming carbon atoms. In Formula 1, a to d are each independently an integer of 1 to 3, e and f are each independently an integer of 0 to 4, and A and B are each independently represented by Formula 2 below.

Formula 2

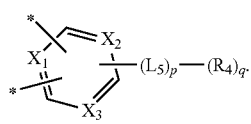

In Formula 2 above, $X_1$ to $X_3$ are each independently N or $CR_5$, where at least one among $X_1$ to $X_3$ is N, p is 0 or 1, q is an integer of 0 to 5, a case where p and q are 0 at the same time is excluded, $L_5$ is a substituted or unsubstituted arylene group of 6 to 30 carbon atoms, or a substituted or unsubstituted heteroarylene group of 2 to 30 carbon atoms. In Formula 2, $R_4$ and $R_5$ are each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms.

Formula 1 may be represented by Formula 1-1 or Formula 1-2 below.

Formula 1-1

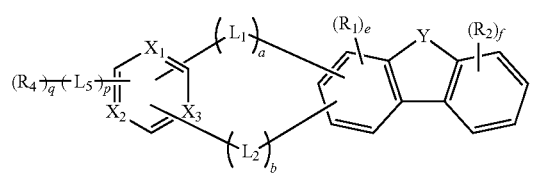

Formula 1-2

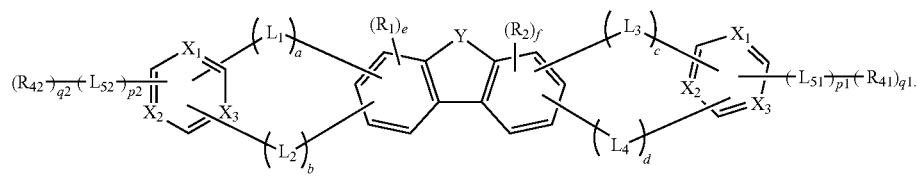

In Formula 1-2 above, p1 and p2 are each independently 0 or 1, q1 and q2 are each independently an integer of 0 to 5, a case where p1 and q1 are 0 at the same time, and a case where p2 and q2 are 0 at the same time are excluded, $L_{51}$ and $L_{52}$ are each independently a substituted or unsubstituted arylene group of 6 to 30 carbon atoms, or a substituted or unsubstituted heteroarylene group of 2 to 30 carbon atoms, and $R_{41}$ and $R_{42}$ are each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms. In Formula 1-1 and Formula 1-2 above, Y, $R_1$, $R_2$, $R_4$, $L_1$ to $L_5$, $X_1$ to $X_3$, and a to f are the same as defined in Formula 1 and Formula 2.

Formula 1 may be represented by any one among Formula 1-3 to Formula 1-5 below.

Formula 1-3

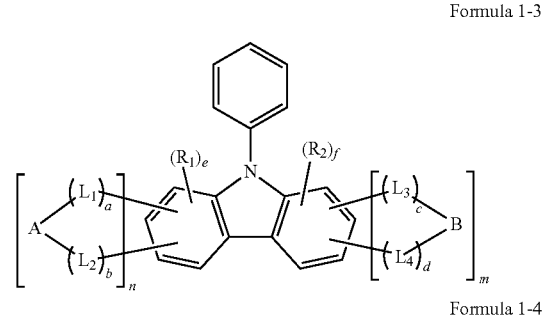

Formula 1-4

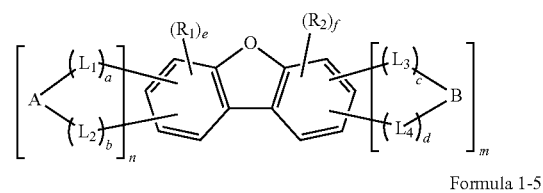

Formula 1-5

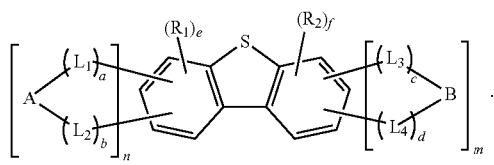

In Formula 1-3 to Formula 1-5, A, B, $L_1$ to $L_4$, a to f, n, m, $R_1$ and $R_2$ are the same as defined in Formula 1.

Advantageous Effects

The organic electroluminescence device of an embodiment may show improved device properties of a low driving voltage, long life and high efficiency.

The fused polycyclic compound of an embodiment may be used as a material for an organic electroluminescence device and may contribute to the increase of the life and efficiency of the organic electroluminescence device.

In addition, the fused polycyclic compound of an embodiment may be applied to the emission layer of an organic electroluminescence device to increase the color reproducibility and improve the reliability of the organic electroluminescence device.

MODE FOR CARRYING OUT THE INVENTION

Figure 1:
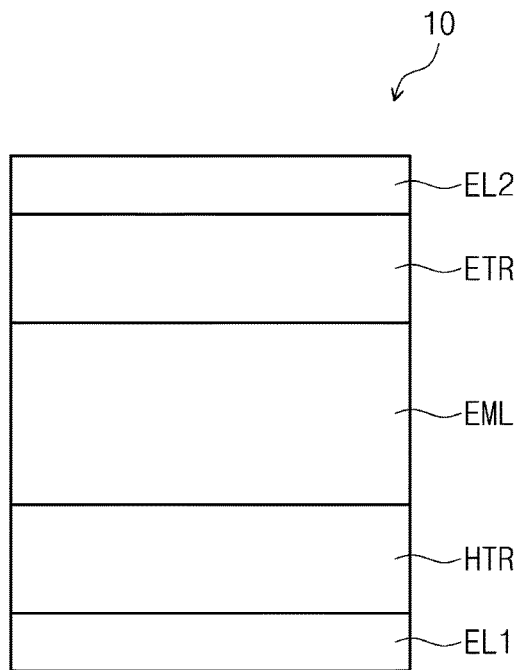
FIG. 1 is a cross-sectional view schematically showing an organic electroluminescence device according to an embodiment of the present invention.

The present invention may have various modifications and may be embodied in different forms, and example embodiments will be explained in detail with reference to the accompany drawings. The present invention may, however, be embodied in different forms and should not be construed as limited to the embodiments set forth herein. Rather, all modifications, equivalents, and substituents which are included in the spirit and technical scope of the inventive concept should be included in the present invention.

In the description, it will be understood that when an element is referred to as being "on", "connected to" or "coupled to" another element, it can be directly on, connected or coupled to the other element, or intervening third elements may be present.

Like reference numerals refer to like elements throughout. In addition, in the drawings, the thickness, the ratio, and the dimensions of constituent elements are exaggerated for effective explanation of technical contents.

The term "and/or" includes one or more combinations which may be defined by relevant elements.

It will be understood that, although the terms first, second, etc. may be used herein to describe various elements, these elements should not be limited by these terms. These terms are only used to distinguish one element from another element. For example, a first element could be termed a second element without departing from the teachings of the present invention. Similarly, a second element could be termed a first element. The singular forms are intended to include the plural forms as well, unless the context clearly indicates otherwise.

In addition, the terms "below", "beneath", "on" and "above" are used for explaining the relation of elements shown in the drawings. These terms are a relative concept and are explained on the basis of the direction shown in the drawing.

Unless otherwise defined, all terms (including technical and scientific terms) used herein have the same meaning as commonly understood by one of ordinary skill in the art to which this invention belongs. In addition, it will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," when used in this specification, specify the presence of stated features, numerals, steps, operations, elements, parts, or the combinations thereof, but do not preclude the presence or addition of one or more other features, numerals, steps, operations, elements, parts, or the combinations thereof.

Hereinafter, an organic electroluminescence device according to an embodiment of the present invention and a fused polycyclic compound of an embodiment included therein will be explained with reference to attached drawings.

Figure 2:
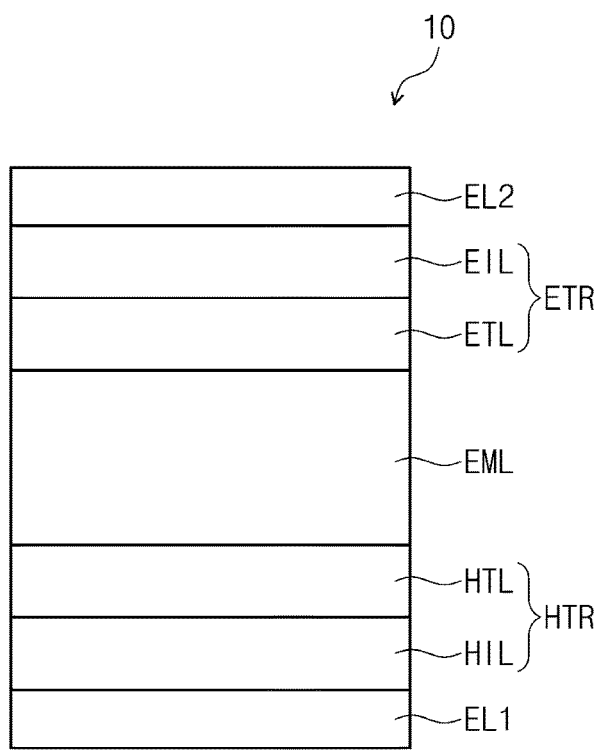
FIG. 2 is a cross-sectional view schematically showing an organic electroluminescence device according to an embodiment of the present invention.
Figure 3:
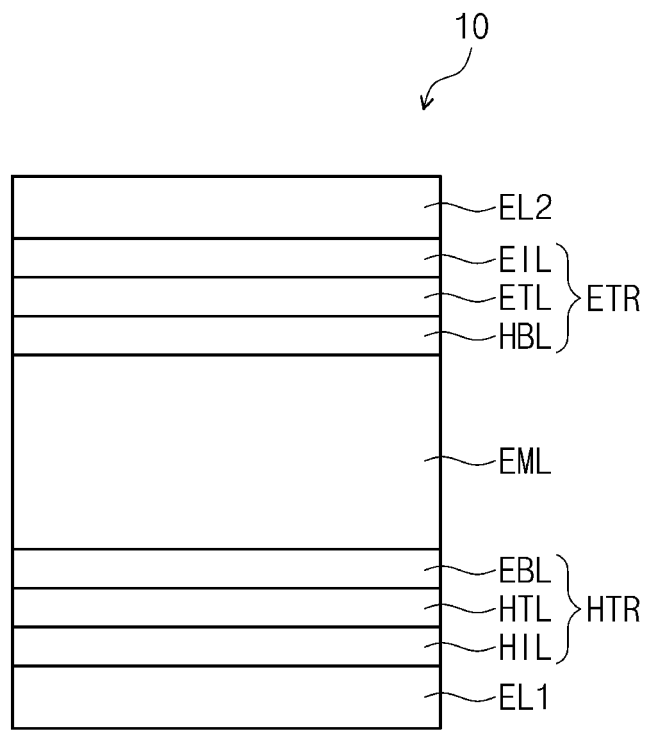
FIG. 3 is a cross-sectional view schematically showing an organic electroluminescence device according to an embodiment of the present invention.

FIGS. 1 to 3 are cross-sectional views schematically showing organic electroluminescence devices according to exemplary embodiments of the present invention. Referring to FIGS. 1 to 3, in an organic electroluminescence device (10) of an embodiment, a first electrode (EL1) and a second electrode (EL2) are oppositely disposed, and between the first electrode (EL1) and the second electrode (EL2), a plurality of organic layers may be disposed. The plurality of the organic layers may include a hole transport region (HTR), an emission layer (EML), and an electron transport region (ETR). That is, the organic electroluminescence device (10) according to an embodiment may include a first electrode (EL1), a hole transport region (HTR), an emission layer (EML), an electron transport region (ETR), and a second electrode, stacked one by one.

The organic electroluminescence device (10) of an embodiment may include a fused polycyclic compound of an embodiment, which will be explained herein, in at least one organic layer among the plurality of the organic layers disposed between the first electrode (EL1) and the second electrode (EL2). For example, the organic electroluminescence device (10) of an embodiment may include a fused polycyclic compound of an embodiment, which will be explained herein, in at least one organic layer among the hole transport region (HTR), the emission layer (EML), and the electron transport region (ETR), and particularly, the organic electroluminescence device (10) of an embodiment may include the fused polycyclic compound of an embodiment as the light-emitting material of the emission layer (EML).

In the fused polycyclic compound of an embodiment, a dibenzoheterocyclic derivative and a monoheterocyclic derivative containing at least one nitrogen atom as a ring-forming atom may be connected via a linker to form a ring. In an embodiment, the dibenzoheterocyclic derivative represents a substituted or unsubstituted dibenzoheterocycle, and the monoheterocyclic derivative may represent a substituted or unsubstituted monoheterocycle.

In the fused polycyclic compound of an embodiment, one dibenzoheterocyclic derivative and one monoheterocyclic derivative may be connected via a linker to form a ring. For example, the fused polycyclic compound of an embodiment may be a ring compound formed by connecting one dibenzoheterocyclic derivative, one monoheterocyclic derivative and two linkers with each other. Particularly, the fused polycyclic compound of an embodiment may be a ring compound formed by connecting a dibenzoheterocyclic derivative, a linker, a monoheterocyclic derivative, and a linker in this order.

Meanwhile, the fused polycyclic compound of an embodiment may include one dibenzoheterocyclic derivative and two monoheterocyclic derivatives. One dibenzoheterocyclic derivative may be connected with two monoheterocyclic derivatives via linkers, respectively, to form rings.

In the fused polycyclic compound of an embodiment, the dibenzoheterocyclic derivative and the monoheterocyclic derivative containing at least one nitrogen atom as a ring-forming atom are connected by the linker to show relatively rigid properties. The dibenzoheterocyclic derivative and the monoheterocyclic derivative containing at least one nitrogen atom as a ring-forming atom are fixed and connected via the linker, and the fused polycyclic compound may have a high glass transition temperature, and a fused polycyclic compound having improved reliability may be provided.

In the fused polycyclic compound of an embodiment, the dibenzoheterocyclic derivative may be an electron donor, and the monoheterocycle containing at least one nitrogen atom as a ring-forming atom may be an electron acceptor. The fused polycyclic compound of an embodiment may be a ring formed by connecting an electron donor and an electron acceptor via a linker.

That is, the fused polycyclic compound of an embodiment may include both an electron donor and an electron acceptor in one compound molecule, and the electron donor and the electron acceptor may be connected via the linker and fixed. The fused polycyclic compound of an embodiment may include one electron donor and one electron acceptor in one compound unit. In addition, the fused polycyclic compound of an embodiment may include one electron donor and two electron acceptors in one compound unit.

In an embodiment, the dibenzoheterocyclic derivative has the structure of

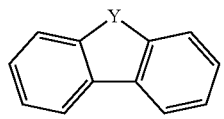

and represents a structure where a heteroatom is included in Y. In an embodiment, the dibenzoheterocyclic derivative may be substituted or unsubstituted carbazole, substituted or unsubstituted dibenzofuran, or substituted or unsubstituted dibenzothiophene.

In an embodiment, the monoheterocyclic derivative may be a hexagonal ring compound including at least one nitrogen atom. In an embodiment, the monoheterocyclic derivative has the structure of

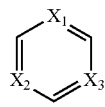

and represents a structure where at least one among $X_1$, $X_2$, and $X_3$ is a nitrogen atom. In an embodiment, the monoheterocyclic derivative containing at least one nitrogen atom as a ring-forming atom may be substituted or unsubstituted triazine, substituted or unsubstituted pyridine, or substituted or unsubstituted pyrimidine.

In the fused polycyclic compound of an embodiment, the linker connecting the dibenzoheterocyclic derivative and the monoheterocyclic derivative may be a substituted or unsubstituted arylene group of 6 to 30 ring-forming carbon atoms. For example, in the fused polycyclic compound of an embodiment, the linker may be a substituted or unsubstituted phenylene group, a substituted or unsubstituted divalent biphenyl group, or a substituted or unsubstituted naphthylene group.

In the description, the term "substituted or unsubstituted" corresponds to a group that is unsubstituted or is substituted with one or more substituents selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the exemplified substituents may be substituted or unsubstituted. For example, a biphenyl group may be interpreted as an aryl group or a phenyl group substituted with a phenyl group.

In the description, examples of the halogen atom may include a fluorine atom, a chlorine atom, a bromine atom or an iodine atom.

In the description, the alkyl group may be a linear chain, a branched chain or a cyclic type. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the hydrocarbon ring group means an optional functional group or substituent derived from an aliphatic hydrocarbon ring. The hydrocarbon ring group may be a saturated hydrocarbon ring group of 5 to 30 ring-forming carbon atoms.

In the description, the aryl group means an optional functional group or substituent derived from an aromatic hydrocarbon ring. The aryl group may be a monocyclic aryl group or a polycyclic aryl group. The ring-forming carbon atom number in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the description, the fluorenyl group may be substituted, and two substituents may be combined with each other to form a spiro structure. Examples of a substituted fluorenyl group are as follows. However, an embodiment of the present invention is not limited thereto.

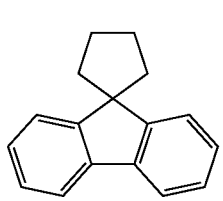 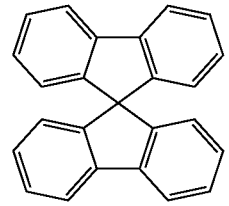

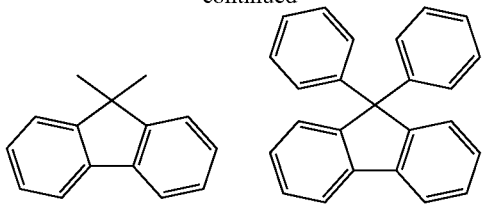

In the description, the heteroaryl group may include one or more among B, O, N, P, Si and S as heteroatoms. If the heteroaryl group includes two or more heteroatoms, two or more heteroatoms may be the same or different. The heteroaryl group may be a monocyclic heterocyclic group or a polycyclic heterocyclic group. The ring-forming carbon number of the heteroaryl group may be 2 to 30, 2 to 20, or 2 to 10. Examples of the heteroaryl group may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuran, etc., without limitation.

In the description, the explanation of the aryl group may be applied to the arylene group, except that the arylene group is a divalent group. The explanation of the heteroaryl group may be applied to the heteroarylene group, except that the heteroarylene group is a divalent group.

In the description, the silyl group includes an alkyl silyl group and an aryl silyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, an embodiment of the present invention is not limited thereto.

Meanwhile, in the description, "——" means a position to be connected.

The fused polycyclic compound of an embodiment, included in the organic electroluminescence device (10) of an embodiment may be represented by Formula 1 below.

Formula 1

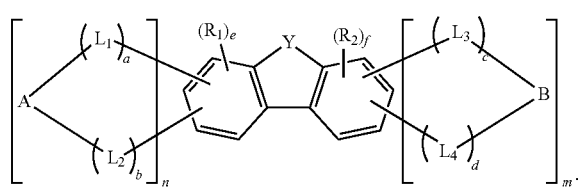

In Formula 1 above, Y may be $NR_3$, O, or S. In Formula 1,

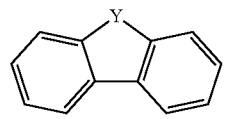

may be a dibenzoheterocyclic derivative containing N, O, or S as a heteroatom.

In Formula 1, $R_1$ to $R_3$ may be each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms.

For example, in Formula 1, $R_3$ may be a substituted or unsubstituted aryl group of 6 to 30 ring-forming carbon atoms. Particularly, $R_3$ may be a substituted or unsubstituted phenyl group, and in an embodiment, $R_3$ may be an unsubstituted phenyl group.

For example, in Formula 1, $R_1$ and $R_2$ may be each independently a hydrogen atom, a cyano group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms. Particularly, $R_1$ and $R_2$ may be each independently a hydrogen atom, a cyano group, a substituted or unsubstituted phenyl group, a substituted or unsubstituted carbazole group, or a tert-butyl group (t-butyl group).

e and f may be each independently an integer of 0 to 4. If e is an integer of 2 or more, a plurality of $R_1$ groups may be the same or different. If f is an integer of 2 or more, a plurality of $R_2$ groups may be the same or different.

In Formula 1, n and m are each independently 0 or 1, where at least one among n and m may be 1. For example, any one among n and m may be 1, and the remainder may be 0, or both n and m may be 1.

In Formula 1, $L_1$ to $L_4$ may be each independently a substituted or unsubstituted arylene group of 6 to 30 ring-forming carbon atoms. For example, $L_1$ to $L_4$ may be each independently an unsubstituted arylene group of 6 to 30 ring-forming carbon atoms.

Meanwhile, in Formula 1, A and B may be each independently represented by Formula 2 below.

Formula 2

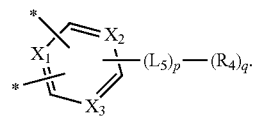

In Formula 2 above, $X_1$ to $X_3$ may be each independently N or $CR_5$, where at least one among $X_1$ to $X_3$ may be N. For example, any one among $X_1$ to $X_3$ may be N, and the remainder may be $CR_5$, or two among $X_1$ to $X_3$ may be N, and the remainder may be $CR_5$, or all of $X_1$ to $X_3$ may be N. In Formula 2,

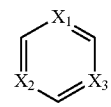

may be the monoheterocyclic derivative containing at least one nitrogen atom as a ring-forming atom.

p is 0 or 1, q is an integer of 0 to 5, and a case where p and q are 0 at the same time is excluded. That is, if p is 0, q is 1, and if p is 1, q may be an integer of 0 or 1 or more. That is,

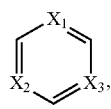

which is the monoheterocyclic derivative, may be a substituted monoheterocyclic derivative.

$L_5$ may be a substituted or unsubstituted arylene group of 6 to 30 carbon atoms, or a substituted or unsubstituted heteroarylene group of 2 to 30 carbon atoms.

In Formula 2, $R_4$ and $R_5$ may be each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms.

For example, in Formula 2, $R_4$ and $R_5$ may be each independently a hydrogen atom, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms. Particularly, $R_4$ and $R_5$ may be each independently a triphenyl silyl group, a substituted or unsubstituted phenyl group, a substituted or unsubstituted carbazole group, or a tert-butyl group.

In Formula 1, $L_1$ to $L_4$ may be each independently a substituted or unsubstituted phenylene group, a substituted or unsubstituted divalent biphenyl group, or a substituted or unsubstituted naphthylene group. For example, in Formula 1, $L_1$ to $L_4$ may be each independently an unsubstituted phenylene group, an unsubstituted divalent biphenyl group, or an unsubstituted naphthylene group. $L_1$ to $L_4$ may be each independently represented by any one among AL-1 to AL-3 below.

AL-1

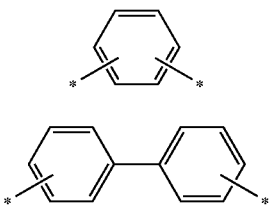

AL-2

AL-3

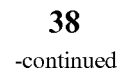

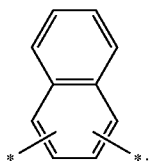

Meanwhile, Formula 2 may be represented by any one among Formula 2-1 to Formula 2-3 below.

Formula 2-1

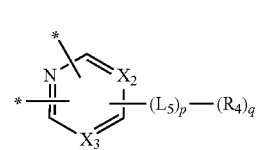

Formula 2-2

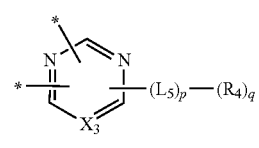

Formula 2-3

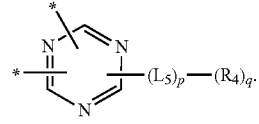

In Formula 2-1 to Formula 2-3 above, the same explanation of $X_2$, $X_3$, $L_5$, $R_4$, p and q referring to Formula 2 may be applied.

Formula 2-1 represents a case where the monoheterocyclic derivative includes one nitrogen atom as a ring-forming atom, Formula 2-2 represents a case where the monoheterocyclic derivative includes two nitrogen atoms as ring-forming atoms, and Formula 2-3 represents a case where the monoheterocyclic derivative includes three nitrogen atoms as ring-forming atoms.

Formula 2-1 represents a case where the monoheterocyclic derivative is a pyridine derivative, Formula 2-2 represents a case where the monoheterocyclic derivative is a pyrimidine derivative, and Formula 2-3 represents a case where the monoheterocyclic derivative is a triazine derivative.

In an embodiment, Formula 1 may be represented by Formula 1-1 or Formula 1-2 below.

Formula 1-1

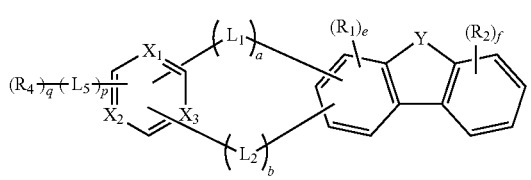

Formula 1-2

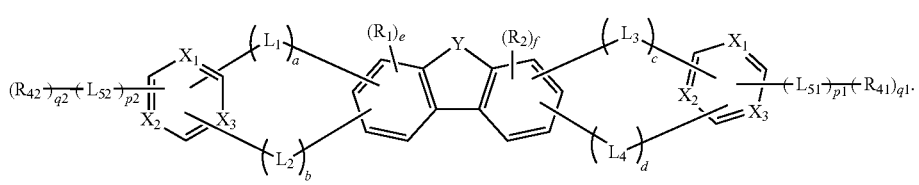

Formula 1-1 represents Formula 1 where n is 1, and m is 0, and Formula 1-2 represents Formula 1 where both n and m are 1. That is, Formula 1-1 includes one dibenzoheterocyclic derivative and one monoheterocyclic derivative, and Formula 1-2 includes one dibenzoheterocyclic derivative and two monoheterocyclic derivatives.

In Formula 1-1 and Formula 1-2, the same explanation of Y, $R_1$, $R_2$, $R_4$, $L_1$ to $L_5$, $X_1$ to $X_3$, and a to f referring to Formula 1 and Formula 2 may be applied.

In addition, in Formula 1-2, the same explanation referring to Formula 2 may be applied to

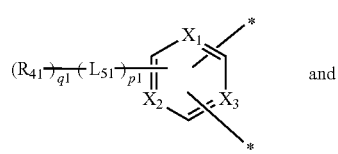

and

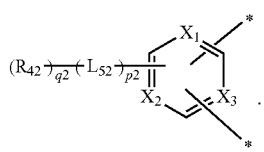

Meanwhile, in Formula 1-2

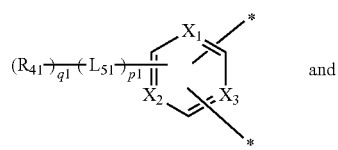

and

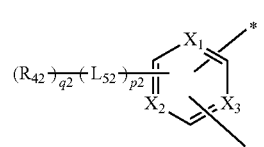

may be the same or different.

The fused polycyclic compound represented by Formula 1 may be represented by any one among Formula 1-3 to Formula 1-5 below.

Formula 1-3

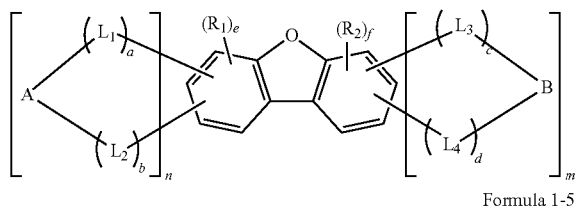

Formula 1-4

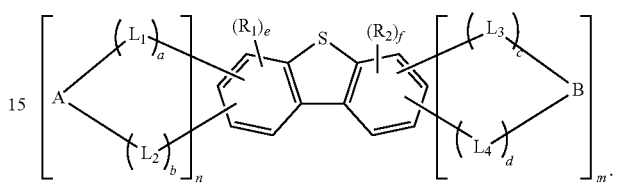

Formula 1-5

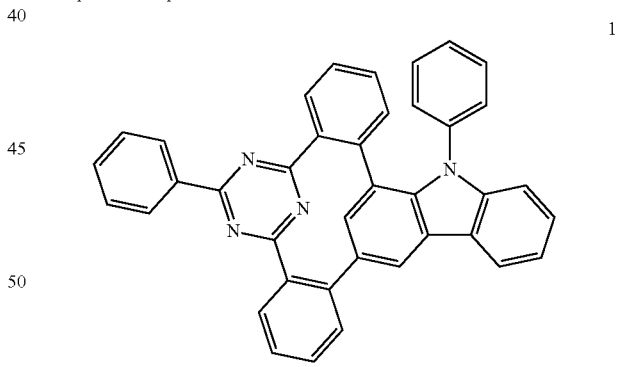

Formula 1-3 represents Formula 1 where Y is $NR_3$, particularly where, $R_3$ is an unsubstituted phenyl group. Formula 1-4 represents Formula 1 where Y is O, and Formula 1-5 represents Formula 1 where Y is S.

That is, Formula 1-3 represents a case where the dibenzoheterocyclic derivative is a 9-phenyl carbazole derivative, Formula 1-4 and Formula 1-5 represent cases where the dibenzoheterocyclic derivative is a dibenzofuran derivative and a dibenzothiophene derivative, respectively.

In Formula 1-3 to Formula 1-5, the same explanation of A, B, $L_1$ to $L_4$, a to f, n, m, $R_1$ and $R_2$ referring to Formula 1 may be applied.

The fused polycyclic compound of an embodiment may be any one among the compounds represented in Compound Group 1 below.

Compound Group 1

1

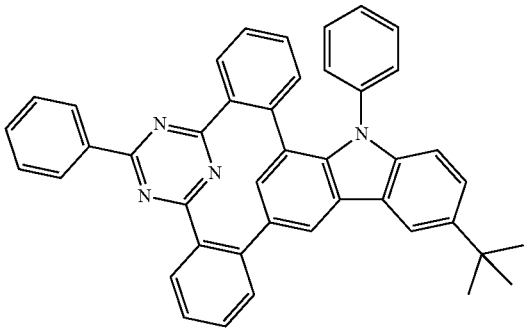

2

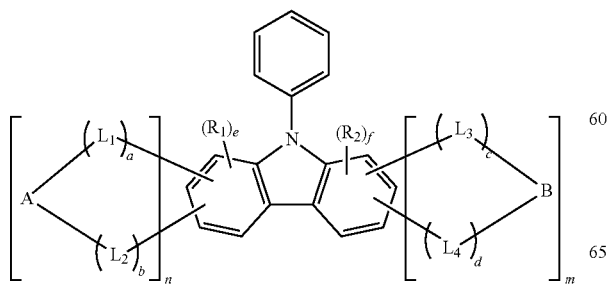

3
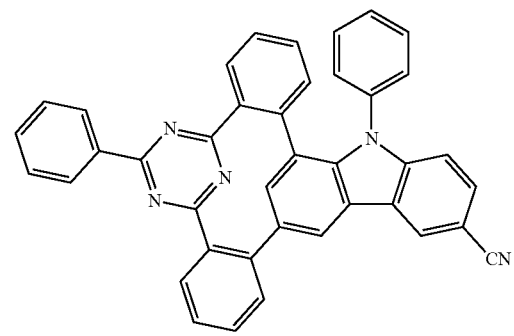
4
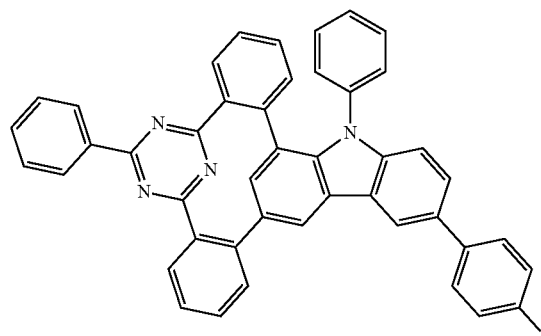
5
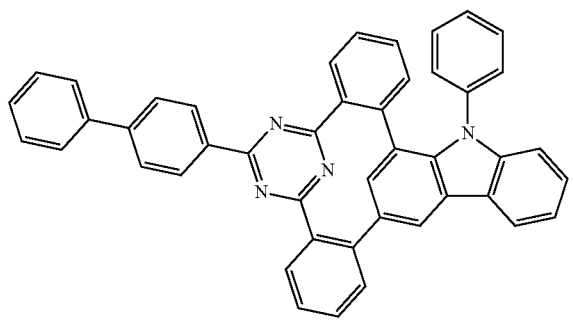
6
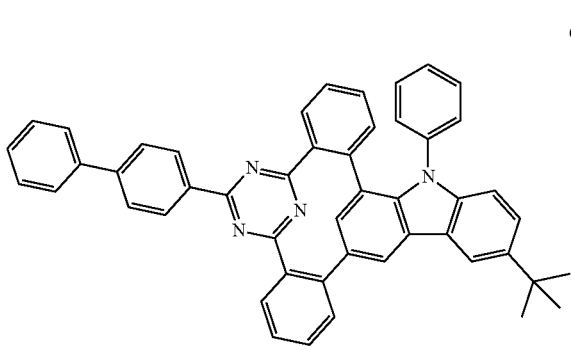
7
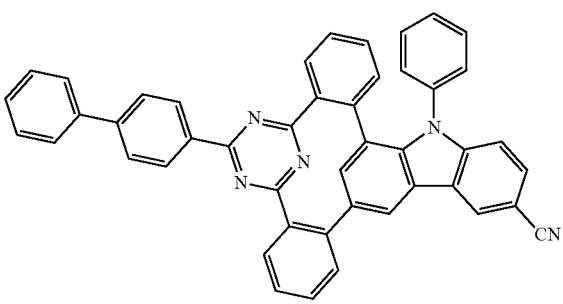
8
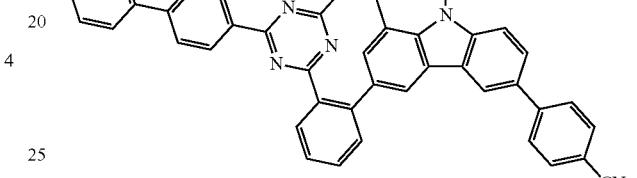
9
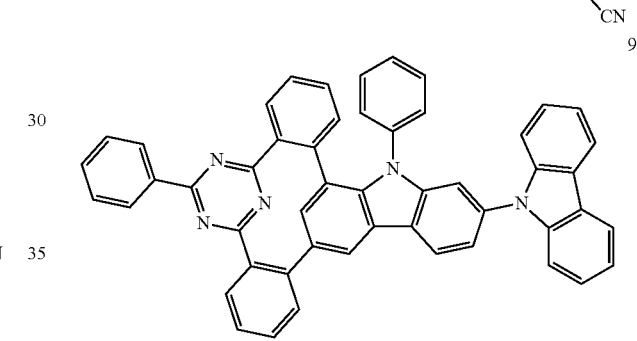
10
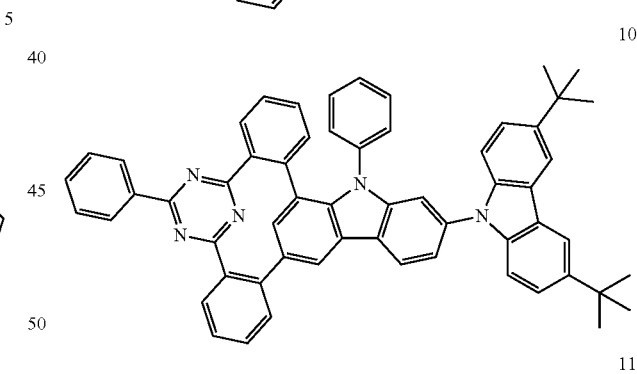
11
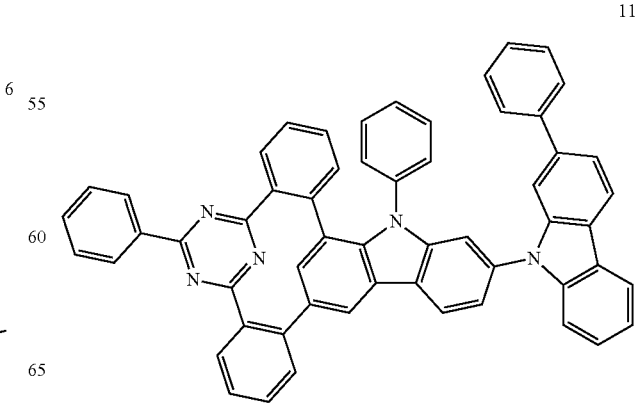

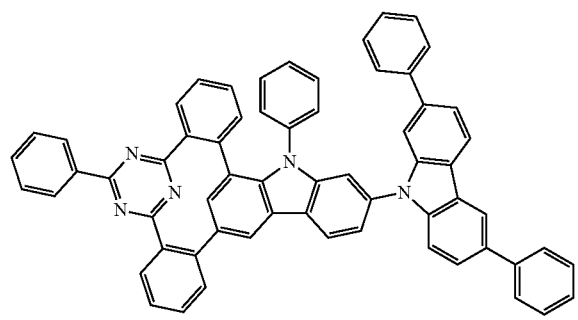
12
13
14
15
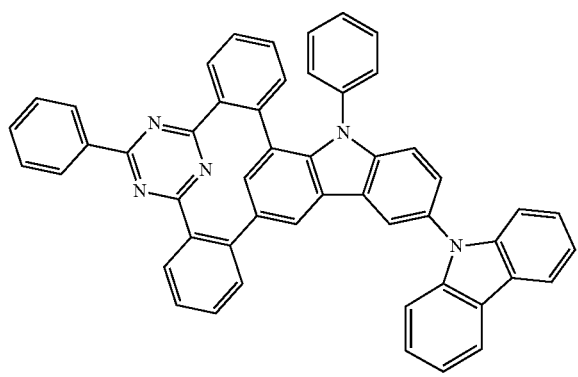
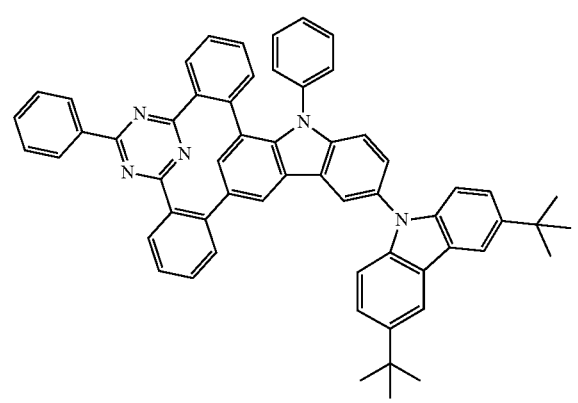
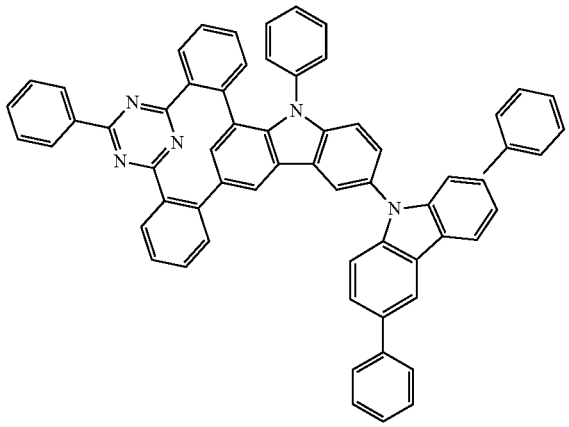
16
17
18
19

20
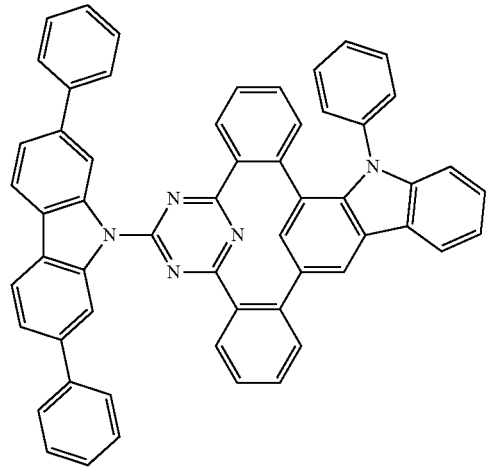
21
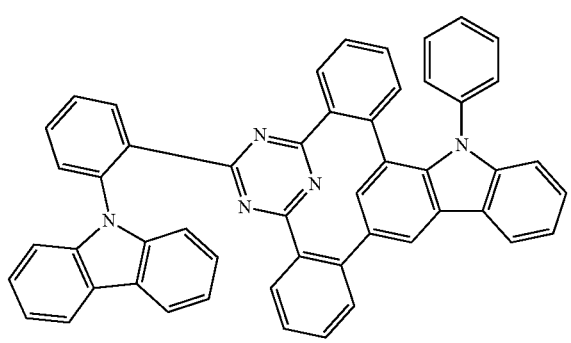
22
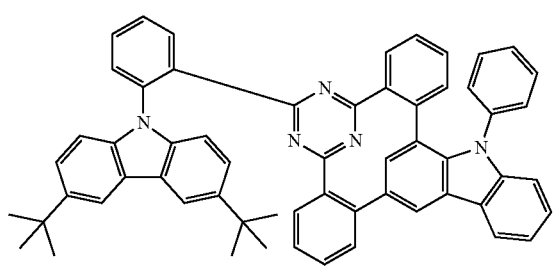
23
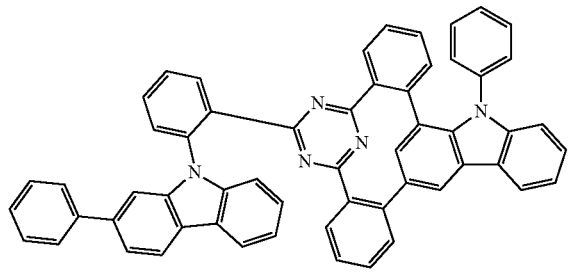
24
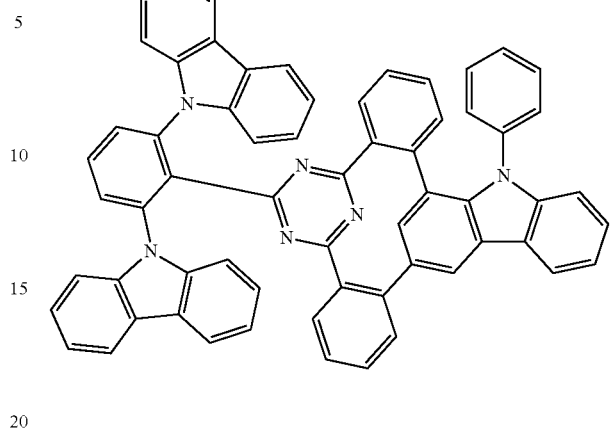
25
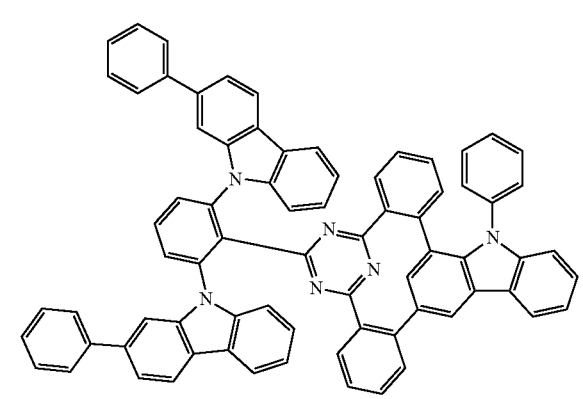
26
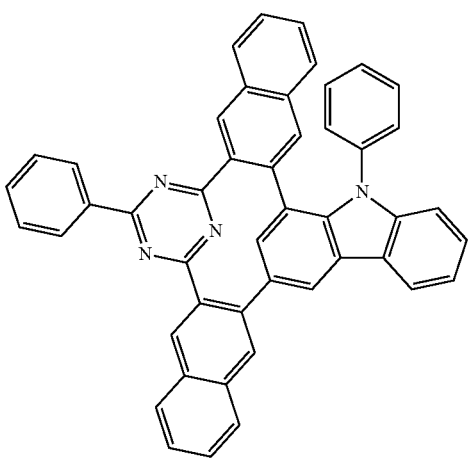

-continued
27
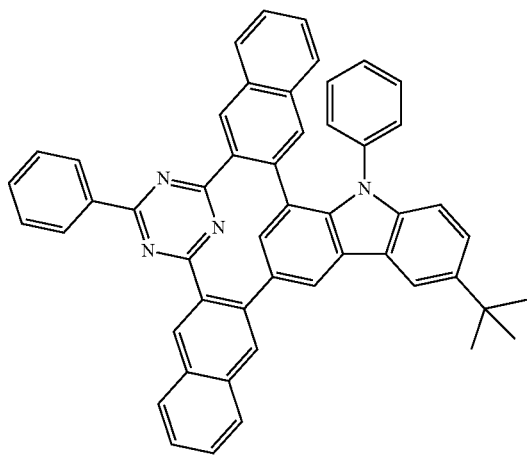
28
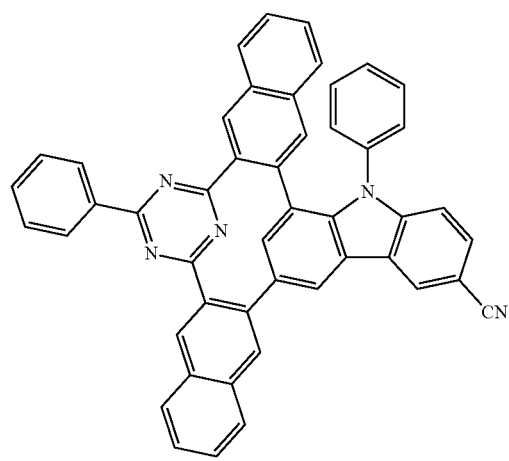
29
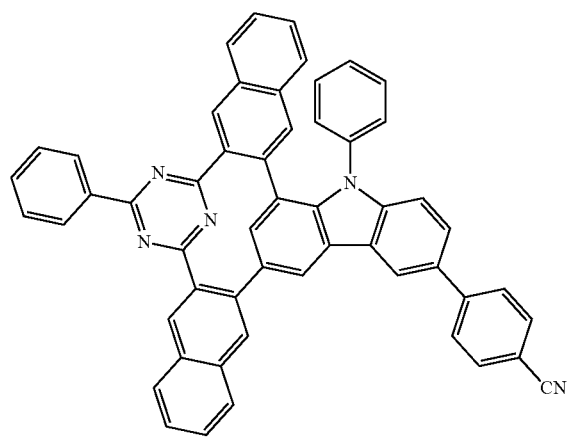
-continued
30
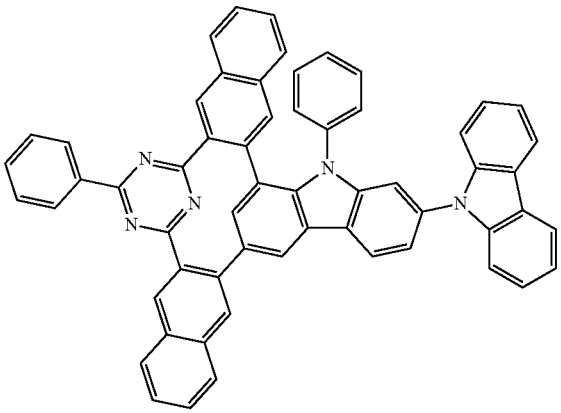
31
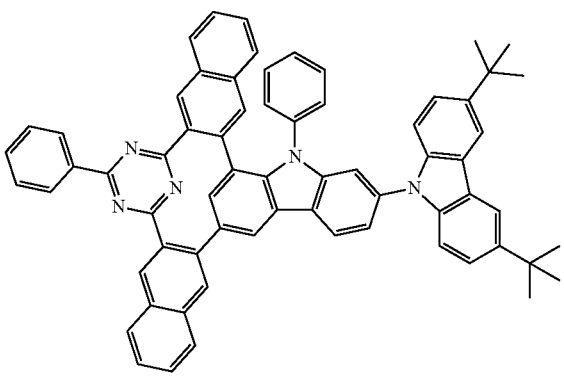
32
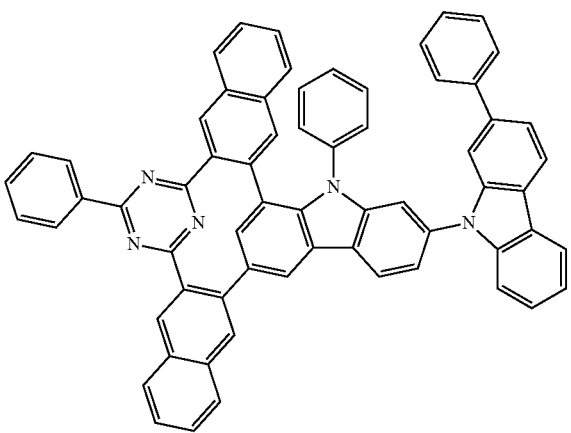

-continued
33
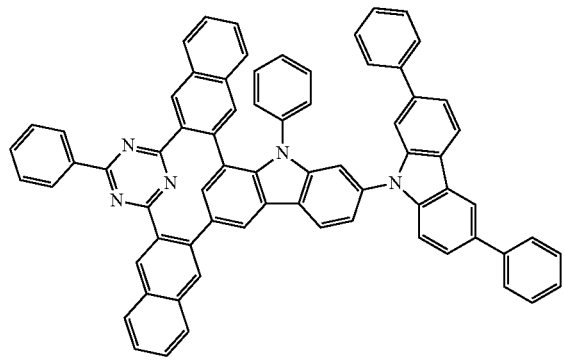
34
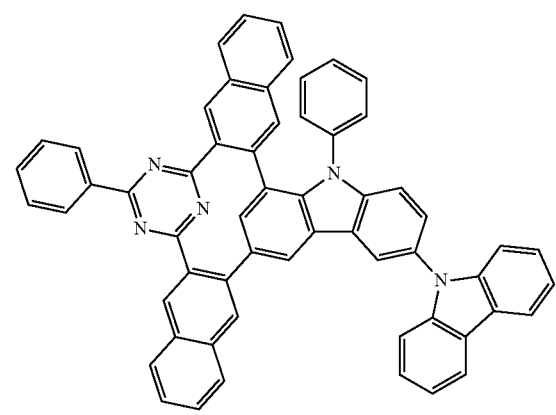
35
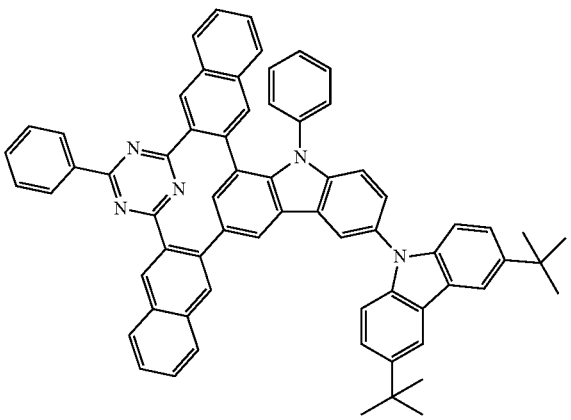
36
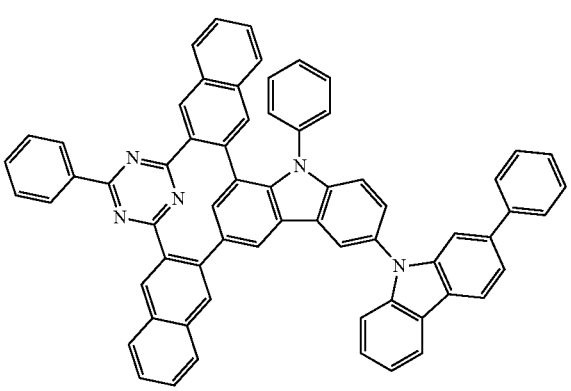
-continued
37
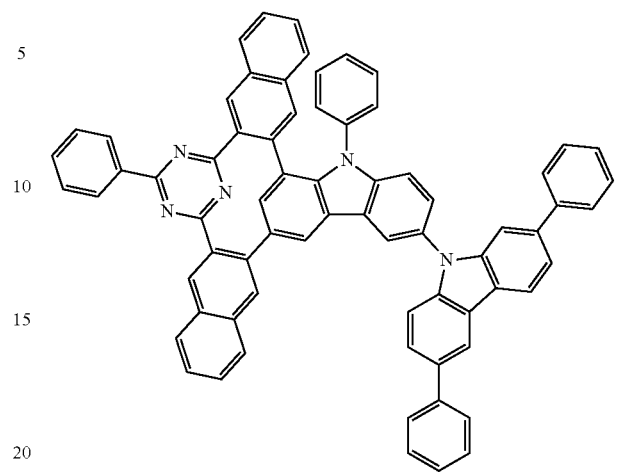
38
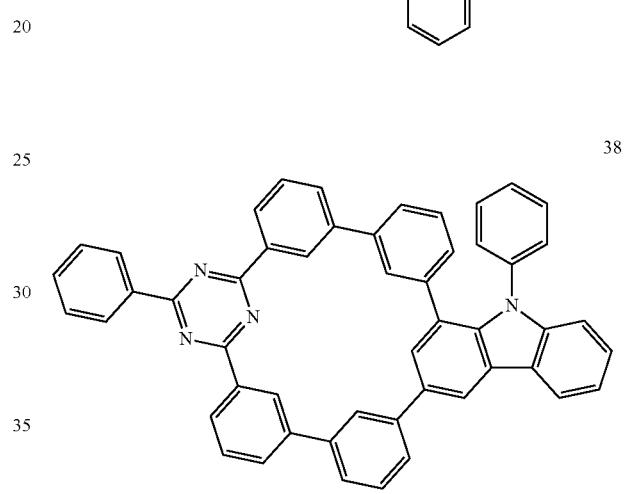
39
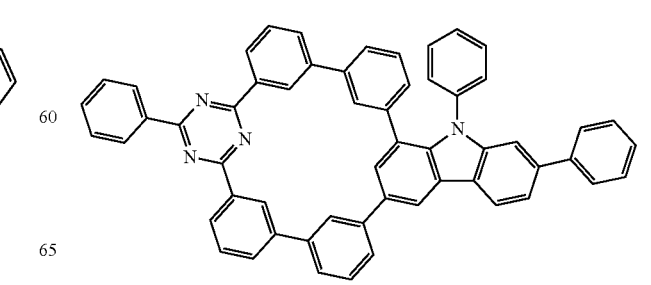
40

41
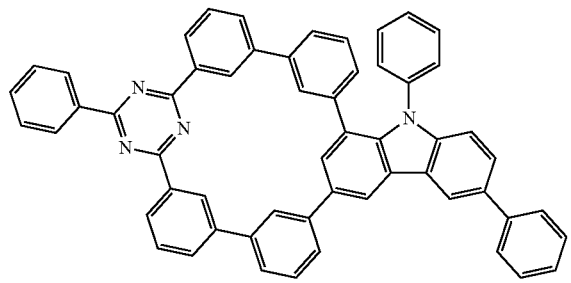
42
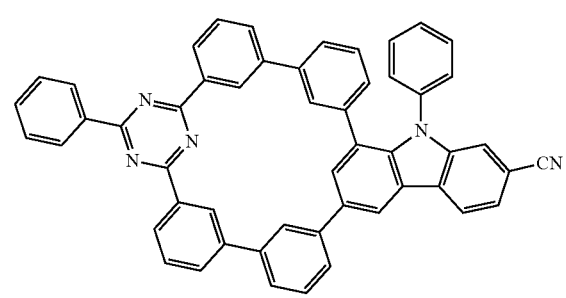
43
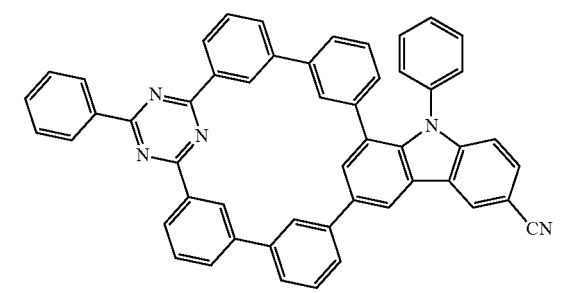
44
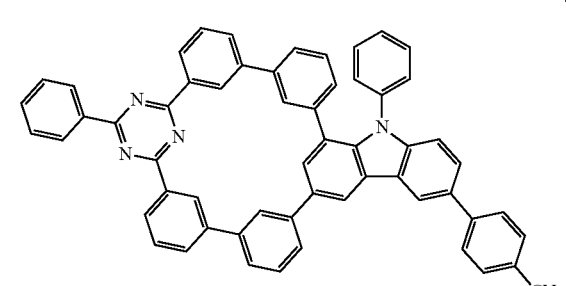
45
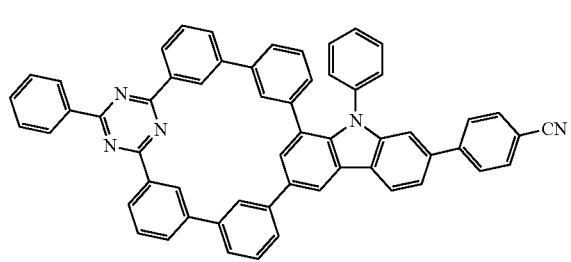
46
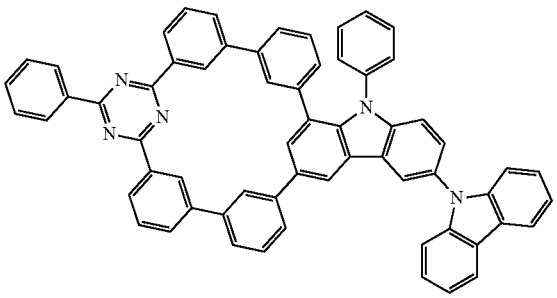
47
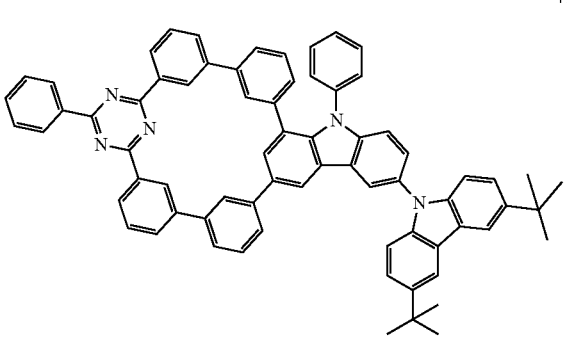
48
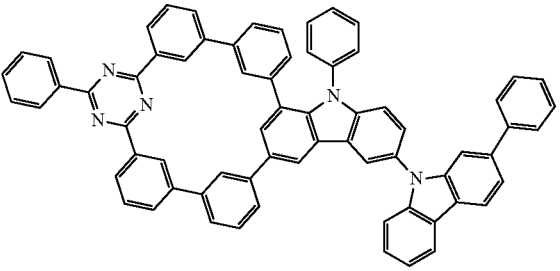
49
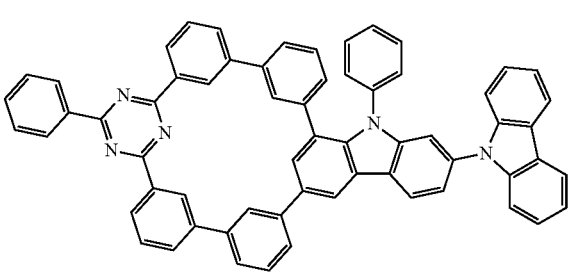
50
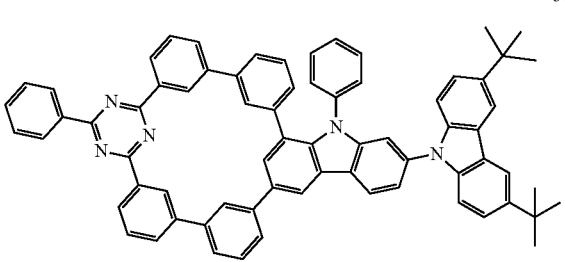

51
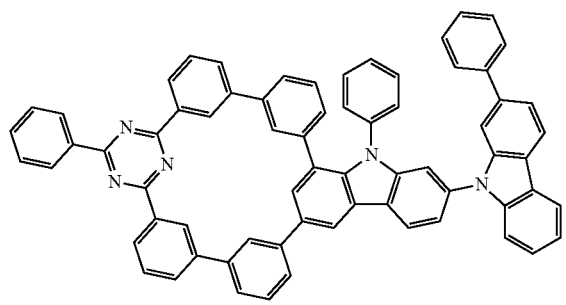
52
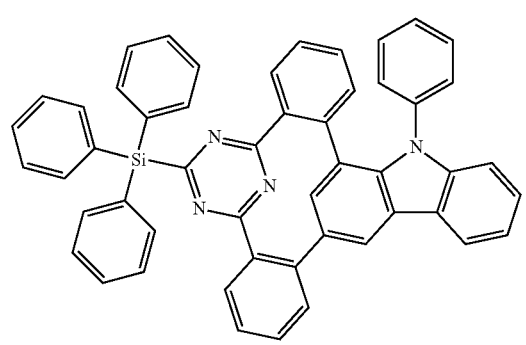
53
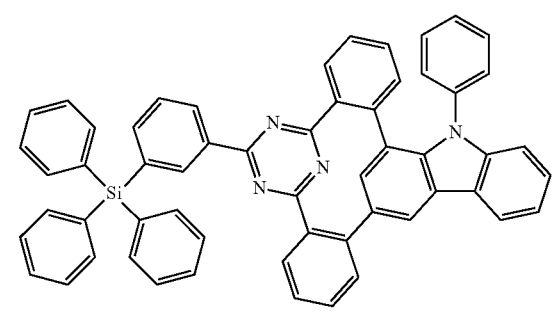
54
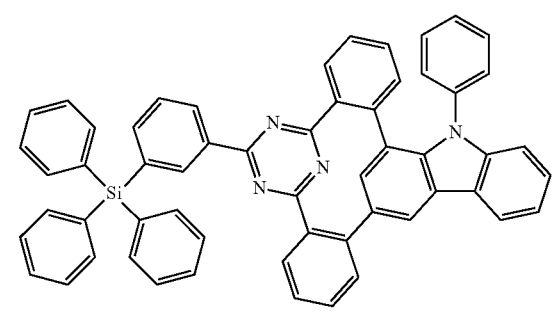
55
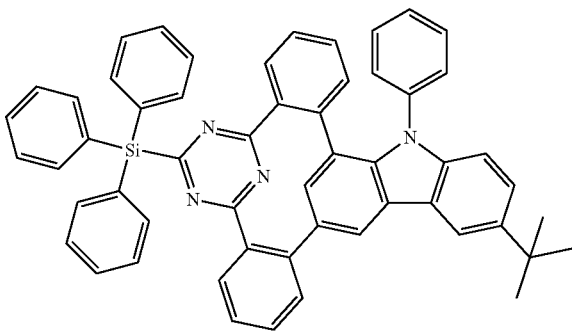
56
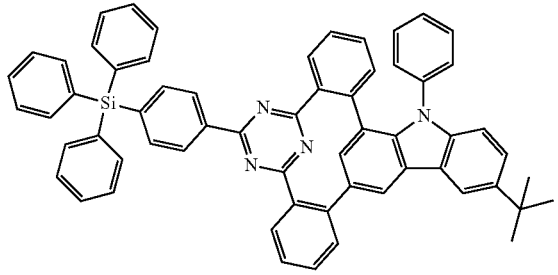
57
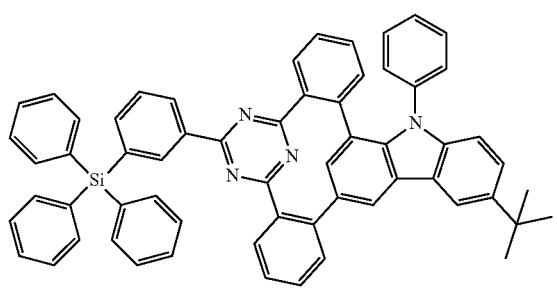
58
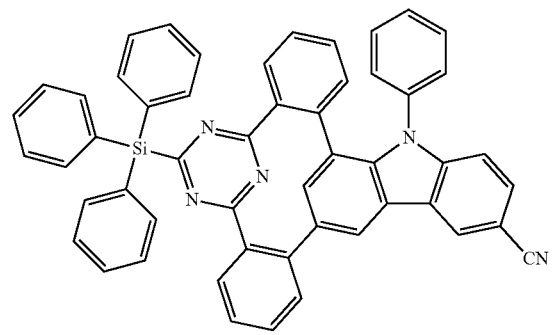
59
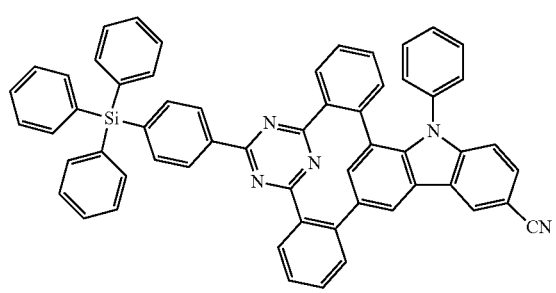

60
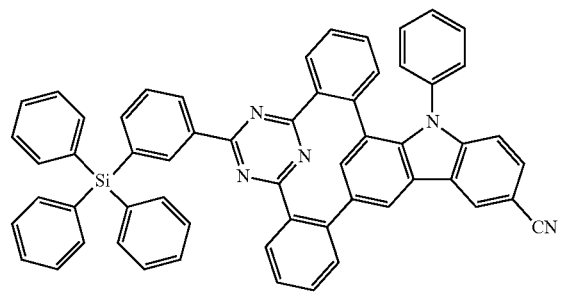
61
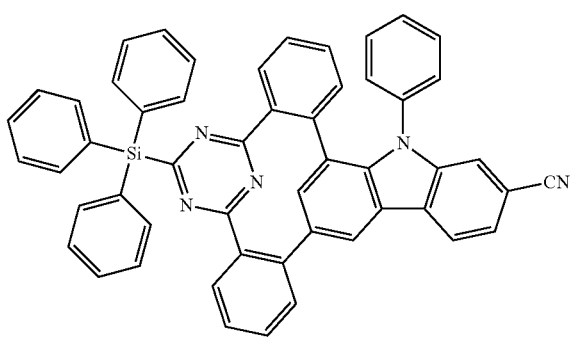
62
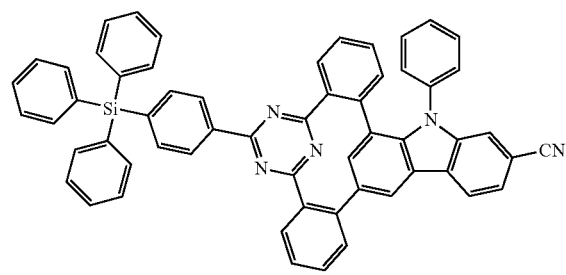
63
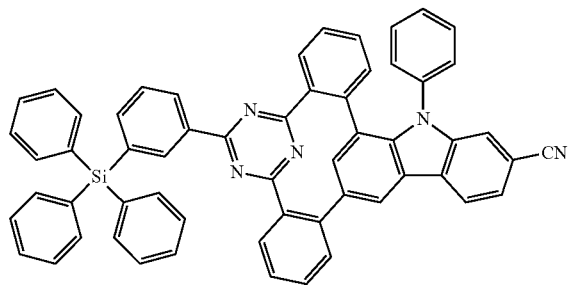
64
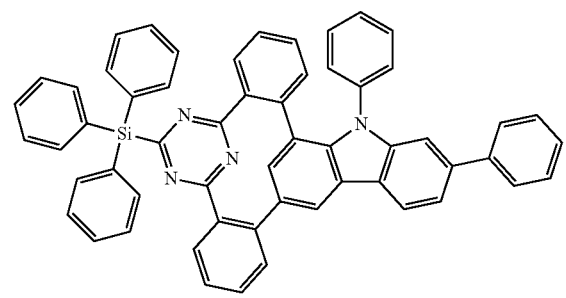
65
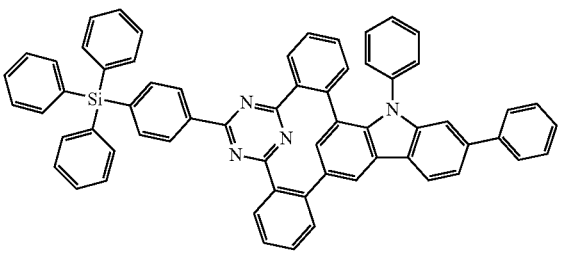
66
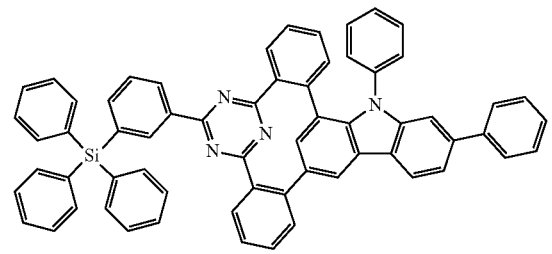
67
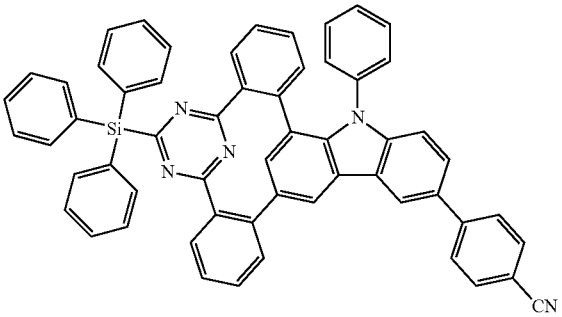
68
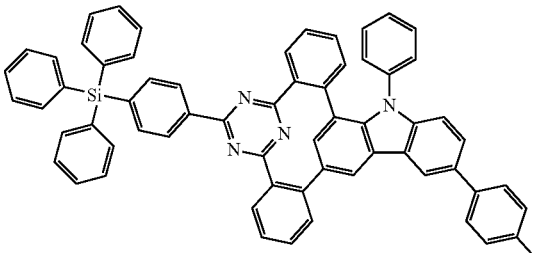
69
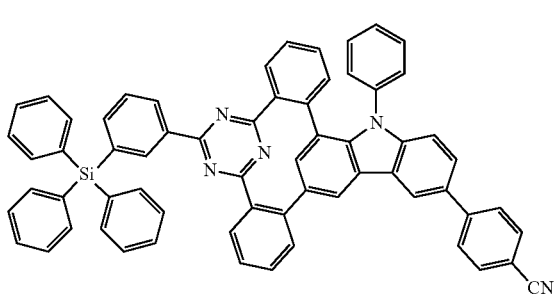

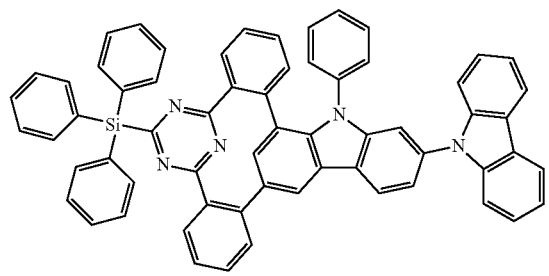
70
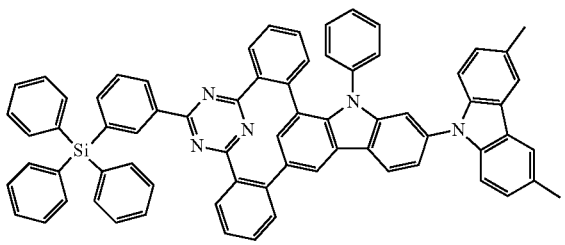
75
71
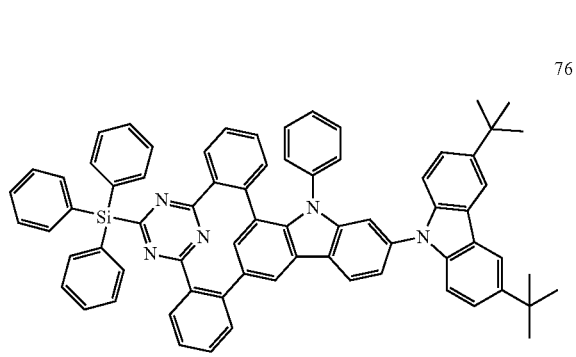
76
72
77
73
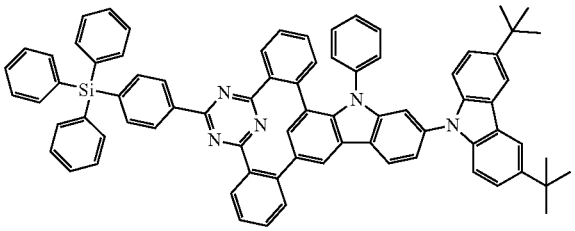
78
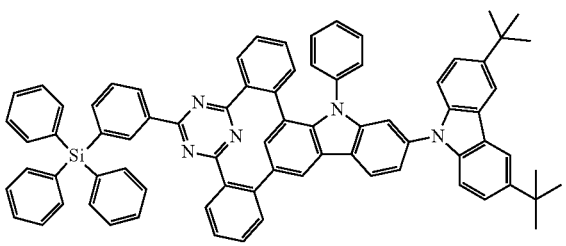
79
74
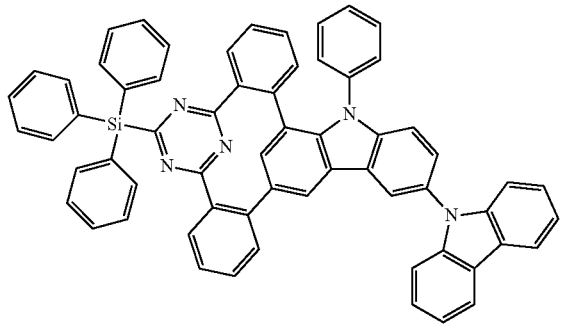

80
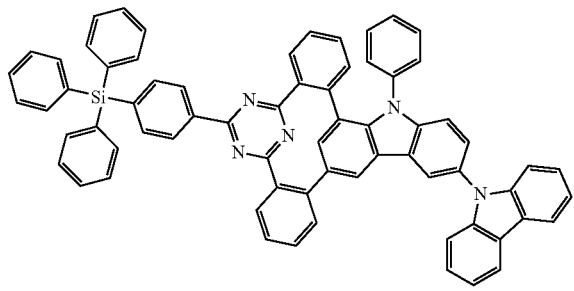
81
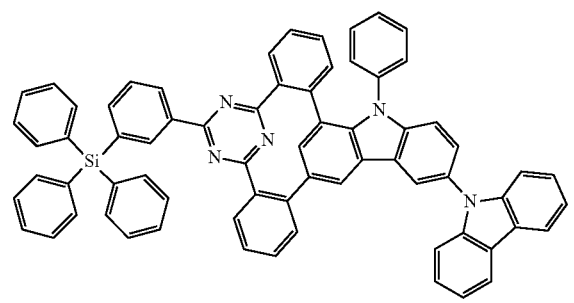
82
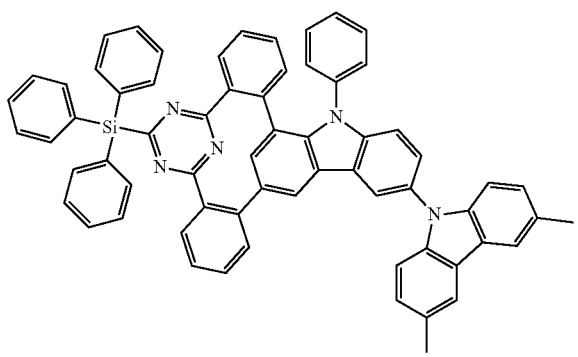
83
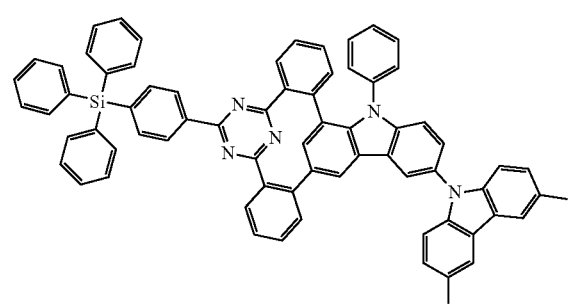
84
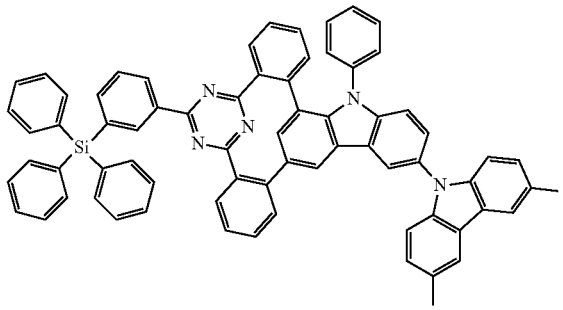
85
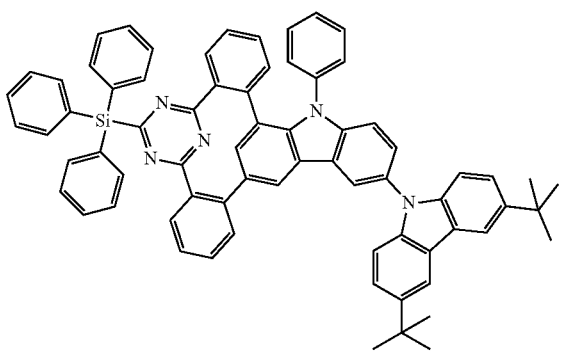
86
87
88
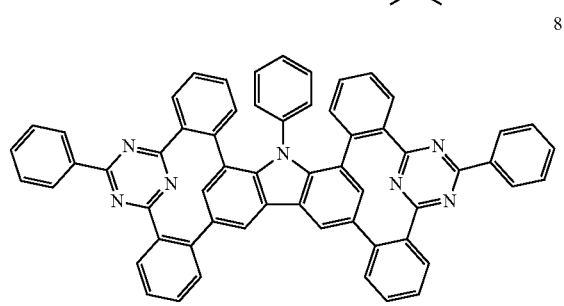

89

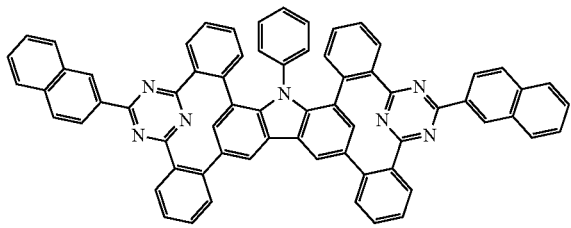

90

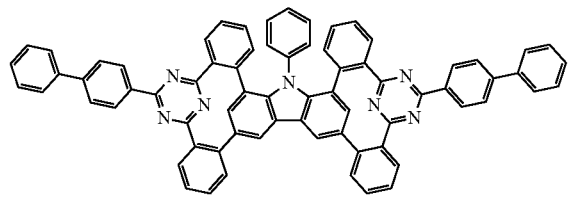

91

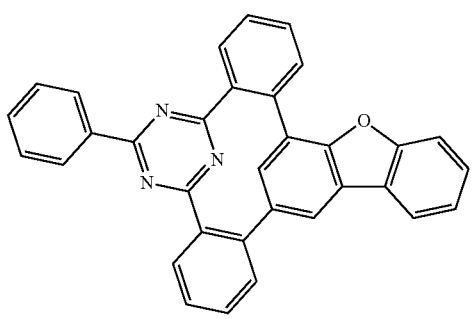

92

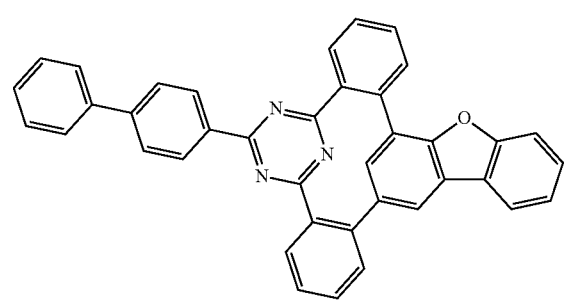

93

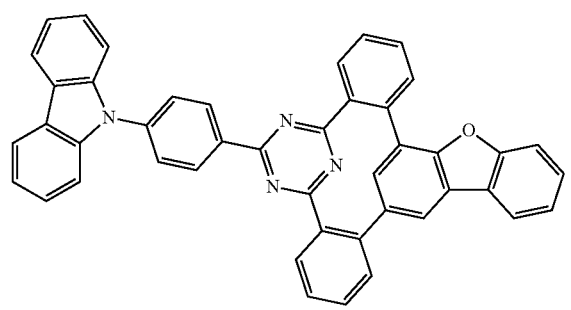

94

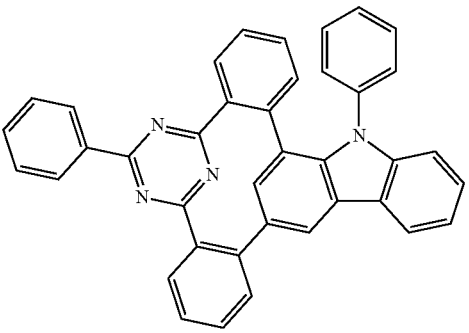

95

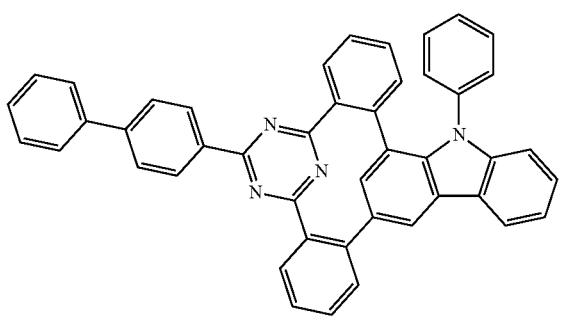

96

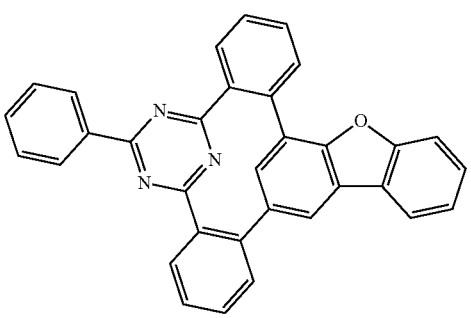

The above-described fused polycyclic compound of an embodiment includes a ring in which a dibenzoheterocyclic derivative and a monoheterocyclic derivative are connected and fixed via a linker and may have a relatively rigid compound structure and show a high glass transition temperature, thereby showing improved reliability. In addition, the fused polycyclic compound of an embodiment may show high amorphous properties. Meanwhile, due to a stabilized compound structure, if the fused polycyclic compound of an embodiment is used as a light-emitting material, the full width at half maximum (FWHM) of a wavelength region of light emitted may be reduced, and the organic electroluminescence device may show high color reproducibility. In addition, since the fused polycyclic compound of an embodiment has excellent electrical properties and high charge transport capacity, if used as a material for an organic electroluminescence device, the emission efficiency and device life of the organic electroluminescence device may be improved.

Referring to FIG. 1 to FIG. 3 again, when compared with FIG. 1, FIG. 2 shows the cross-sectional view of an organic electroluminescence device (10) of an embodiment, wherein a hole transport region (HTR) includes a hole injection layer (HIL) and a hole transport layer (HTL), and an electron transport region (ETR) includes an electron injection layer (EIL) and an electron transport layer (ETL). In addition, when compared with FIG. 1, FIG. 3 shows the cross-sectional view of an organic electroluminescence device (10) of an embodiment, wherein a hole transport region (HTR) includes a hole injection layer (HIL), a hole transport layer (HTL), and an electron blocking layer (EBL), and an electron transport region (ETR) includes an electron injection layer (EIL), an electron transport layer (ETL), and a hole blocking layer (HBL).

In the organic electroluminescence devices (10) of embodiments, shown in FIG. 1 to FIG. 3, the first electrode (EL1) has conductivity. The first electrode (EL1) may be formed using a metal alloy or a conductive compound. The first electrode (EL1) may be an anode. In addition, the first electrode (EL1) may be a pixel electrode. The first electrode (EL1) may be a transmissive electrode, a transflective electrode, or a reflective electrode. If the first electrode (EL1) is the transmissive electrode, the first electrode (EL1) may be formed using a transparent metal oxide including, for example, indium tin oxide (ITO), indium zinc oxide (IZO), zinc oxide (ZnO), indium tin zinc oxide (ITZO), etc. If the first electrode (EL1) is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, compound(s) thereof, or mixture(s) thereof (for example, a mixture of Ag and Mg). Also, the first electrode (EL1) may have a structure including a plurality of layers including a reflective layer or a transflective layer formed using the above materials, and a transmissive conductive layer formed using indium tin oxide (ITO), indium zinc oxide (IZO), zinc oxide (ZnO), indium tin zinc oxide (ITZO) etc. For example, the first electrode (EL1) may include a three-layer structure of ITO/Ag/ITO. However, an embodiment of the present invention is not limited thereto.

The thickness of the first electrode (EL1) may be from about 1000 Å to about 10000 Å, for example, from about 1000 Å to about 3000 Å.

The hole transport region (HTR) is provided on the first electrode (EL1). The hole transport region (HTR) may include at least one among a hole injection layer (HIL), a hole transport layer (HTL), a hole buffer layer and an electron blocking layer (EBL). The hole transport region (HTR) may have a single layer formed using a single material, a single layer formed using a plurality of different materials, or a multilayer structure including a plurality of layers formed using a plurality of different materials.

For example, the hole transport region (HTR) may have the structure of a single layer of a hole injection layer (HIL), or a hole transport layer (HTL), and may have a structure of a single layer formed using a hole injection material and a hole transport material. Alternatively, the hole transport region (HTR) may have a structure of a single layer formed using a plurality of different materials, or a structure stacked from the first electrode (EL1) of hole injection layer (HIL)/hole transport layer (HTL), hole injection layer (HIL)/hole transport layer (HTL)/hole buffer layer, hole injection layer (HIL)/hole buffer layer, hole transport layer (HTL)/hole buffer layer, or hole injection layer (HIL)/hole transport layer (HTL)/electron blocking layer (EBL), without limitation.

The hole transport region (HTR) may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region (HTR) may include the above-described fused polycyclic compound of an embodiment.

The hole transport region (HTR), if composed of a plurality of layers, may include the fused polycyclic compound of an embodiment in at least one layer among the plurality of layers.

Meanwhile, if the hole transport region (HTR) includes the hole injection layer (HIL), the hole injection layer (HIL) may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino) triphenylamine (TDATA), 4,4',4"-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PAN I/PSS), N,N'-di(1-naphthalene-1-yl)-N,N'-diphenyl-benzidine (NPB), N,N'-di(1-naphthyl)-N,N"-diphenyl-(1,1"-biphenyl)-4,4"-diamine (α-NPD), triphenylamine-containing polyetherketone (TPAPEK), 4-isopropyl-4'-methyldiphenyliodonium [tetrakis(pentafluorophenyl)borate], dipyrazino [2,3-f: 2',3'-h]quinoxaline-2,3,6,7,10,11-hexacarbonitrile (HAT-CN), etc.

If the hole transport region (HTR) includes the hole transport layer (HTL), the hole transport layer (HTL) may include, for example, carbazole derivatives (such as N-phenyl carbazole and polyvinyl carbazole), fluorine-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di(1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl) amino]-3,3'-dimethylbiphenyl (HMTPD), 1,3-bis(N-carbazolyl)benzene (mCP), 9-(4-tert-butylphenyl)-3,6-bis (triphenylsilyl)-9H-carbazole (CzSi), etc.

The thickness of the hole transport region (HTR) may be from about 100 Å to about 10000 Å, for example, from about 100 Å to about 5000 Å. The thickness of the hole injection layer (HIL) may be, for example, from about 30 Å to about 1000 Å, and the thickness of the hole transport layer (HTL) may be from about 30 Å to about 1000 Å. For example, the thickness of the electron blocking layer (EBL) may be from about 10 Å to about 1000 Å. If the thicknesses of the hole transport region (HTR), the hole injection layer (HIL), the hole transport layer (HTL) and the electron blocking layer (EBL) satisfy the above-described ranges, satisfactory degree of hole transport properties may be achieved without substantial increase of a driving voltage.

The hole transport region (HTR) may further include a charge generating material, in addition to the above-described materials, to increase conductivity. The charge generating material may be dispersed uniformly or non-uniformly in the hole transport region (HTR). The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ) and 2,3,5,6-tetrafluoro-7,7,8,8-tetracyanoquinodimethane (F4-TCNQ), metal oxides such as tungsten oxide and molybdenum oxide, etc., without limitation.

As described above, the hole transport region (HTR) may further include at least one among a hole butter layer and an electron blocking layer, in addition to the hole injection layer (HIL) and the hole transport layer (HTL). The hole buffer layer may compensate an optical resonance distance according to the wavelength of light emitted from an emission layer (EML) and may increase light emission efficiency. Materials which may be included in a hole transport region (HTR) may be used as materials included in the hole buffer layer. The electron blocking layer is a layer playing the role of preventing the electron injection from the electron transport region (ETR) to the hole transport region (HTR).

The emission layer (EML) is provided on the hole transport region (HTR). The emission layer (EML) may have a thickness of, for example, about 100 Å to about 1000 Å or about 100 Å to about 300 Å. The emission layer (EML) may have a single layer formed using a single material, a single layer formed using a plurality of different materials, or a multilayer structure having a plurality of layers formed using a plurality of different materials.

In the organic electroluminescence device (10) of an embodiment, the emission layer (EML) may include the above-described fused polycyclic compound of an embodiment. That is, in the organic electroluminescence device (10) of an embodiment, the emission layer (EML) may include a fused polycyclic compound forming a ring by connecting a dibenzoheterocyclic derivative with a monoheterocyclic derivative containing at least one nitrogen atom as a ring-forming atom via a linker.

The fused polycyclic compound included in the emission layer (EML) of the organic electroluminescence device (10) of an embodiment may be represented by Formula 1 below.

Formula 1

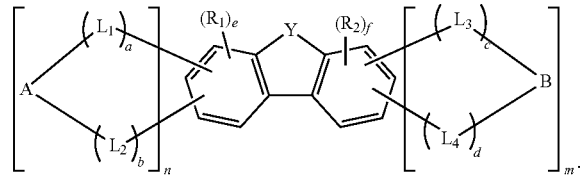

In Formula 1 above, Y is $NR_3$, O, or S, and $R_1$ to $R_3$ may be each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms.

In Formula 1, n and m may be each independently 0 or 1, where at least one among n and m is 1, and $L_1$ to $L_4$ may be each independently a substituted or unsubstituted arylene group of 6 to 30 ring-forming carbon atoms, a to d may be each independently an integer of 1 to 3, and e and f may be each independently an integer of 0 to 4.

In Formula 1, A and B may be each independently represented by Formula 2 below.

Formula 2

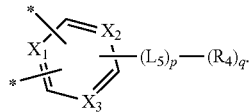

In Formula 2 above, $X_1$ to $X_3$ may be each independently N or $CR_5$, where at least one among $X_1$ to $X_3$ is N, p is 0 or 1, q is an integer of 0 to 5, and a case where p and q are 0 at the same time may be excluded.

In Formula 2, $L_5$ is a substituted or unsubstituted arylene group of 6 to 30 carbon atoms or a substituted or unsubstituted heteroarylene group of 2 to 30 carbon atoms, and $R_4$ and $R_5$ may be each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms.

Meanwhile, the same explanation on the above-described fused polycyclic compound of an embodiment may be applied to the fused polycyclic compound included in the emission layer (EML). In the organic electroluminescence device (10) of an embodiment, the emission layer (EML) may include at least one of the fused polycyclic compounds represented in Compound Group 1 above.

In the organic electroluminescence device (10) of an embodiment, the emission layer (EML) may emit delayed fluorescence. For example, the emission layer (EML) may emit thermally activated delayed fluorescence (TADF).

The emission layer (EML) of the organic electroluminescence device (10) may emit blue light. For example, the emission layer (EML) of the organic electroluminescence device (10) of an embodiment may emit blue light in a region of 480 nm or less. However, an embodiment of the present invention is not limited thereto, and the emission layer (EML) may emit red light or green light.

Meanwhile, though not shown in the drawings, the organic electroluminescence device of an embodiment may include a plurality of emission layers. The plurality of emission layers may be stacked one by one and provided. For example, an organic electroluminescence device including a plurality of emission layers may emit white light. The organic electroluminescence device including the plurality of emission layers may be an organic electroluminescence device having a tandem structure.

In the organic electroluminescence device (10) of an embodiment, the emission layer (EML) includes a host and a dopant, and may include the above-described fused polycyclic compound as a dopant. For example, in the organic electroluminescence device (10) of an embodiment, the emission layer (EML) may include a host for emitting delayed fluorescence and a dopant for emitting delayed fluorescence, and may include the above-described fused polycyclic compound as a dopant for emitting delayed fluorescence. The emission layer (EML) may include at least one among the fused polycyclic compounds represented in Compound Group 1 as a thermally activated delayed fluorescence dopant.

In an embodiment, the emission layer (EML) may be a thermally activated delayed fluorescence emission layer, and the emission layer (EML) may include a known host material and the above-described fused polycyclic compound. For example, in an embodiment, the fused polycyclic compound may be used as a TADF dopant.

Meanwhile, in an embodiment, the emission layer (EML) may include a known host material. For example, in an embodiment, the emission layer (EML) may include, as a host material, tris(8-hydroxyquinolino)aluminum ($Alq_3$), 4,4'-bis(N-carbazolyl)-1,1'-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2"-dimethyl-biphenyl (CDBP), 2-methyl-9,10-bis(naphthalen-2-yl)anthracene (MADN), bis[2-(diphenylphosphino)phenyl] ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), 3,3'-bis(N-carbazolyl)-1,1'-biphenyl (mCBP), 1,3-bis(N-carbazolyl)benzene (mCP), etc. However, an embodiment of the present invention is not limited thereto. Any known host materials for emitting delayed fluorescence other than the suggested host materials may be included.

Meanwhile, in the organic electroluminescence device (10) of an embodiment, the emission layer (EML) may further include a known dopant material. In an embodiment, the emission layer (EML) may include, as a dopant, styryl derivatives (for example, 1,4-bis[2-(3-N-ethylcarbazoryl)vinyl]benzene (BCzVB), 4-(di-p-tolylam ino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

In the organic electroluminescence devices (10) of embodiments, as shown in FIGS. 1 to 3, the electron transport region (ETR) is provided on the emission layer (EML). The electron transport region (ETR) may include at least one of an hole blocking layer (HBL), an electron transport layer (ETL) or an electron injection layer (EIL). However, an embodiment of the present invention is not limited thereto.

The electron transport region (ETR) may have a single layer formed using a single material, a single layer formed using a plurality of different materials, or a multilayer structure having a plurality of layers formed using a plurality of different materials.

For example, the electron transport region (ETR) may have a single layer structure of an electron injection layer (EIL) or an electron transport layer (ETL), or a single layer structure formed using an electron injection material and an electron transport material. Further, the electron transport region (ETR) may have a single layer structure having a plurality of different materials, or a structure stacked from the emission layer (EML) of electron transport layer (ETL)/electron injection layer (EIL), or hole blocking layer (HBL)/electron transport layer (ETL)/electron injection layer (EIL), without limitation. The thickness of the electron transport region (ETR) may be, for example, from about 1000 Å to about 1500 Å.

The electron transport region (ETR) may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region (ETR) may include the above-described fused polycyclic compound of an embodiment. If the electron transport region (ETR) is composed of a plurality of layers, the fused polycyclic compound of an embodiment may be included in at least one layer among the plurality of layers.

If the electron transport region (ETR) includes an electron transport layer (ETL), the electron transport region (ETR) may include an anthracene-based compound. The electron transport region may include, for example, tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq$_2$), 9,10-di(naphthalene-2-yl)anthracene (ADN), or mixture(s) thereof, without limitation. The thickness of the electron transport layer (ETL) may be from about 100 Å to about 1000 Å and may be, for example, from about 150 Å to about 500 Å. If the thickness of the electron transport layer (ETL) satisfies the above-described ranges, satisfactory degree of electron transport properties may be obtained without substantial increase of a driving voltage.

If the electron transport region (ETR) includes the electron injection layer (EIL), the electron transport region (ETR) may include LiF, lithium quinolate (LiQ), Li$_2$O, BaO, NaCl, CsF, a metal in lanthanoides such as Yb, or a metal halide such as RbCl and RbI. However, an embodiment of the present invention is not limited thereto. The electron injection layer (EIL) also may be formed using a mixture material of an electron transport material and an insulating organo metal salt. The organo metal salt may be a material having an energy band gap of about 4 eV or more. Particularly, the organo metal salt may include, for example, metal acetate(s), metal benzoate(s), metal acetoacetate(s), metal acetylacetonate(s), or metal stearate(s). The thickness of the electron injection layer (EIL) may be from about 1 Å to about 100 Å, and from about 3 Å to about 90 Å. If the thickness of the electron injection layer (EIL) satisfies the above-described ranges, satisfactory degree of electron injection properties may be obtained without inducing substantial increase of a driving voltage.

As described above, the electron transport region (ETR) may include a hole blocking layer (HBL). The hole blocking layer (HBL) may include, for example, at least one among 2,9-dimethyl-4,7-diphenyl-1,10-phenanthroline (BCP), and 4,7-diphenyl-1,10-phenanthroline (Bphen). However, an embodiment of the present invention is not limited thereto.

The second electrode (EL2) is provided on the electron transport region (ETR). The second electrode (EL2) may be a common electrode or a cathode. The second electrode (EL2) may be a transmissive electrode, a transflective electrode or a reflective electrode. If the second electrode (EL2) is the transmissive electrode, the second electrode (EL2) may be formed of a transparent metal oxide, for example, indium tin oxide (ITO), indium zinc oxide (IZO), zinc oxide (ZnO), indium tin zinc oxide (ITZO), etc.

If the second electrode (EL2) is the transflective electrode or the reflective electrode, the second electrode (EL2) may include Ag, Mg, Cu, Al, Pt, Pd, Au, Ni, Nd, Ir, Cr, Li, Ca, LiF/Ca, LiF/Al, Mo, Ti, compound(s) thereof, or mixture(s) thereof (for example, a mixture of Ag and Mg). Otherwise, the second electrode (EL2) may have a multilayered structure, including a reflective layer or a transflective layer formed using the above-described materials, and a transparent conductive layer formed using indium tin oxide (ITO), indium zinc oxide (IZO), zinc oxide (ZnO), indium tin zinc oxide (ITZO), etc.

Though not shown, the second electrode (EL2) may be connected with an auxiliary electrode. If the second electrode (EL2) is connected with the auxiliary electrode, the resistance of the second electrode (EL2) may be reduced.

Meanwhile, though not shown, on the second electrode (EL2) of the organic electroluminescence device (10) of an embodiment, a capping layer (not shown) may be further disposed. The capping layer (not shown) may include, for example, α-NPD, NPB, TPD, m-MTDATA, Alq3, CuPc, N4,N4,N4',N4'-tetra(biphenyl-4-yl) biphenyl-4,4'-diamine (TPD15), 4,4',4''-tris(carbazol sol-9-yl) triphenylamine (TCTA), N,N'-bis(naphthalene-1-yl), etc.

The fused polycyclic compound of an embodiment may be included as a material for an organic electroluminescence device (10). For example, the organic electroluminescence device (10) according to an embodiment of the present invention may include the fused polycyclic compound in at least one organic layer disposed between the first electrode (EL1) and the second electrode (EL2), or an organic layer disposed on the second electrode (EL2).

In the organic electroluminescence device (10), according to the application of voltages to the first electrode (EL1) and the second electrode (EL2), respectively, holes injected from the first electrode (EL1) move via the hole transport region (HTR) to the emission layer (EML), and electrons injected from the second electrode (EL2) move via the electron transport region (ETR) to the emission layer (EML). The electrons and the holes recombine in the emission layer (EML) to produce excitons, and light is emitted while the excitons fall from excited states to a ground state.

The organic electroluminescence device (10) according to an embodiment of the present invention includes the fused polycyclic compound in at least one organic layer disposed between the first electrode (EL1) and the second electrode (EL2), and may show excellent emission efficiency and long life characteristics. Particularly, the organic electroluminescence device (10) according to an embodiment includes the fused polycyclic compound in an emission layer (EML), and may show excellent color reproducibility and improved reliability. In addition, the organic electroluminescence device (10) according to an embodiment includes the fused polycyclic compound in an emission layer (EML), and the emission layer (EML) emits thermally activated delayed fluorescence, thereby showing high emission efficiency, improved life characteristics, and narrow full width at half maximum characteristics in a light-emitting wavelength region.

Hereinafter, the fused polycyclic compound according to an embodiment and the organic electroluminescence device of an embodiment of the present invention will be particularly explained referring to embodiments and comparative embodiments. In addition, the following embodiments are only illustrations to assist the understanding of the present invention, and the scope of the present invention is not limited thereto.

Examples

1. Synthesis of Fused Polycyclic Compounds

First, the synthetic method of the fused polycyclic compound according to this embodiment will be particularly explained referring to the synthetic methods of Compounds 1, 13, 18, 43, 56, 59, and 83. In addition, the synthetic methods of the fused polycyclic compounds explained below are only embodiments, and the synthetic method of the fused polycyclic compound according to an embodiment of the present invention is not limited thereto.

(1) Synthesis of Compound 1

Fused Polycyclic Compound 1 according to an embodiment may be synthesized, for example, by Reaction 1 below.

Reaction 1

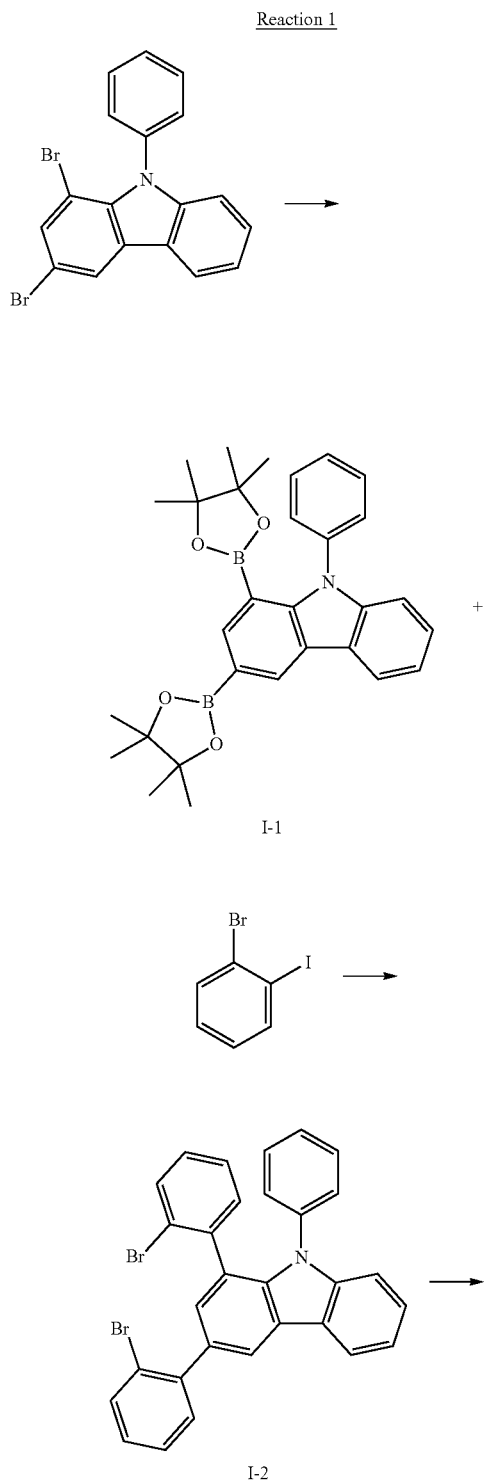

-continued

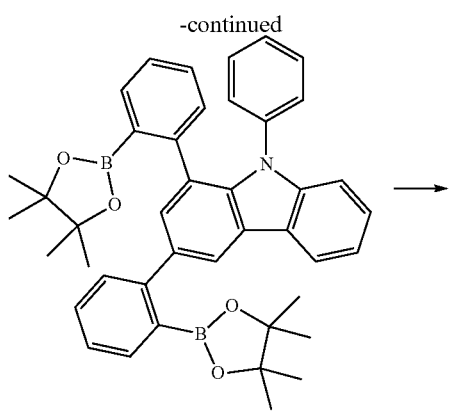

I-3

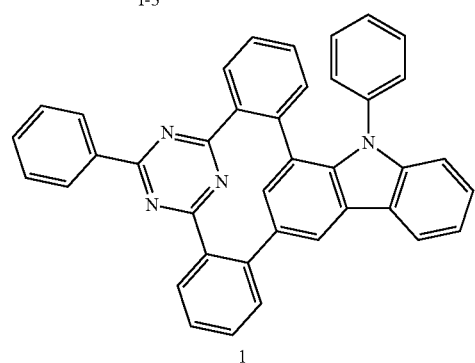

1

Synthesis of Intermediate I-1

3.99 g (10 mmol) of 1,3-dibromo-9-phenyl-9H-carbazole was dissolved in 50 mL of THF, and 8 mL of nBuLi (2.5 M in hexane) was added thereto at −78° C. After one hour, 4.0 mL (20 mmol) of 2-isopropoxy-4,4,5,5-tetramethyl-1,3,2-dioxaborolane was added at the same temperature. After stirring at room temperature for 5 hours, water was added, and the resultant product was washed with diethyl ether (30 mL) three times. A washed diethyl ether layer was dried with MgSO$_4$ and dried under a reduced pressure to obtain a product, and the product was separated by silica gel column chromatography to obtain 3.81 g (yield 77%) of Intermediate I-1. The compound thus produced was identified through LC-MS. ($C_{30}H_{35}B_2NO_4$: M+1 495.3)

Synthesis of Intermediate I-2

4.95 g (10.0 mmol) of Intermediate I-1, 5.64 g (20.0 mmol) of 1-bromo-2-iodobenzene, 0.58 g (0.50 mmol) of Pd(PPh$_3$)$_4$, 0.16 g (0.5 mmol) of tetrabutylammonium bromide (TBAB) and 3.18 g (30.0 mmol) of Na$_2$CO$_3$ were dissolved in 60 mL of a mixture solution of toluene/ethanol/H$_2$O (3/3/1), followed by stirring at 80° C. for 16 hours. After cooling to room temperature, the reaction solution was extracted with 60 mL of water and 60 mL of diethyl ether three times. An organic layer obtained therefrom was dried with magnesium sulfate, and a residue obtained by vaporizing solvents was separated by silica gel column chromatography to obtain 3.69 g (yield 67%) of Intermediate I-2. The compound thus produced was identified through LC-MS. ($C_{30}H_{19}Br_2N$: M+1 551.0)

Synthesis of Intermediate I-3

5.51 g (10 mmol) of Intermediate I-2 was dissolved in 50 mL of THF, and 8 mL of nBuLi (2.5 M in hexane) was added thereto at −78° C. After one hour, 4.0 mL (20 mmol) of 2-isopropoxy-4,4,5,5-tetramethyl-1,3,2-dioxaborolane was added at the same temperature. After stirring at room temperature for 5 hours, water was added, and the resultant product was washed with diethyl ether (30 mL) three times. A washed diethyl ether layer was dried with MgSO$_4$ and dried under a reduced pressure to obtain a product, and the product was separated by silica gel column chromatography to obtain 4.66 g (yield 72%) of Intermediate I-3. The compound thus produced was identified through LC-MS. ($C_{42}H_{43}B_2NO_4$: M+1 647.3)

Synthesis of Compound 1

6.47 g (10 mmol) of Intermediate I-3, 1.12 g (5 mmol) of 2,4-dichloro-6-phenyl-1,3,5-triazine, 0.58 g (0.5 mmol) of Pd(PPh$_3$)$_4$ and 4.14 g (30 mmol) of K$_2$CO$_3$ were dissolved in 60 mL of a mixture solution of THF/H$_2$O (2/1, volume ratio), followed by stirring at 80° C. for 16 hours. After cooling the reaction solution to room temperature, 40 mL of water was added, and extraction was performed with 50 mL of diethyl ether three times. A collected organic layer was dried with magnesium sulfate, and a residue obtained by vaporizing solvents was separated by silica gel column chromatography to obtain 3.56 g (yield 65%) of Compound 1. The compound thus produced was identified through LC-MS. ($C_{39}H_{24}N_4$: M+1 548.2)

(2) Synthesis of Compound 13

Fused Polycyclic Compound 13 according to an embodiment may be synthesized, for example, by Reaction 2 below.

Reaction 2

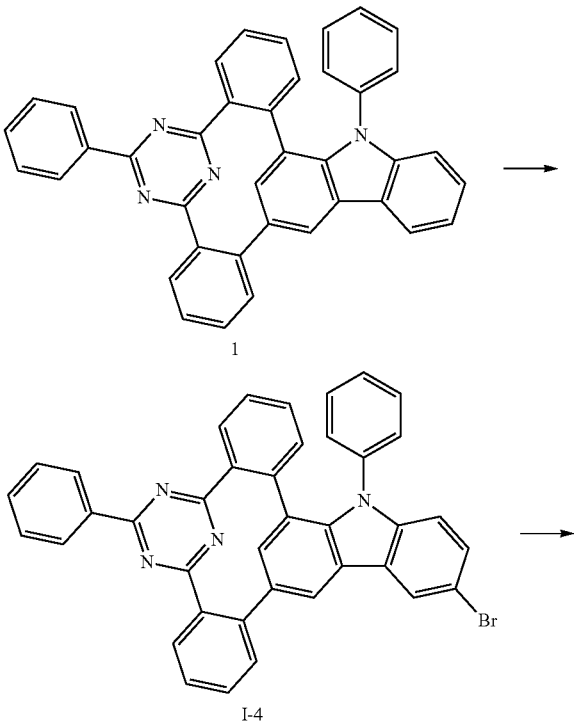

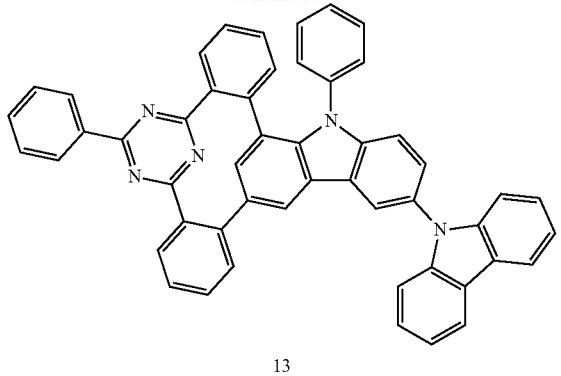

13

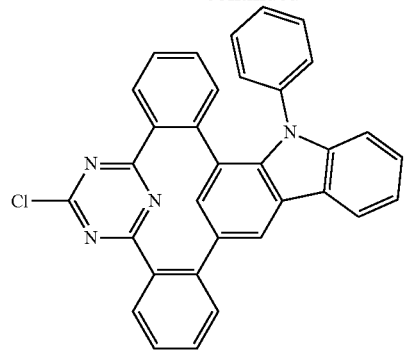

I-5

Synthesis of Intermediate I-4

5.48 g (10 mmol) of Compound 1 was completely dissolved in 80 mL of DMF, and 1.77 g (10 mmol) of N-bromosuccinimide was added thereto, followed by stirring at 130° C. for 12 hours. 60 mL of water was added to the reaction solution, the resultant product was filtered, and the residue thus obtained was extracted with 50 mL of $CH_2Cl_2$ three times. A collected organic layer was dried with magnesium sulfate, solvents were vaporized, and the resultant product was recrystallized with methanol to obtain 5.32 g (yield 85%) of Intermediate I-4. The compound thus produced was identified through LC-MS. ($C_{39}H_{23}BrN_4$: M+1 626.2)

Synthesis of Compound 13

6.26 g (10 mmol) of Intermediate I-4, 1.67 g (10 mmol) of 9H-carbazole, 0.10 g (0.5 mmol) of CuI and 2.76 g (20 mmol) of $K_2CO_3$ were dissolved in 60 mL of 1,2-dichlorobenzene, followed by stirring at 180° C. for 16 hours. After cooling the reaction solution to room temperature, 40 mL of water was added, and extraction was performed with 50 mL of $CH_2Cl_2$ three times. A collected organic layer was dried with magnesium sulfate, and a residue obtained by vaporizing solvents was separated by silica gel column chromatography to obtain 5.13 g (yield 72%) of Compound 13. The compound thus produced was identified through LC-MS. ($C_{51}H_{31}N_5$: M+1 713.2)

(3) Synthesis of Compound 18

Fused Polycyclic Compound 18 according to an embodiment may be synthesized, for example, by Reaction 3 below.

Reaction 3

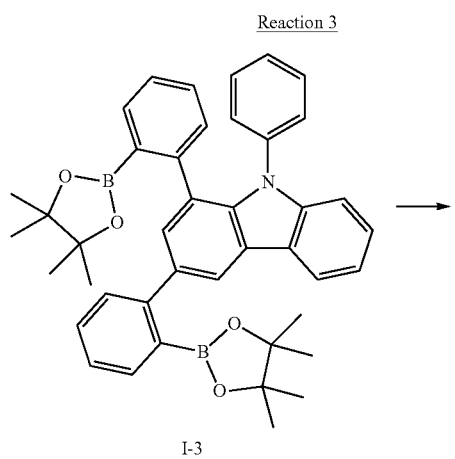

I-3

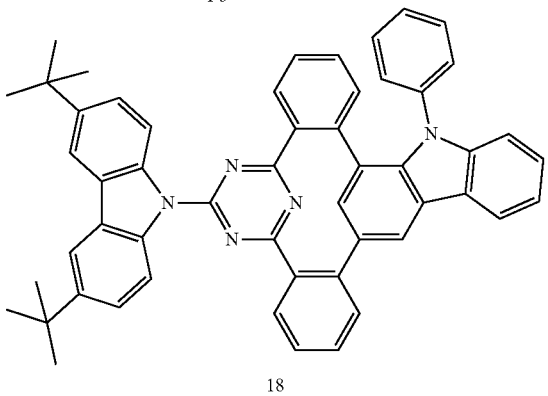

18

Synthesis of Intermediate I-5

6.47 g (10 mmol) of Intermediate I-3, 1.83 g (10 mmol) of 2,4,6-trichloro-1,3,6-triazine, 0.58 g (0.5 mmol) of Pd(PPh$_3$)$_4$ and 4.14 g (30 mmol) of $K_2CO_3$ were dissolved in 60 mL of a mixture solution of THF/$H_2O$ (2/1, volume ratio), followed by stirring at 80° C. for 36 hours. After cooling the reaction solution to room temperature, 40 mL of water was added, and extraction was performed with 50 mL of ethyl ether three times. A collected organic layer was dried with magnesium sulfate, and a residue obtained by vaporizing solvents was separated by silica gel column chromatography to obtain 2.88 g (yield 57%) of Intermediate I-5. The compound thus produced was identified through LC-MS. ($C_{33}H_{19}ClN_4$: M+1 506.1)

Synthesis of Compound 18

5.06 g (10 mmol) of Intermediate I-5, 2.79 g (10 mmol) of 3,6-di-tert-butyl-9H-carbazole, 0.10 g (0.5 mmol) of CuI and 2.76 g (20 mmol) of $K_2CO_3$ were dissolved in 60 mL of 1,2-dichlorobenzene, followed by stirring at 180° C. for 16 hours. After cooling the reaction solution to room temperature, 40 mL of water was added, and extraction was performed with 50 mL of $CH_2Cl_2$ three times. A collected organic layer was dried with magnesium sulfate, and a residue obtained by vaporizing solvents was separated by silica gel column chromatography to obtain 5.02 g (yield 67%) of Compound 18. The compound thus produced was identified through LC-MS. ($C_{53}H_{43}N_5$: M+1 749.3)

(4) Synthesis of Compound 43

Fused Polycyclic Compound 43 according to an embodiment may be synthesized, for example, by Reaction 4 below.

Reaction 4

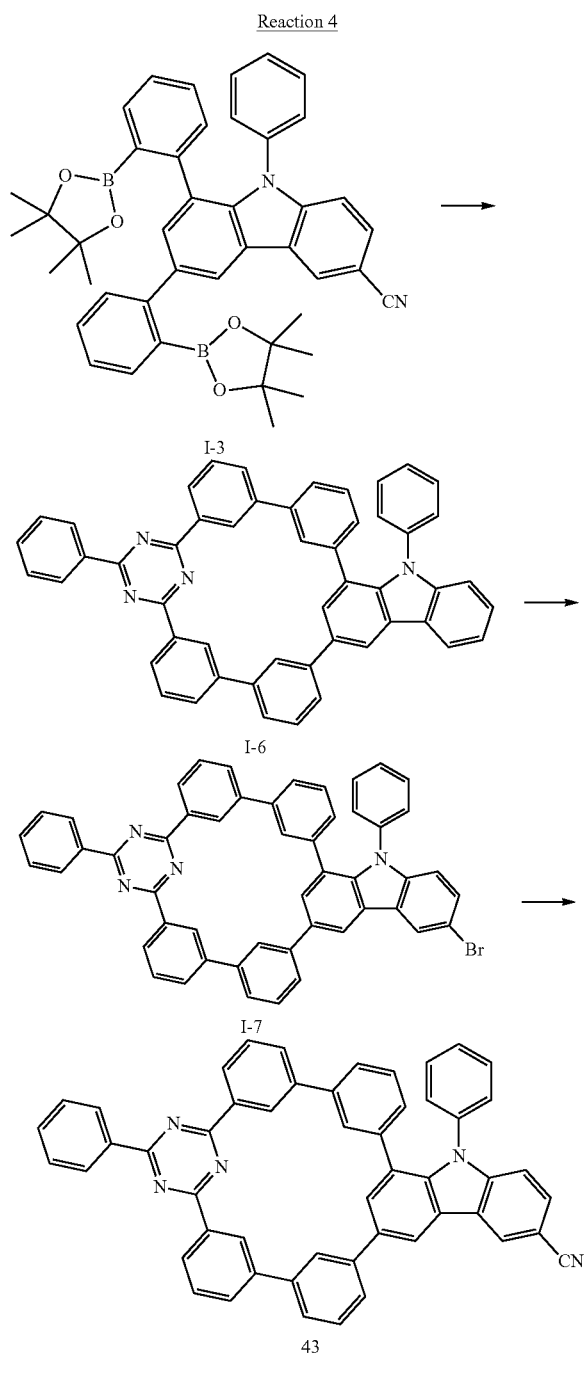

Synthesis of Intermediate I-6

6.47 g (10 mmol) of Intermediate I-3, 4.65 g (10 mmol) of 2,4-bis(3-bromophenyl)-6-phenyl-1,3,5-triazine, 0.58 g (0.5 mmol) of Pd(PPh$_3$)$_4$ and 4.14 g (30 mmol) of K$_2$CO$_3$ were dissolved in 60 mL of a mixture solution of THF/H$_2$O (2/1, volume ratio), followed by stirring at 80° C. for 48 hours. After cooling the reaction solution to room temperature, 40 mL of water was added, and extraction was performed with 50 mL of ethyl ether three times. A collected organic layer was dried with magnesium sulfate, and a residue obtained by vaporizing solvents was separated by silica gel column chromatography to obtain 2.94 g (yield 42%) of Intermediate I-6. The compound thus produced was identified through LC-MS. (C$_{51}$H$_{32}$N$_4$: M+1 700.3)

Synthesis of Intermediate I-7

5.91 g (yield 76%) of Intermediate I-7 was obtained using the same method as the synthetic method of Intermediate I-4 except for using Intermediate I-6 instead of Compound 1. The compound thus produced was identified through LC-MS. (C$_{51}$H$_{31}$BrN$_4$: M+1 778.2)

Synthesis of Compound 43

7.78 g (10 mmol) of Intermediate I-7 and 2.57 g (28.7 mmol) of CuCN were dissolved in 70 mL of DMF, followed by stirring at 150° C. for 24 hours. After cooling the reaction solution to room temperature, 60 mL of ammonia water and 60 mL of water were added, and extraction was performed with 50 mL of CH$_2$Cl$_2$ three times. A collected organic layer was dried with magnesium sulfate, solvents were vaporized, and the resultant residue was separated by silica gel column chromatography to obtain 4.71 g (yield 92%) of Compound 43. The compound thus produced was identified through LC-MS. (C$_{52}$H$_{31}$N$_5$: M+1 725.2)

(5) Synthesis of Compound 56

Fused Polycyclic Compound 56 according to an embodiment may be synthesized, for example, by Reaction 5 below.

Reaction 5

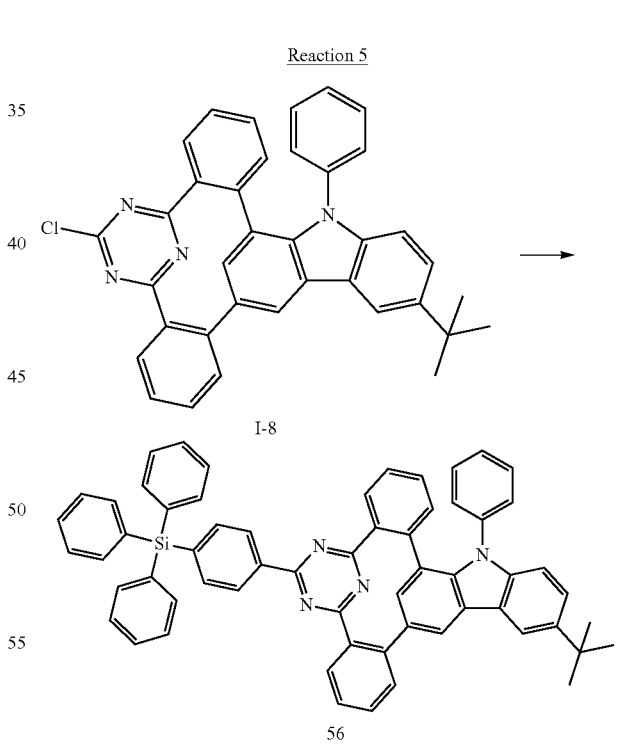

Synthesis of Intermediate I-8

3.93 g (yield 70%) of Intermediate I-8 was obtained using the same method as the synthetic method of Intermediate I-5 except for using 1,3-dibromo-6-(tert-butyl)-9-phenyl-9H-carbazole instead of 1,3-dibromo-9-phenyl-9H-carbazole.

The compound thus produced was identified through LC-MS. ($C_{37}H_{27}ClN_4$: M+1 562.2)

Synthesis of Compound 56

5.62 g (10 mmol) of Intermediate I-8, 4.62 g (10 mmol) of triphenyl(4-(4,4,5,5-tetramethyl-1,3,2-dioxaborolan-2-yl)phenyl)silane, 0.58 g (0.5 mmol) of $Pd(PPh_3)_4$ and 4.14 g (30 mmol) of $K_2CO_3$ were dissolved in 60 mL of a mixture solution of $THF/H_2O$ (2/1, volume ratio), followed by stirring at 80° C. for 16 hours. After cooling the reaction solution to room temperature, 40 mL of water was added, and extraction was performed with 50 mL of ethyl ether three times. A collected organic layer was dried with magnesium sulfate, and a residue obtained by vaporizing solvents was separated by silica gel column chromatography to obtain 5.43 g (yield 63%) of Compound 56. The compound thus produced was identified through LC-MS. ($C_{61}H_{46}N_4Si$: M+1 862.4)

(6) Synthesis of Compound 59

Fused Polycyclic Compound 59 according to an embodiment was obtained, for example, as follows. 4.32 g (yield 56%) of Compound 59 was obtained using the same method as the synthetic method of Compound 56 except for using 6,8-dibromo-9-phenyl-9H-carbazole-3-carbonitrile instead of 1,3-dibromo-6-(tert-butyl)-9-phenyl-9H-carbazole. The compound thus produced was identified through LC-MS. ($C_{58}H_{37}N_5Si$: M+1 831.3)

(7) Synthesis of Compound 83

Fused Polycyclic Compound 83 according to an embodiment was obtained, for example, as follows. 5.60 g (yield 52%) of Compound 83 was obtained using the same method as the synthetic method of Compound 56 except for using 6,8-dibromo-3',6'-dimethyl-9-phenyl-9H-3,9'-bicarbazole instead of 1,3-dibromo-6-(tert-butyl)-9-phenyl-9H-carbazole. The compound thus produced was identified through LC-MS. ($C_{71}H_{49}N_5Si$: M+1 999.5)

2. Manufacture and Evaluation of Organic Electroluminescence Device Including Fused Polycyclic Compound Manufacture of Organic Electroluminescence Devices An organic electroluminescence device of an embodiment, including the fused polycyclic compound of an embodiment in an emission layer was manufactured by a method described below. Organic electroluminescence devices of Example 1 to Example 7 were manufactured using the fused polycyclic compounds of Compounds 1, 13, 18, 42, 56, 59, and 83 as dopant materials for an emission layer. The organic electroluminescence device of Comparative Example 1 to Comparative Example 3 were manufactured using Comparative Compounds of C1 to C3 as a dopant material of an emission layer.

The compounds used in Example 1 to Example 7 and Comparative Example 1 to Comparative Example 3 are shown in Table 1.

TABLE 1

Compound 1

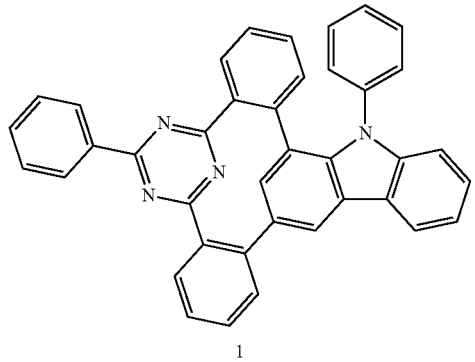 [SMILES: c1ccc(-c2nc3nc(n2)c2ccccc2c2cc(cc4c5ccccc5n(-c5ccccc5)c24)c2ccccc32)cc1]

Compound 13

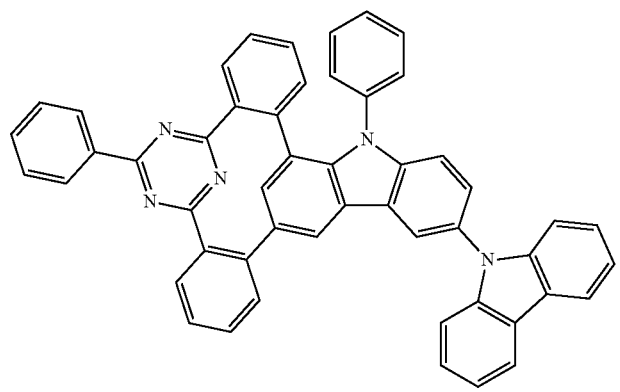

TABLE 1-continued
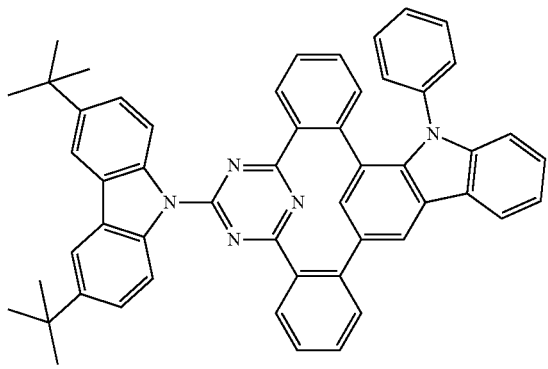
18
Compound 18
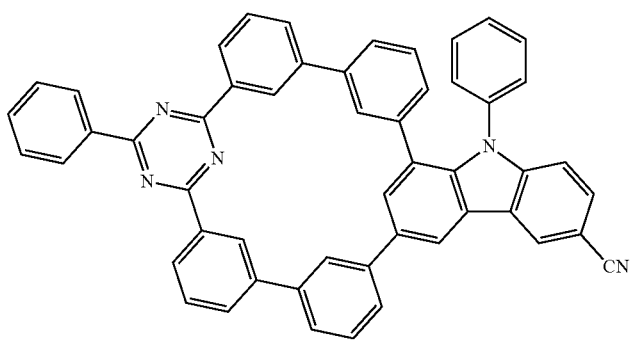
43
Compound 43
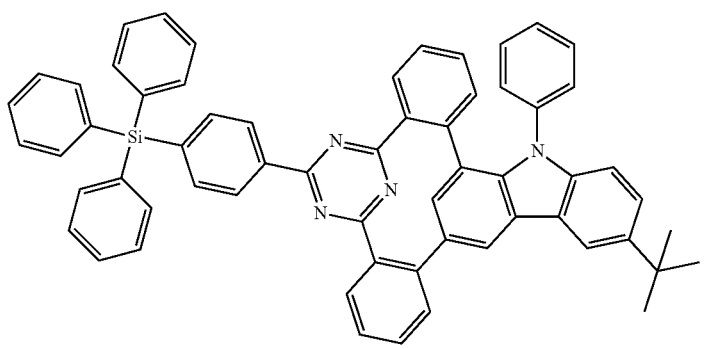
56
Compound 58
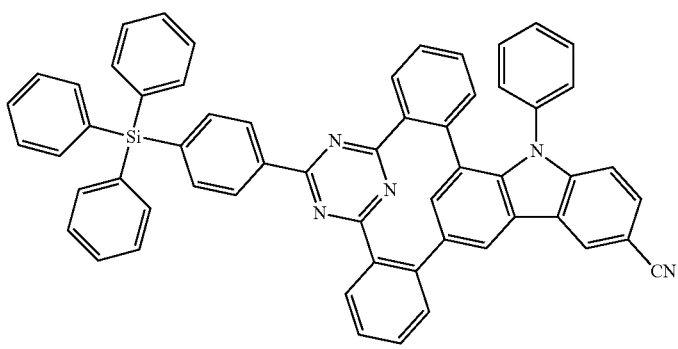
59
Compound 59

TABLE 1-continued
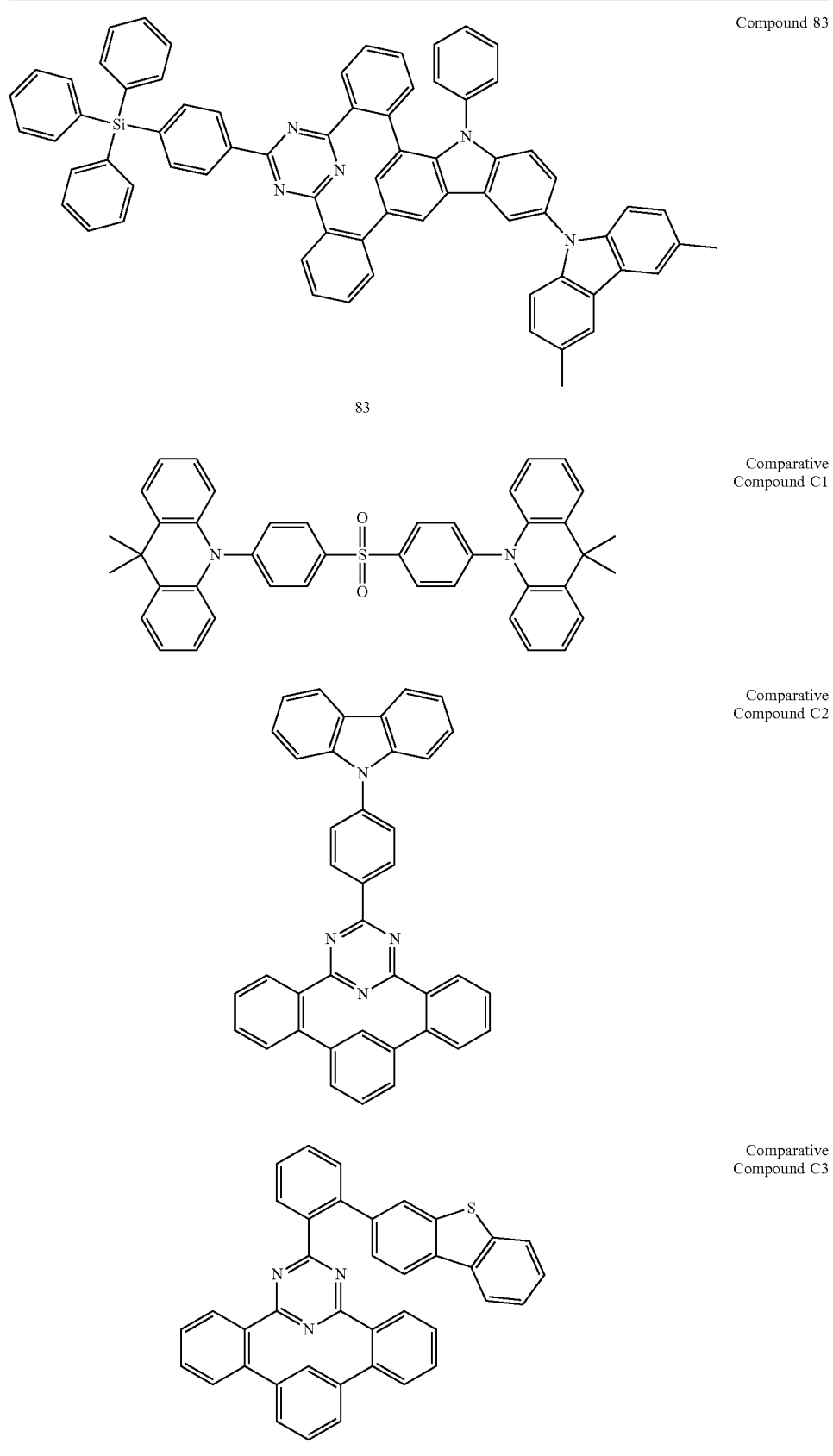
Compound 83
83
Comparative Compound C1
Comparative Compound C2
Comparative Compound C3

On a glass substrate, ITO with a thickness of 1200 Å was patterned and washed with isopropyl alcohol and ultra-pure water, washed with ultrasonic waves, exposed to UV for 30 minutes and treated with ozone. Then, α-NPD was deposited to a thickness of 300 Å, TCTA was deposited to a thickness of 200 Å, and CzSi was deposited to a thickness of 100 Å to form a hole transport region. On the hole transport region, DPEPO and the fused polycyclic compound of an embodiment of the present invention, or Comparative Compound, were co-deposited in a ratio of 90:10 to form an emission layer with a thickness of 200 Å. That is, the emission layer formed by the co-deposition was formed by mixing Compounds 1, 13, 18, 42, 56, 59 and 83 with DPEPO and depositing in Example 1 to Example 7, respectively, or by mixing Comparative Compound C1, Comparative Compound C2, and Comparative Compound C3 with DPEPO and depositing in Comparative Example 1 to Comparative Example 3, respectively.

On the emission layer, a layer was formed using DPEPO to a thickness of 200 Å, then, a layer was formed using TPBi to a thickness of 300 Å, and a layer was formed using LiF to a thickness of 10 Å to form an electron transport region. Then, a second electrode was formed using aluminum (Al) to a thickness of 3000 Å.

In the Examples, the hole transport region, the emission layer, the electron transport region, and the second electrode were formed using a vacuum deposition apparatus.

The compounds used for the manufacture of the organic electroluminescence devices of the Examples and Comparative Examples are shown below.

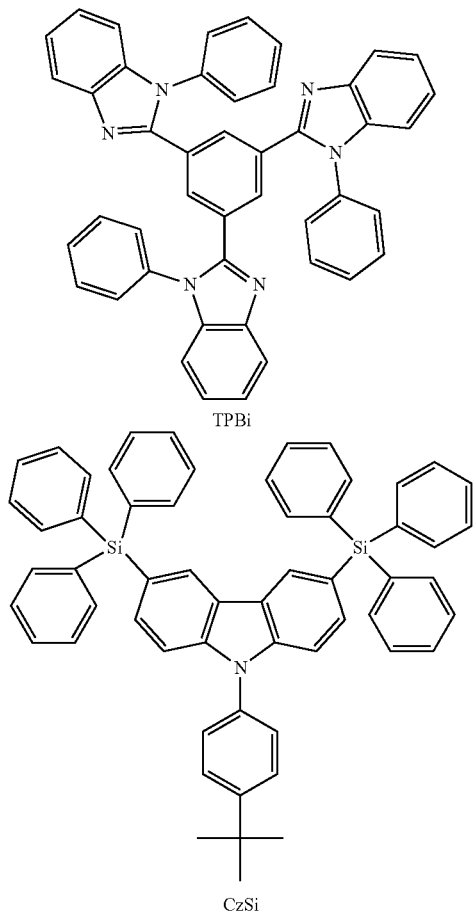

TPBi

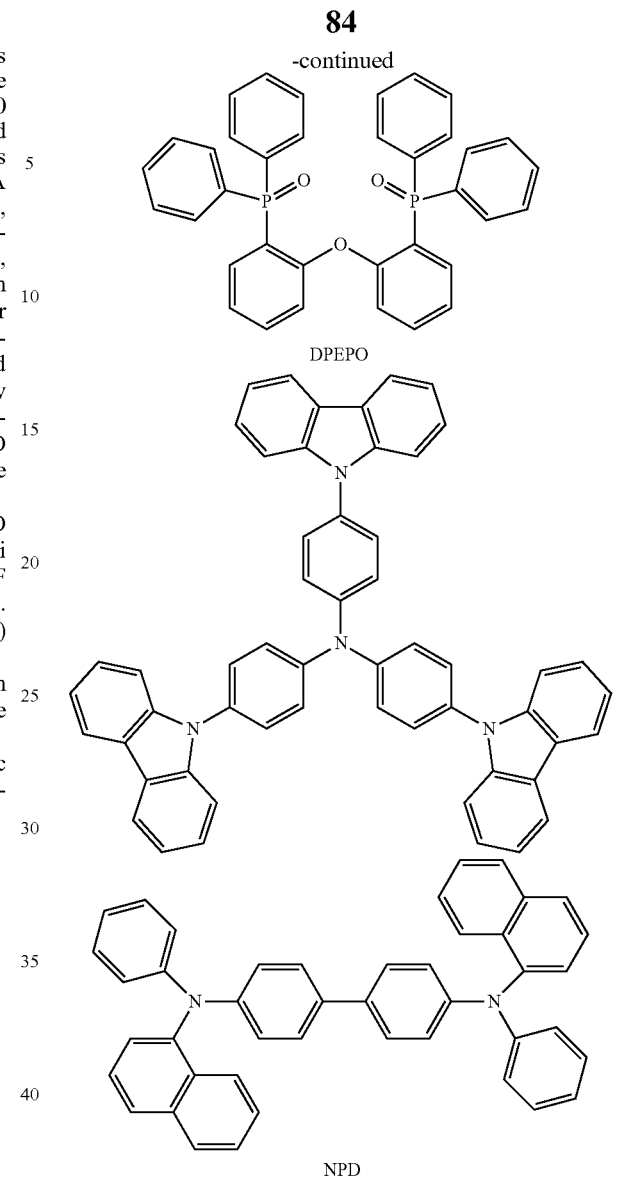

CzSi

-continued

DPEPO

NPD

Evaluation of Properties of Organic Electroluminescence Devices

In Table 2, the evaluation results of the organic electroluminescence devices of Example 1 to Example 7 and Comparative Example 1 to Comparative Example 3 are shown. In Table 2, the driving voltage, efficiency and emission color of the organic electroluminescence devices thus manufactured are compared and shown. In the evaluation results of the properties of the Examples and the Comparative Examples, shown in Table 2, the efficiency represents a current efficiency value with respect to a current density of 10 mA/cm$^2$.

TABLE 2

| Device manufacturing example | Emission layer material | Driving voltage (V) | Efficiency (cd/A) | Emission color |
|---|---|---|---|---|
| Example 1 | Compound 1 | 4.52 | 21.2 | Blue |
| Example 2 | Compound 13 | 4.78 | 23.5 | Blue |
| Example 3 | Compound 18 | 4.90 | 25.1 | Blue |
| Example 4 | Compound 43 | 4.72 | 20.6 | Blue |

TABLE 2-continued

| Device manufacturing example | Emission layer material | Driving voltage (V) | Efficiency (cd/A) | Emission color |
|---|---|---|---|---|
| Example 5 | Compound 56 | 4.55 | 19.7 | Blue |
| Example 6 | Compound 59 | 4.63 | 21.5 | Blue |
| Example 7 | Compound 83 | 4.92 | 20.2 | Blue |
| Comparative Example 1 | Comparative Compound C1 | 6.7 | 19.3 | Blue |
| Comparative Example 2 | Comparative Compound C2 | 5.3 | 17.5 | Blue |
| Comparative Example 3 | Comparative Compound C3 | 6.2 | 16.7 | Blue |

Referring to the results of Table 2, it could be found that the Examples of the organic electroluminescence devices using the fused polycyclic compounds according to embodiments of the present invention as materials for an emission layer were found to show lower driving voltages and higher device efficiency when compared with the Comparative Examples using the Comparative Compounds in an emission layer. That is, the fused polycyclic compounds of the present invention used in the Examples include an electron donor and an electron acceptor in one compound unit and may emit delayed fluorescence and show high device efficiency when compared with the Comparative Compounds. In addition, the fused polycyclic compounds used in the Examples have high glass transition temperature characteristics and high amorphous properties and may have excellent electrical properties and reliability, thereby showing excellent device efficiency with a low driving voltage, when compared with the Comparative Examples. In addition, the emission layer of an organic electroluminescence device using the fused polycyclic compound of an embodiment of the present invention as a material for an emission layer may emit blue light.

Although preferred embodiments of the present invention have been described, it could be understood that a skilled person in corresponding technical field or a person having an ordinary knowledge in corresponding technical field could diversely change and modify the present invention within the scope and technical area of the present invention as hereinafter claimed.

Accordingly, the technical scope of the present invention should not be limited to the description in the detailed description of the specification but determined by the claims.

INDUSTRIAL APPLICABILITY

The present invention relates to a compound for improving the emission efficiency and device life of an organic electroluminescence device and an organic electroluminescence device including the same in an organic layer, and has high industrial applicability.

The invention claimed is:

1. An organic electroluminescence device comprising:
a first electrode;
a second electrode on the first electrode; and
a plurality of organic layers between the first electrode and the second electrode,
wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more selected from them, a mixture of two or more selected from them, and an oxide thereof, and
wherein at least one organic layer among the plurality of organic layers comprises a fused polycyclic compound in which,
a dibenzoheterocyclic derivative and
a monoheterocyclic derivative comprising at least one nitrogen atom as a ring-forming atom
are connected via a linking group, wherein the dibenzoheterocyclic derivative, the monoheterocyclic derivative, and the linking group together form a ring.

2. The organic electroluminescence device according to claim 1, wherein
the dibenzoheterocyclic derivative is an electron donor, and
the monoheterocyclic derivative is an electron acceptor.

3. The organic electroluminescence device according to claim 1, wherein the fused polycyclic compound is a fused polycyclic compound in which one dibenzoheterocyclic derivative and one monoheterocyclic derivative are connected by two linking groups.

4. The organic electroluminescence device according to claim 1, wherein the fused polycyclic compound is a fused polycyclic compound that comprises one dibenzoheterocyclic derivative and two monoheterocyclic derivatives.

5. The organic electroluminescence device according to claim 1, wherein the plurality of organic layers comprise:
a hole transport region;
an emission layer on the hole transport region; and
an electron transport region on the emission layer.

6. The organic electroluminescence device according to claim 5, wherein the emission layer is to emit delayed fluorescence.

7. The organic electroluminescence device according to claim 5, wherein
the emission layer is a delayed fluorescence emission layer comprising a host and a dopant, and
the dopant comprises the fused polycyclic compound.

8. The organic electroluminescence device according to claim 1, wherein the dibenzoheterocyclic derivative is a substituted or unsubstituted carbazole, a substituted or unsubstituted dibenzofuran, or a substituted or unsubstituted dibenzothiophene.

9. The organic electroluminescence device according to claim 1, wherein the monoheterocyclic derivative is a substituted or unsubstituted triazine, a substituted or unsubstituted pyridine, or a substituted or unsubstituted pyrimidine.

10. The organic electroluminescence device according to claim 1, wherein the linking group is a substituted or unsubstituted phenylene group, a substituted or unsubstituted divalent biphenyl group, or a substituted or unsubstituted naphthylene group.

11. The organic electroluminescence device according to claim 1, wherein the fused polycyclic compound is represented by the following Formula 1:

[Formula 1]

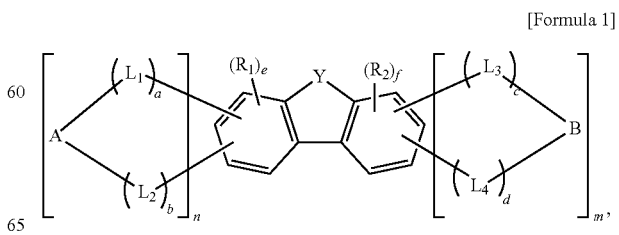

in Formula 1 above,

Y is $NR_3$, O, or S, $R_1$ to $R_3$ are each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, n and m are each independently 0 or 1, where at least one of n or m is 1, $L_1$ to $L_4$ are each independently a substituted or unsubstituted arylene group of 6 to 30 ring-forming carbon atoms, a to d are each independently an integer of 1 to 3, e and f are each independently an integer of 0 to 4, and A and B are each independently represented by the following Formula 2:

[Formula 2]

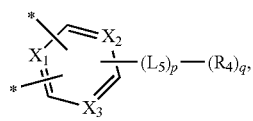

in Formula 2 above, $X_1$ to $X_3$ are each independently N or $CR_5$, where at least one among $X_1$ to $X_3$ is N, p is 0 or 1, q is an integer of 0 to 5, a case where p and q are 0 at the same time is excluded, $L_5$ is a substituted or unsubstituted arylene group of 6 to 30 ring-forming carbon atoms, or a substituted or unsubstituted heteroarylene group of 2 to 30 ring-forming carbon atoms, and $R_4$ and $R_5$ are each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms.

12. The organic electroluminescence device according to claim 11, wherein Formula 1 is represented by the following Formula 1-1 or Formula 1-2:

p1 and p2 are each independently 0 or 1, q1 and q2 are each independently an integer of 0 to 5, a case where p1 and q1 are 0 at the same time, and a case where p2 and q2 are 0 at the same time are excluded, $L_{51}$ and $L_{52}$ are each independently a substituted or unsubstituted arylene group of 6 to 30 ring-forming carbon atoms, or a substituted or unsubstituted heteroarylene group of 2 to 30 ring-forming carbon atoms, and $R_{41}$ and $R_{42}$ are each independently a hydrogen atom, a deuterium atom, a halogen atom, a cyano group, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, and in Formula 1-1 and Formula 1-2 above, Y, $R_1$, $R_2$, $R_4$, $L_1$ to $L_5$, $X_1$ to $X_3$, and a to f are the same as defined in Formula 1 and Formula 2.

13. The organic electroluminescence device according to claim 11, wherein Formula 2 is represented by at least one among the following Formula 2-1 to Formula 2-3:

[Formula 2-1]

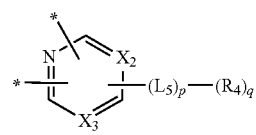

[Formula 2-2]

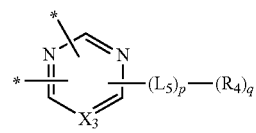

[Formula 2-3]

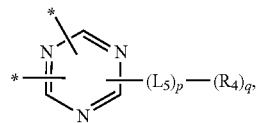

in Formula 2-1 to Formula 2-3 above, $X_2$, $X_3$, $L_5$, $R_4$, p and q are the same as defined in Formula 2.

[Formula 1-1]

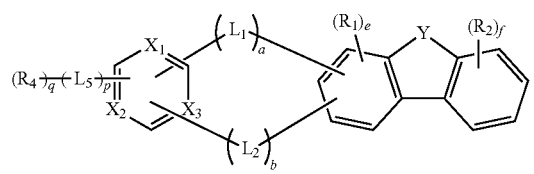

[Formula 1-2]

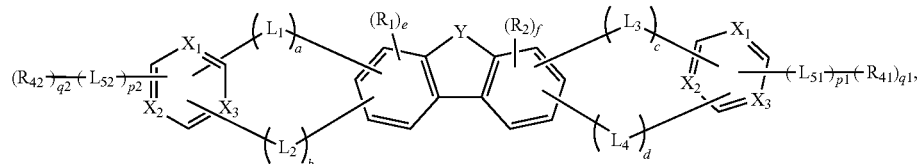

in Formula 1-2 above,

14. The organic electroluminescence device according to claim 11, wherein Formula 1 is represented by at least one among the following Formula 1-3 to Formula 1-5:

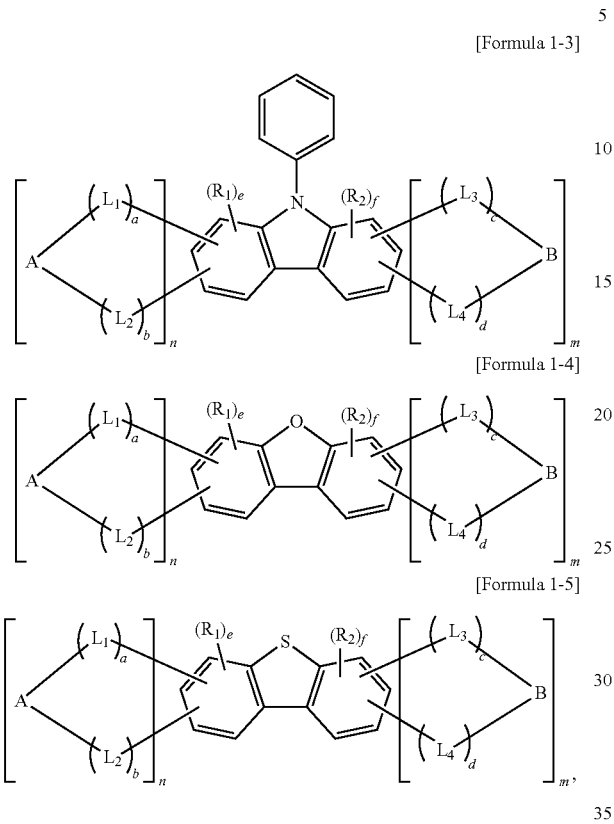

in Formula 1-3 to Formula 1-5,

A, B, $L_1$ to $L_4$, a to f, n, m, $R_1$ and $R_2$ are the same as defined in Formula 1.

15. The organic electroluminescence device according to claim 11, wherein $L_1$ to $L_4$ are each independently represented by at least one among the following formulae AL-1 to AL-3:

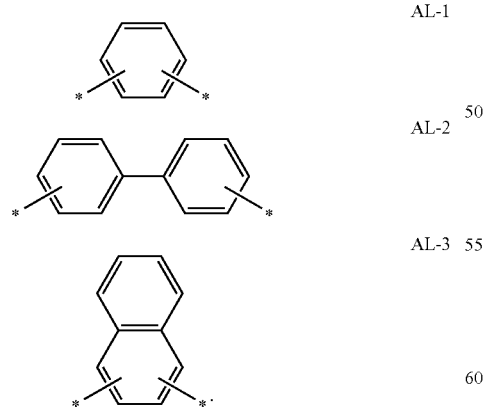

16. The organic electroluminescence device according to claim 11, wherein the fused polycyclic compound is at least one among compounds represented in the following Compound Group 1:

Compound Group 1

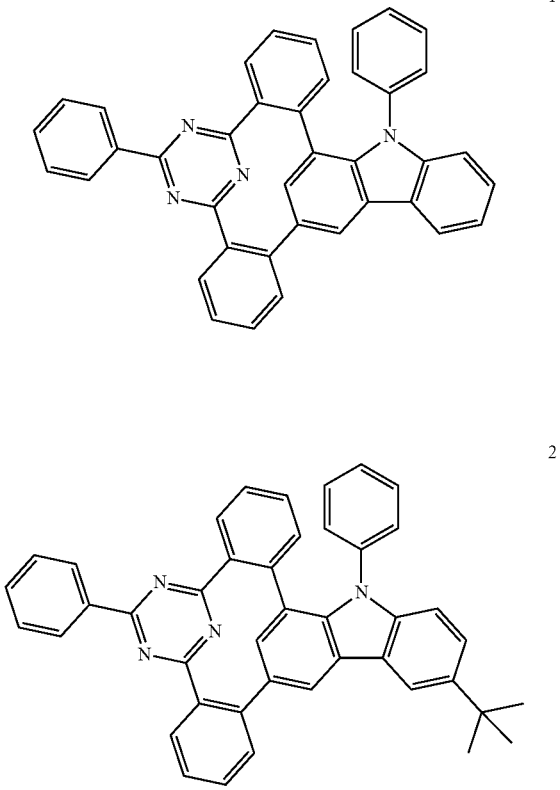

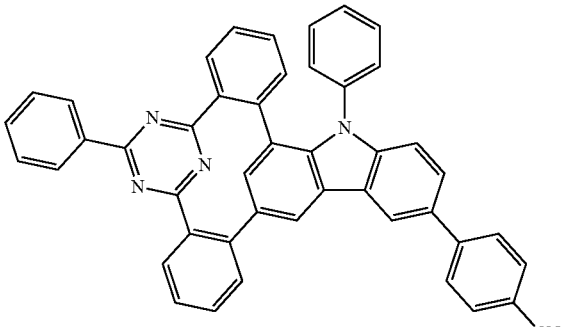

-continued
5
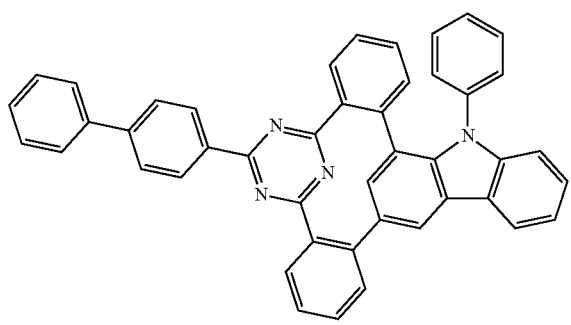
6
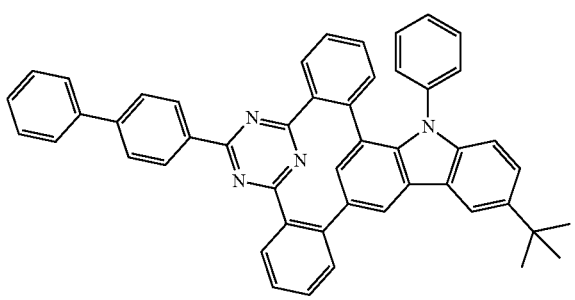
7
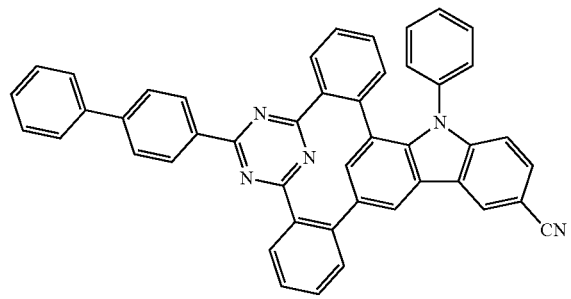
8
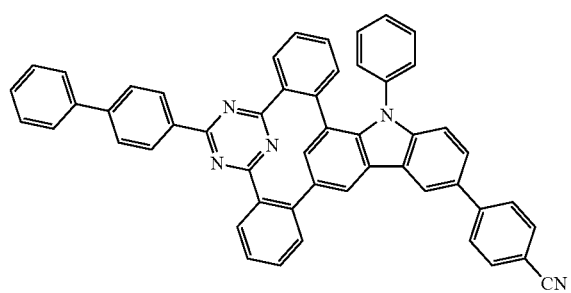
9
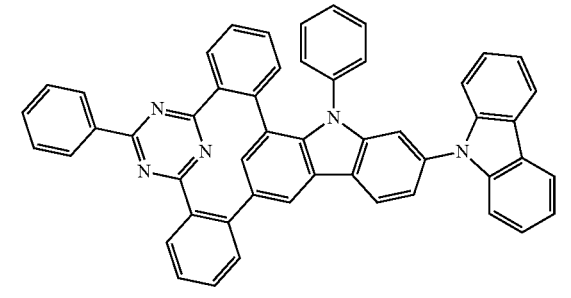
-continued
10
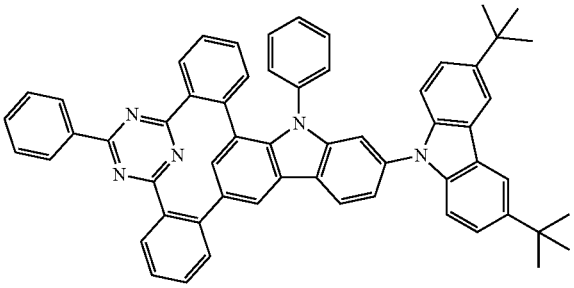
11
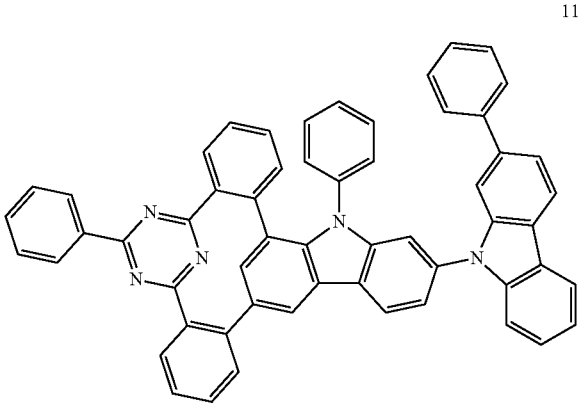
12
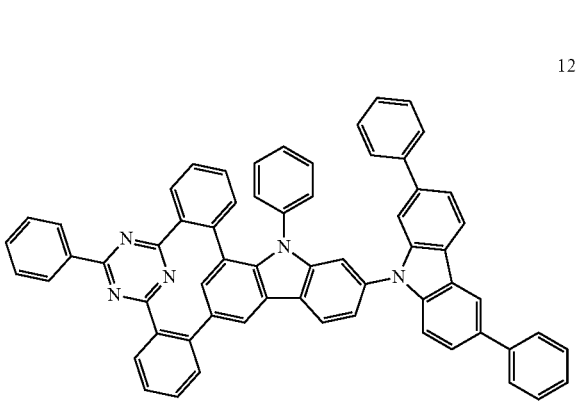
13
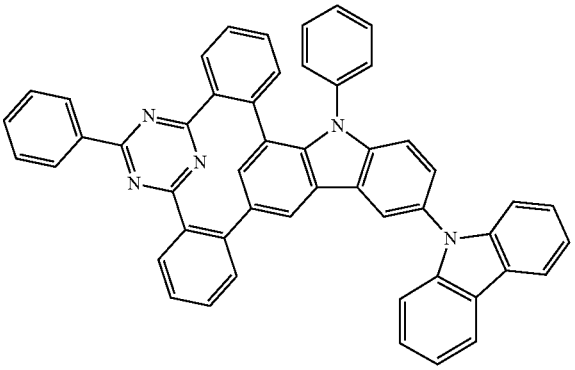

-continued
14
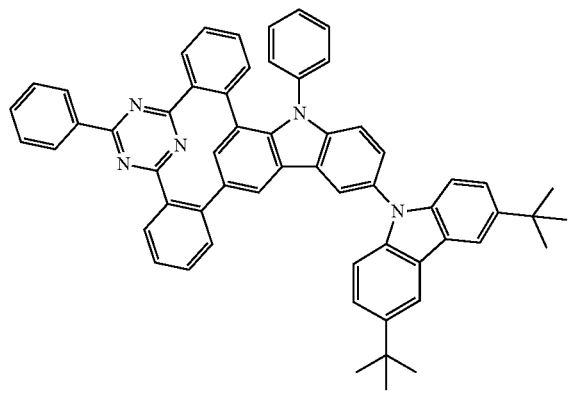
15
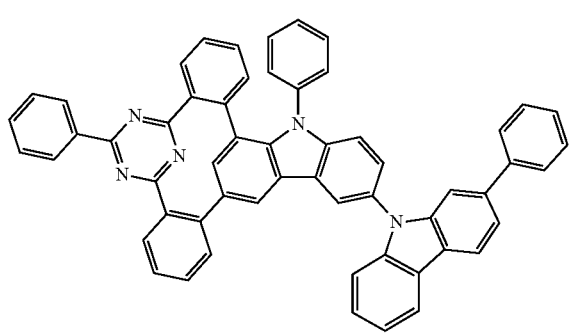
16
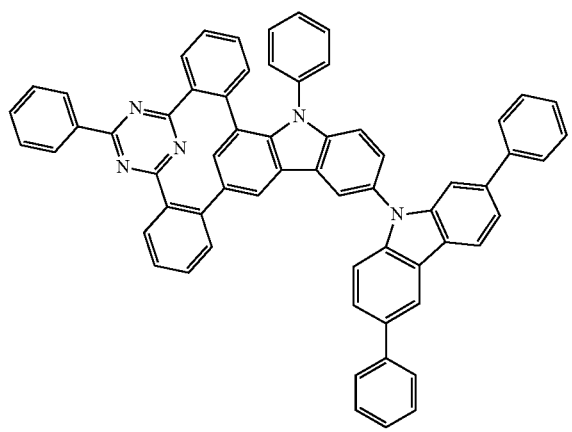
17
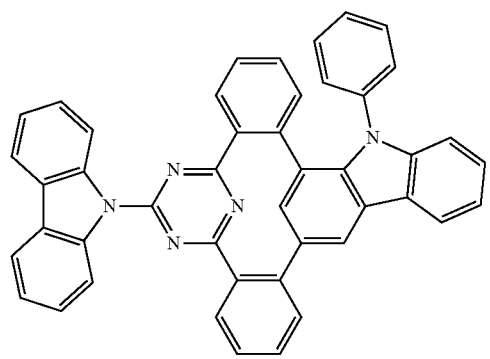
-continued
18
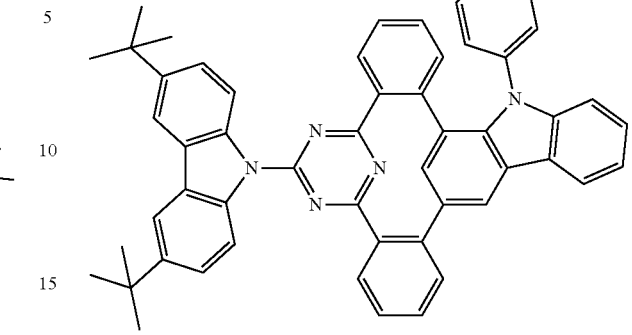
19
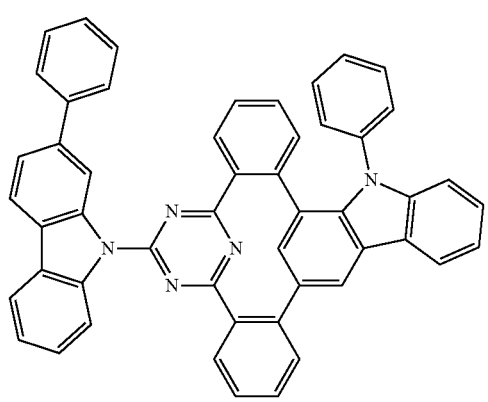
20
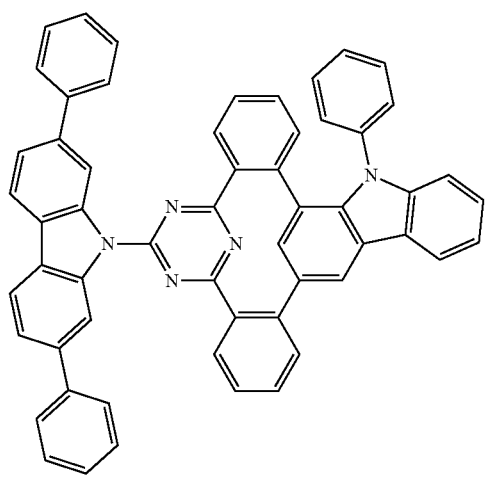
21
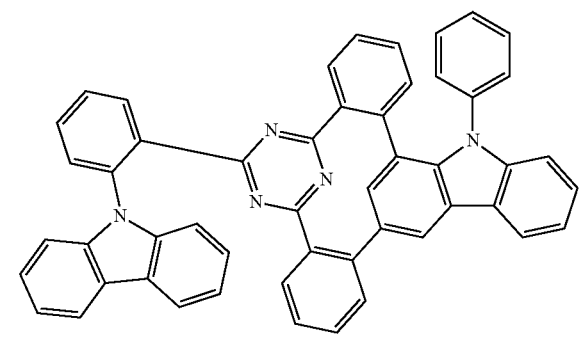

95
-continued
22
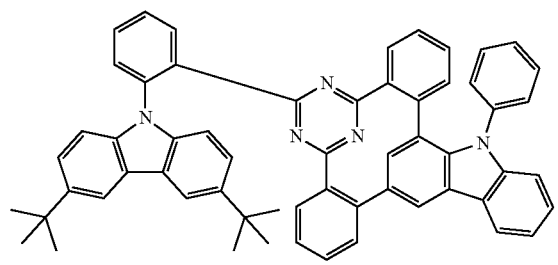
23
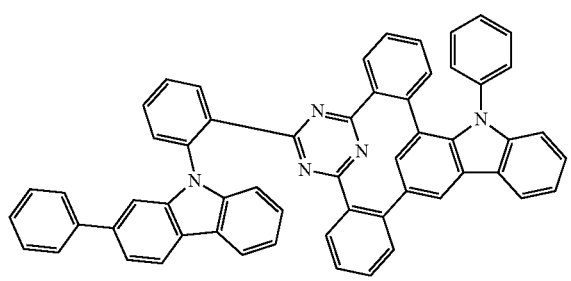
24
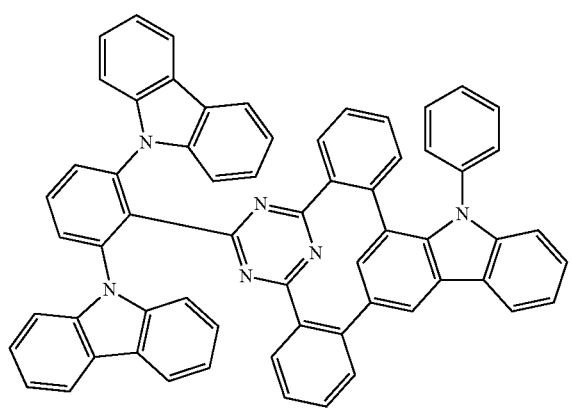
25
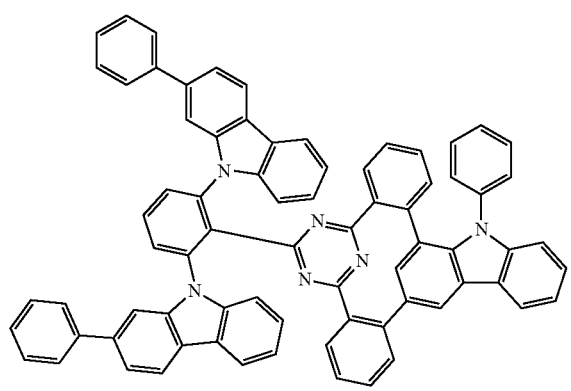
96
-continued
26
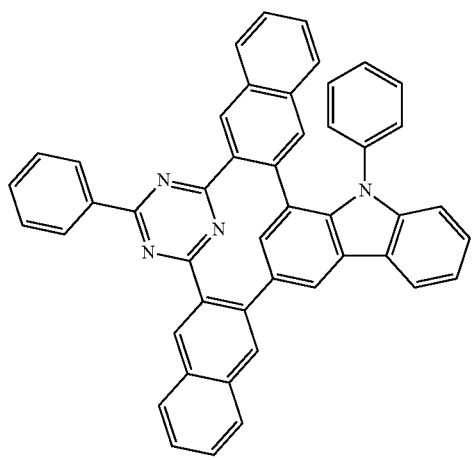
27
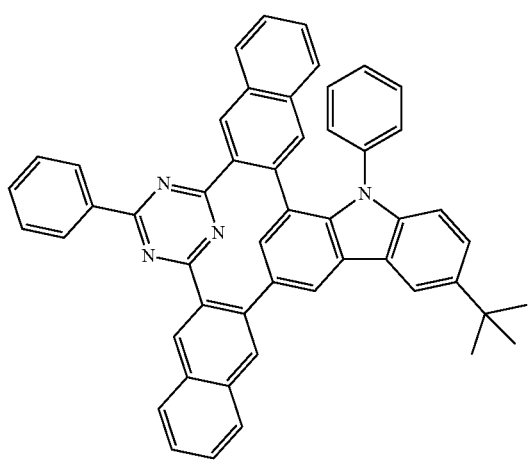
28
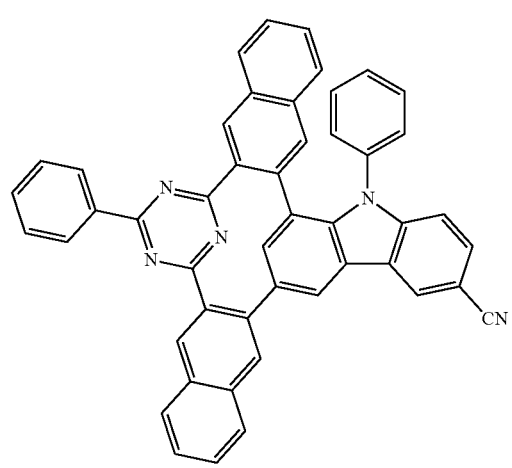

97
-continued
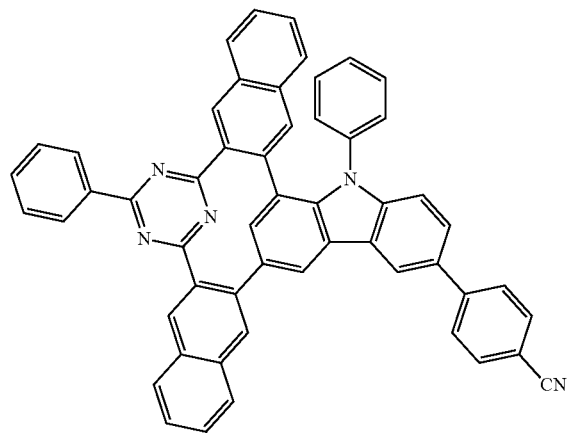
29
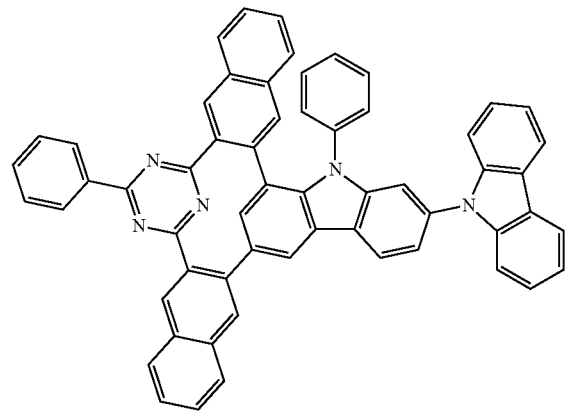
30
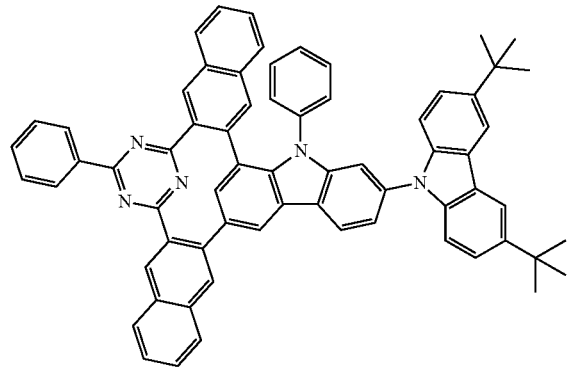
31
98
-continued
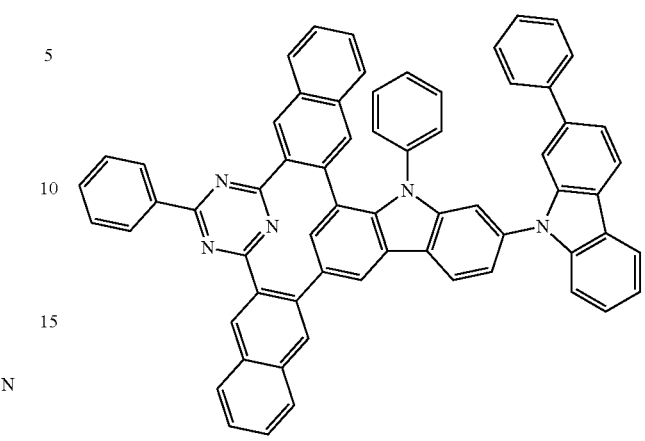
32

35
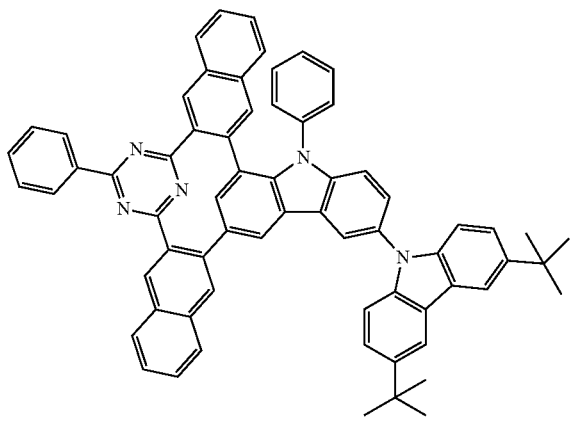
36
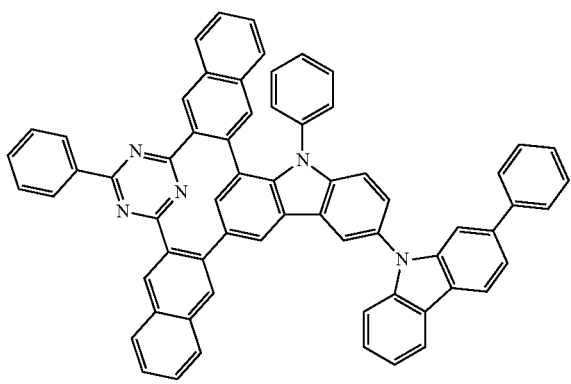
37
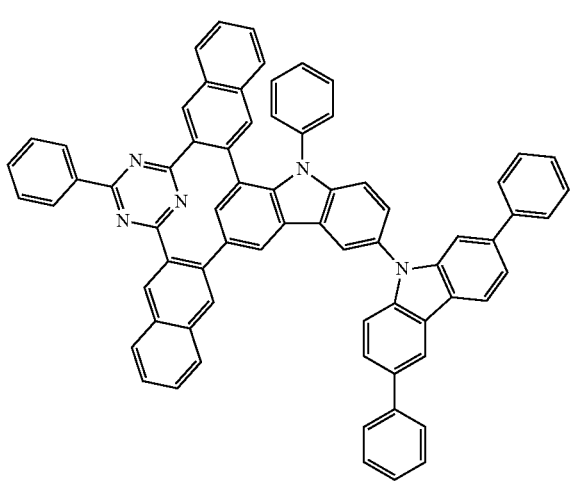
38
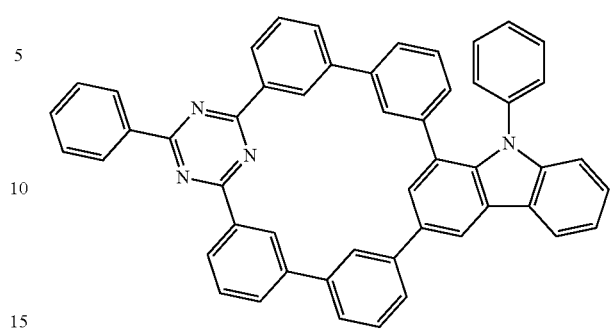
39
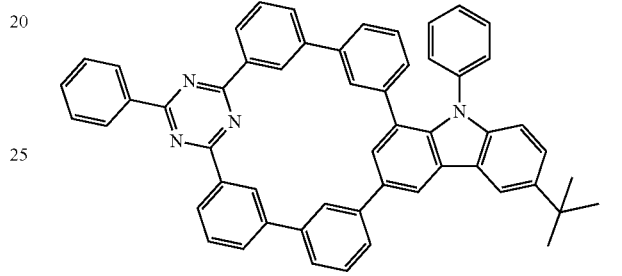
40
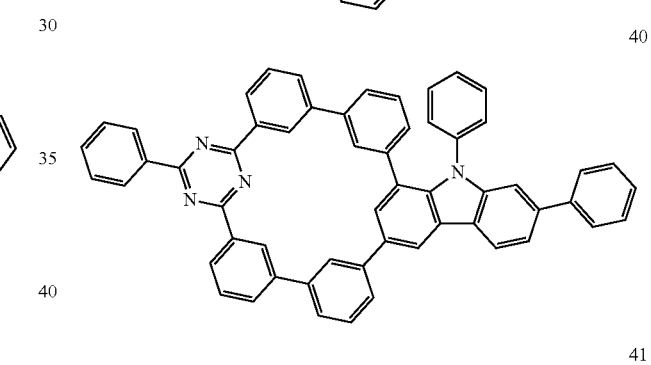
41
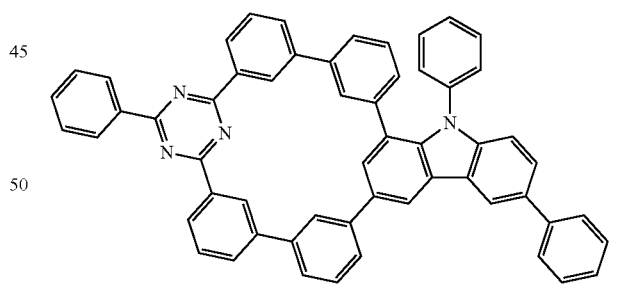
42
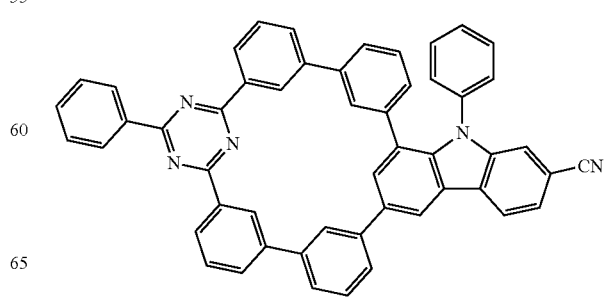

-continued
43
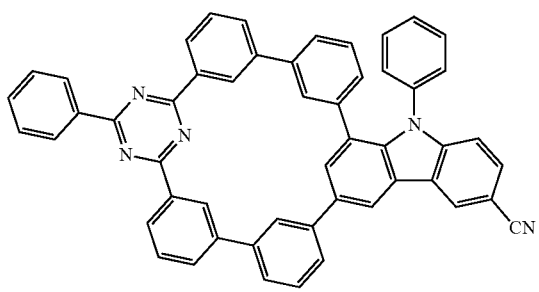
44
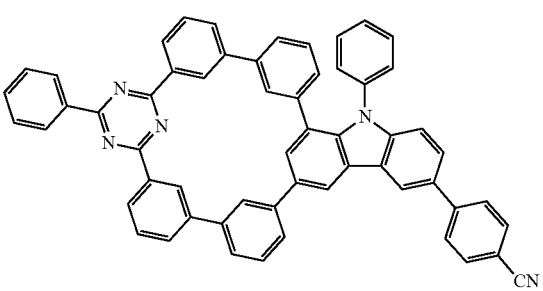
45
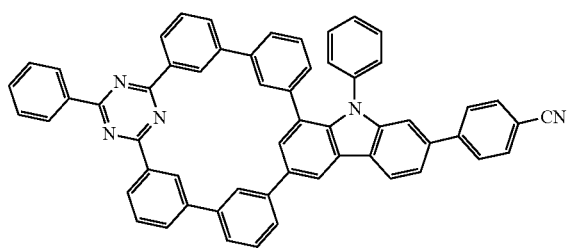
46
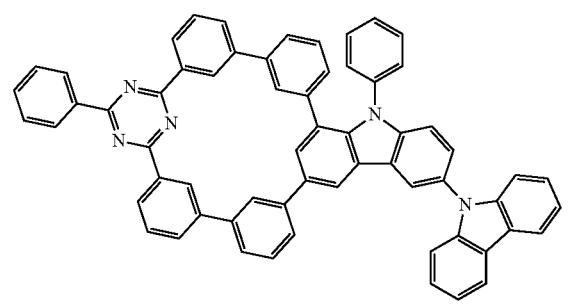
47
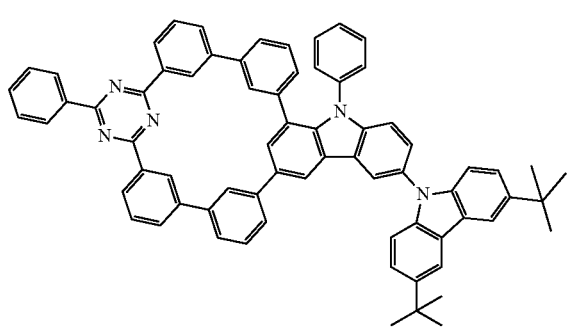
-continued
48
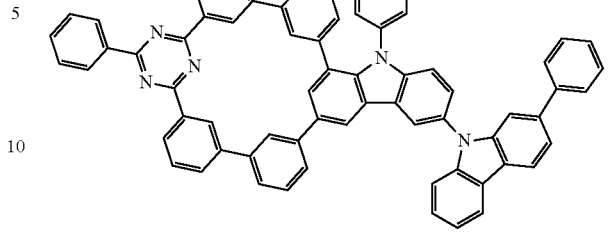
49
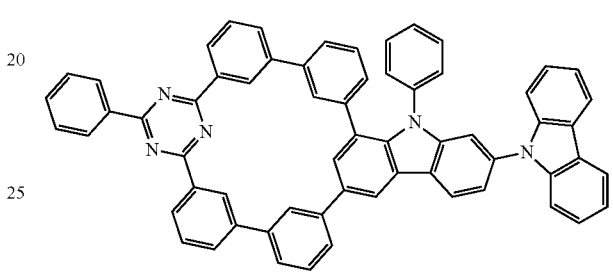
50
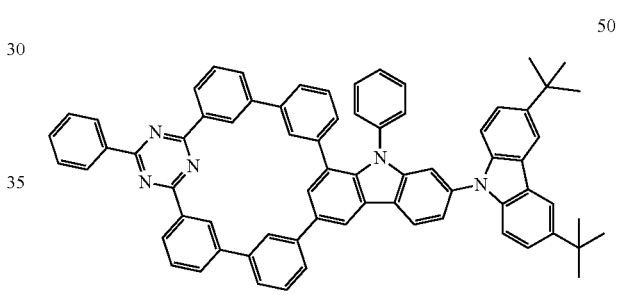
51
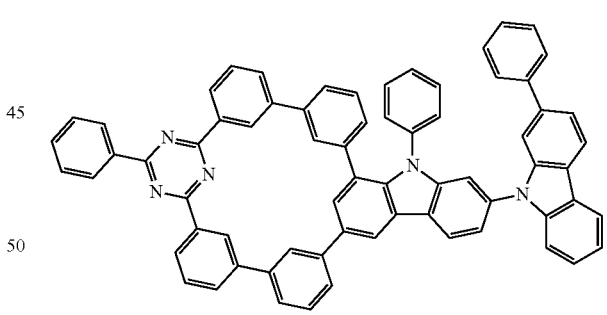
52
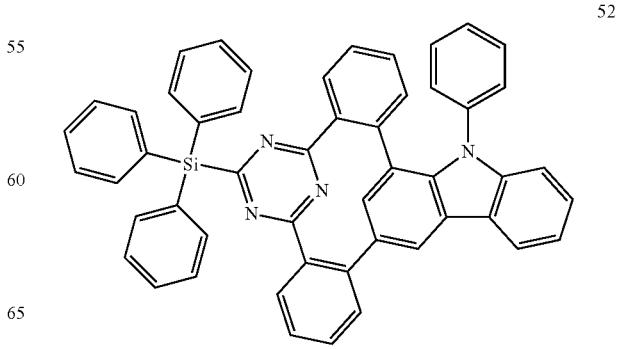

53
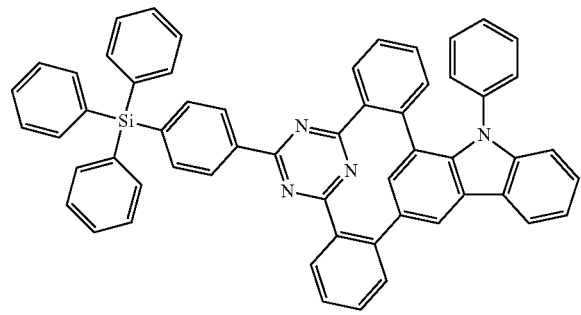
54
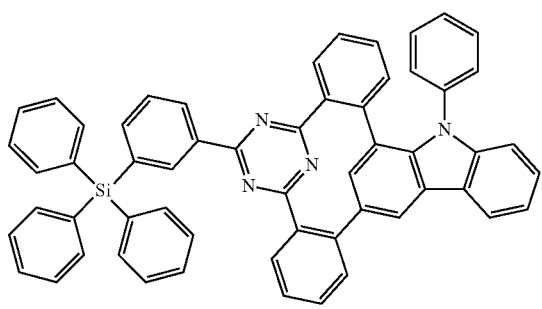
55
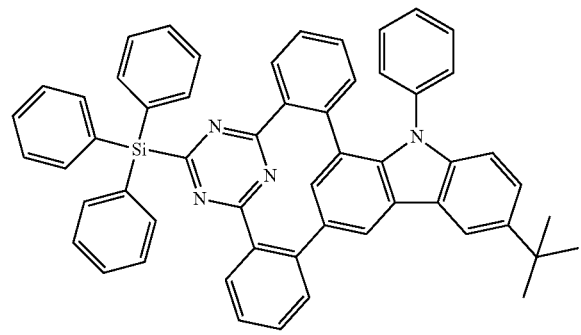
56
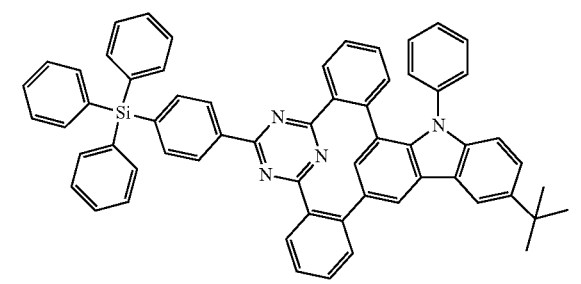
57
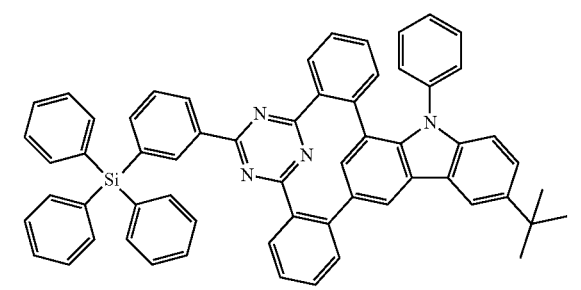
58
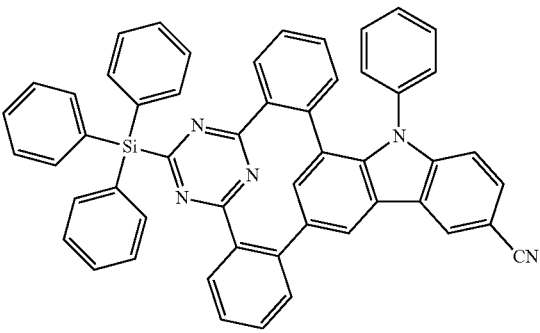
59
60
61
62
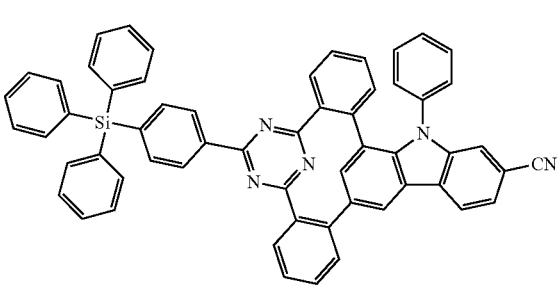

63
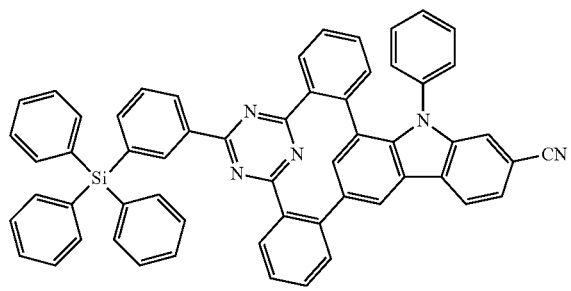
64
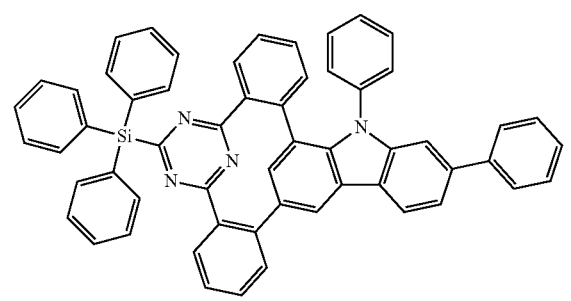
65
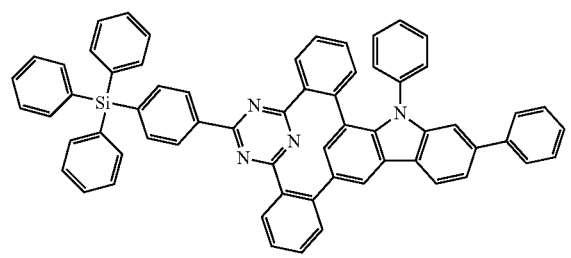
66
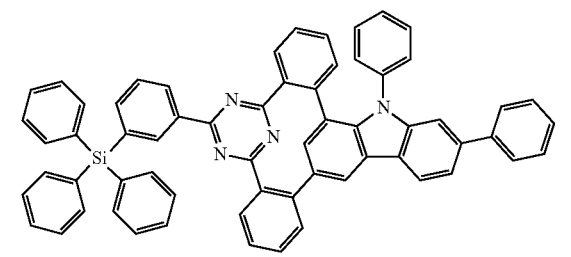
67
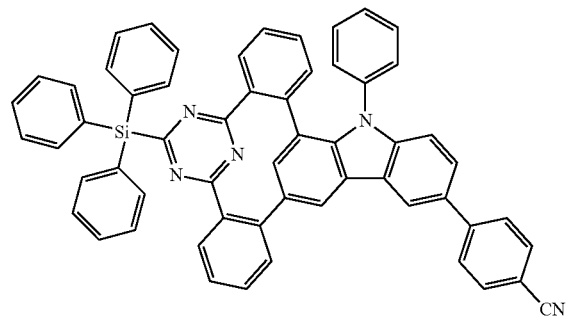
68
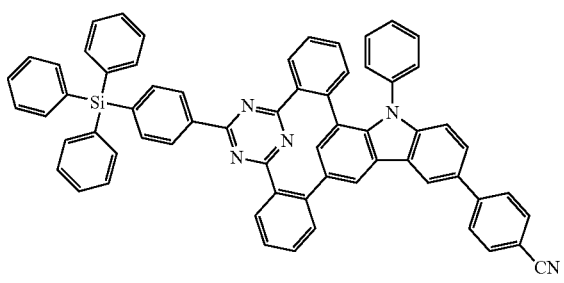
69
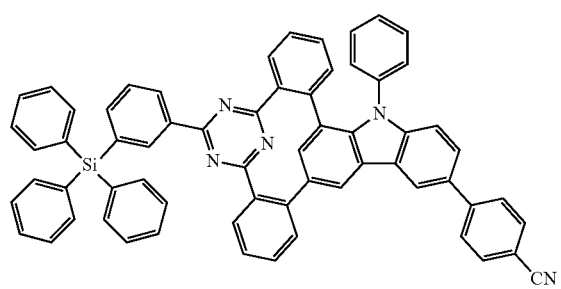
70
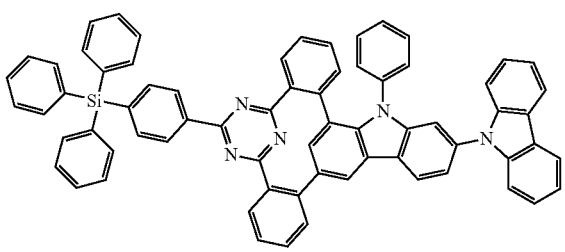
71
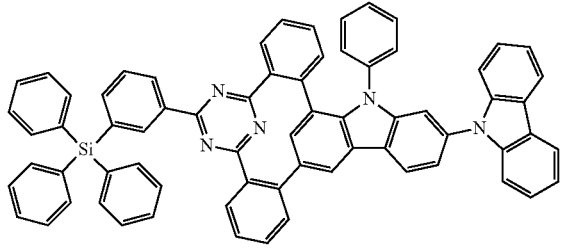
72

73
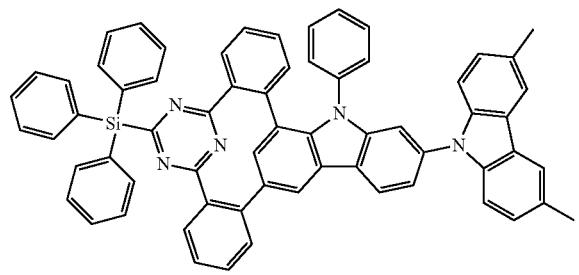
74
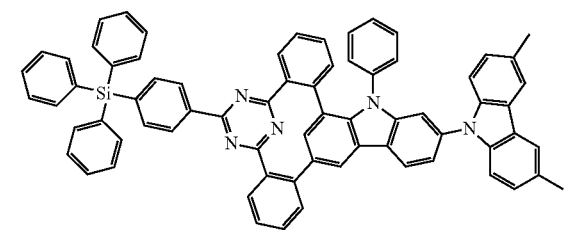
75
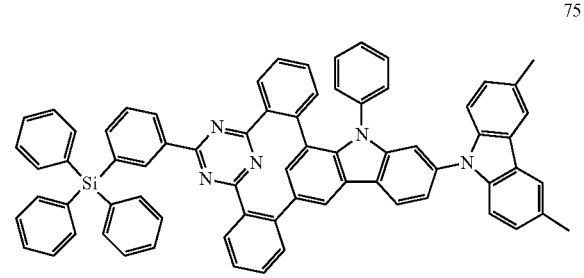
76
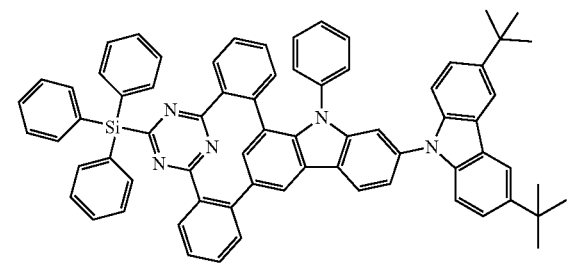
77
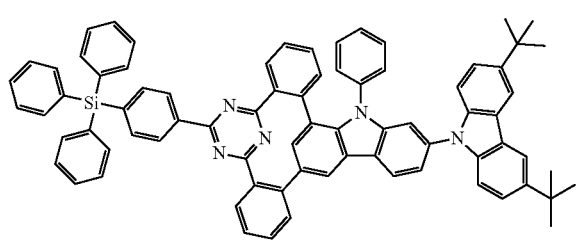
78
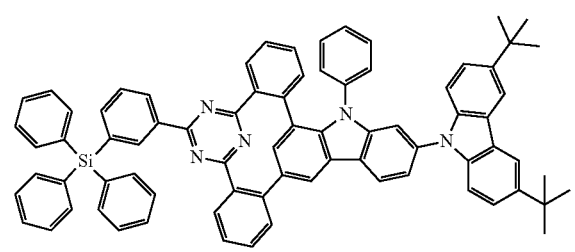
79
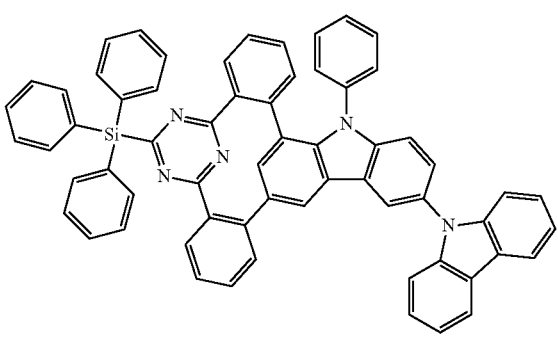
80
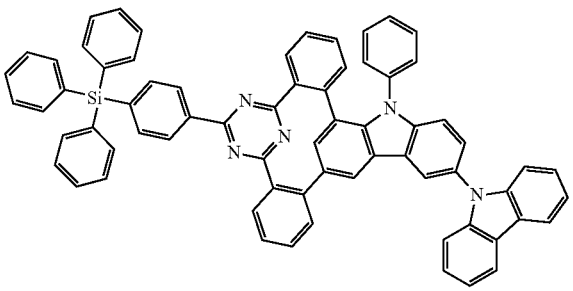
81
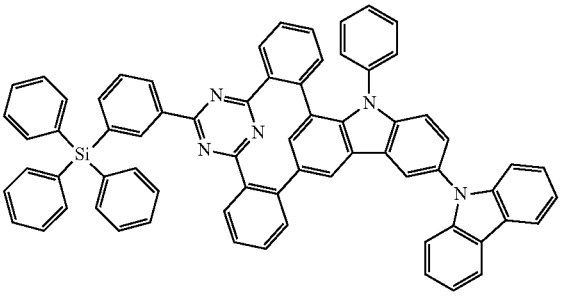
82
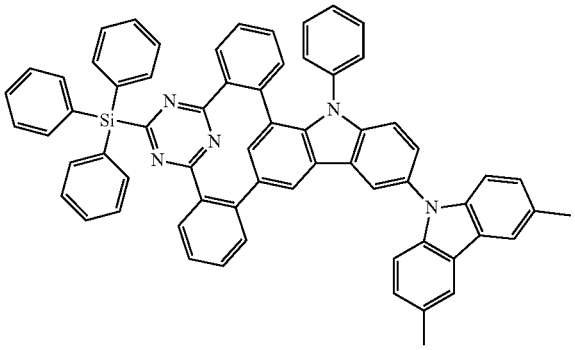

109
-continued
83
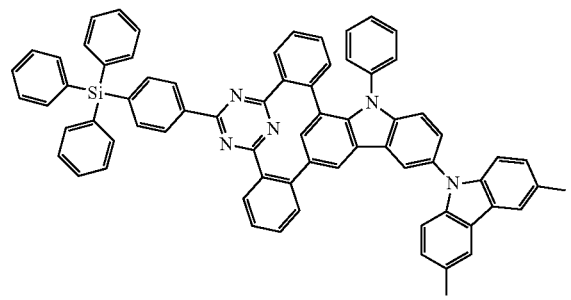
84
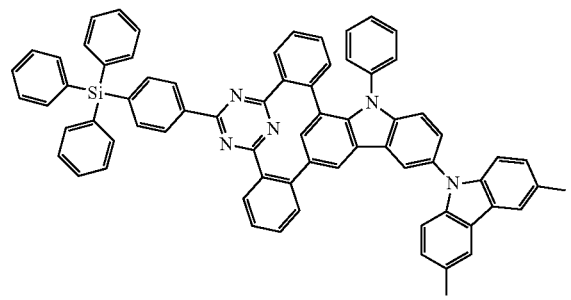
85
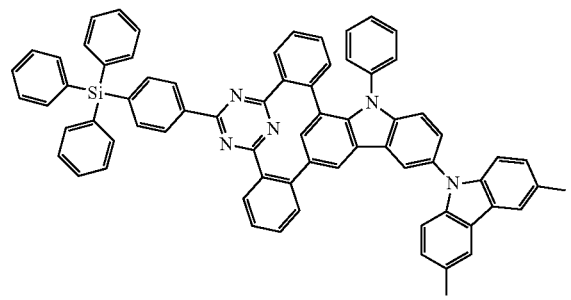
86
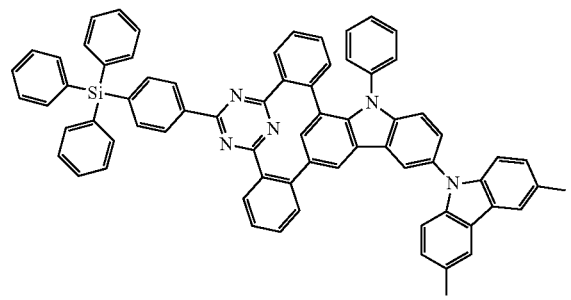
110
-continued
87
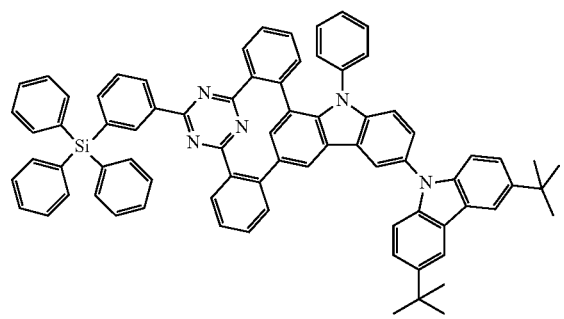
88
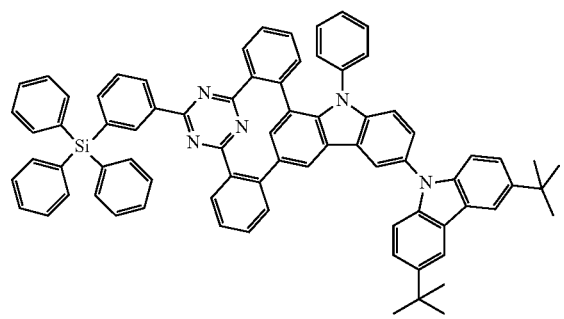
89
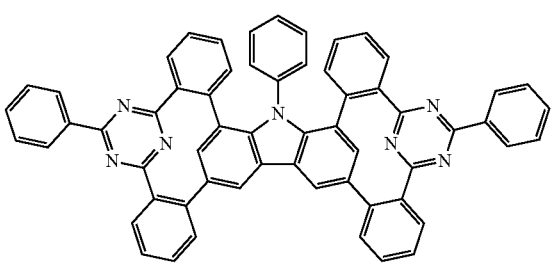
90
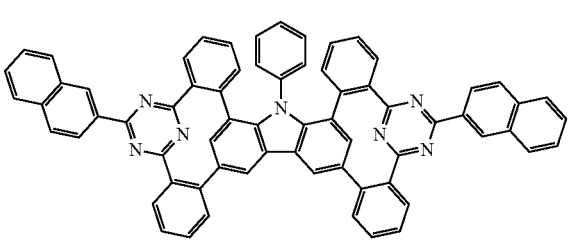
91
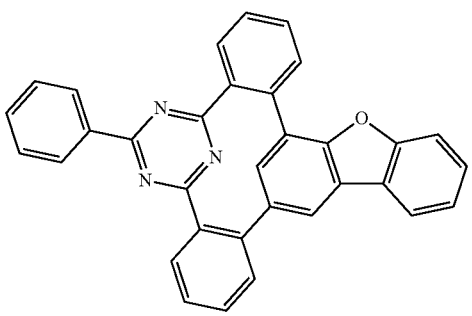

92
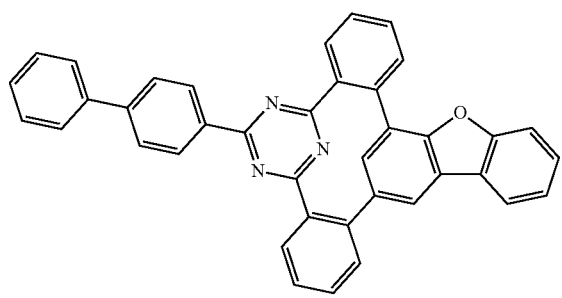
93
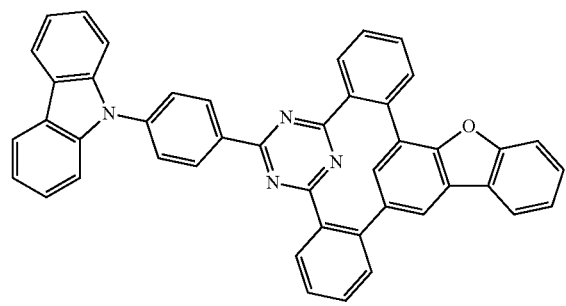
94
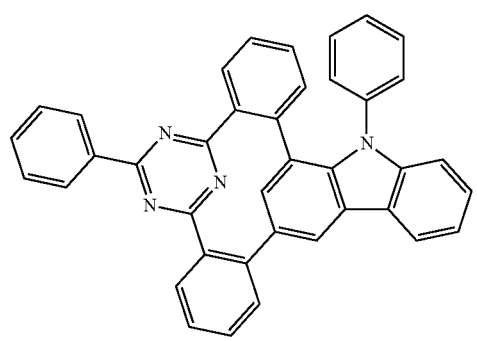
95
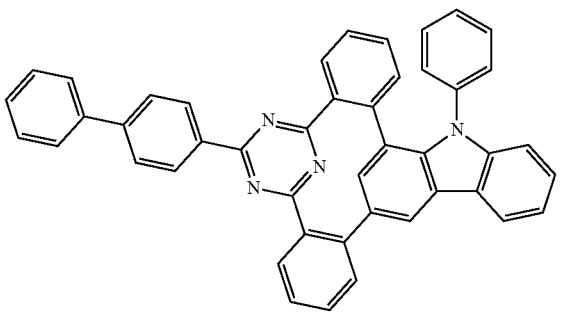
96
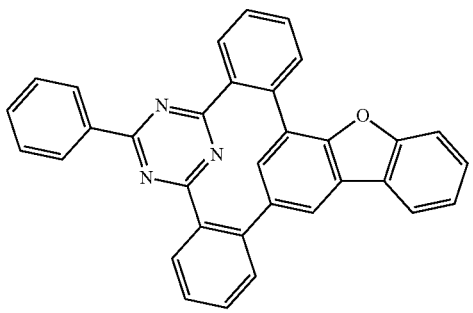
* * * * *